US011791223B2

(12) United States Patent
Sugaya et al.

(10) Patent No.: US 11,791,223 B2
(45) Date of Patent: Oct. 17, 2023

(54) SUBSTRATE BONDING APPARATUS AND SUBSTRATE BONDING METHOD

(71) Applicant: NIKON CORPORATION, Tokyo (JP)

(72) Inventors: Isao Sugaya, Tokyo (JP); Eiji Ariizumi, Tokyo (JP); Yoshiaki Kito, Tokyo (JP); Mikio Ushijima, Tokyo (JP); Masanori Aramata, Tokyo (JP); Naoto Kiribe, Tokyo (JP); Hiroshi Shirasu, Tokyo (JP); Hajime Mitsuishi, Tokyo (JP); Minoru Fukuda, Tokyo (JP); Masaki Tsunoda, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 16/019,923

(22) Filed: Jun. 27, 2018

(65) Prior Publication Data
US 2018/0308770 A1 Oct. 25, 2018

Related U.S. Application Data

(63) Continuation of application No. PCT/JP2016/087793, filed on Dec. 19, 2016.

(30) Foreign Application Priority Data

Dec. 28, 2015 (JP) ................................ 2015-256845

(51) Int. Cl.
*H01L 21/66* (2006.01)
*H01L 21/67* (2006.01)
(Continued)

(52) U.S. Cl.
CPC ........ *H01L 22/12* (2013.01); *H01L 21/67092* (2013.01); *H01L 21/67253* (2013.01);
(Continued)

(58) Field of Classification Search
CPC ................................................. H01L 2224/757
See application file for complete search history.

(56) References Cited

U.S. PATENT DOCUMENTS 5,081,421 A * 1/1992 Miller ................... B24B 37/013
324/671
6,361,646 B1 * 3/2002 Bibby, Jr. ............. B24B 37/013
156/345.1
(Continued)

FOREIGN PATENT DOCUMENTS

JP 2005-294800 A 10/2005
JP 2008-258426 A 10/2008
(Continued)

OTHER PUBLICATIONS

International Search Report issued by the Japan Patent Office in corresponding International Application No. PCT/JP2016/087793, dated Feb. 28, 2017.
(Continued)

*Primary Examiner* — Xiaoming Liu
(74) *Attorney, Agent, or Firm* — Finnegan, Henderson, Farabow, Garrett & Dunner, L.L.P.

(57) ABSTRACT

To improve the throughput of substrate bonding. A substrate bonding apparatus that bonds first and second substrates so that contact regions in which the first and second substrates contact are formed in parts of the first and second substrates and the contact regions enlarge from the parts, the apparatus including: a detecting unit detecting information about the contact regions; and a determining unit determining that the first and second substrates can be carried out based on the information detected at the detecting unit. In the substrate bonding apparatus, the information may be information, a value of which changes according to progress of enlargement of the contact regions, and the determining unit may determine that the first and second substrates can be carried
(Continued)

out if the value becomes constant or if a rate of changes in the value becomes lower than a predetermined value.

25 Claims, 38 Drawing Sheets

(51) Int. Cl.
    *H01L 21/683* (2006.01)
    *H01L 21/687* (2006.01)
    *H01L 23/00* (2006.01)

(52) U.S. Cl.
    CPC .... *H01L 21/67259* (2013.01); *H01L 21/6831* (2013.01); *H01L 21/6838* (2013.01); *H01L 21/68764* (2013.01); *H01L 24/75* (2013.01); *H01L 2224/759* (2013.01); *H01L 2224/75304* (2013.01); *H01L 2224/75725* (2013.01); *H01L 2224/75745* (2013.01)

(56) References Cited

U.S. PATENT DOCUMENTS

| | | | | |
|---|---|---|---|---|
| 9,194,700 | B2* | 11/2015 | Kast | G01B 11/272 |
| 2003/0105610 | A1* | 6/2003 | Souda | H01L 21/67282 |
| | | | | 702/150 |
| 2007/0034013 | A1* | 2/2007 | Moon | G01D 5/2412 |
| | | | | 73/780 |
| 2011/0216190 | A1* | 9/2011 | Shimazu | G01N 21/359 |
| | | | | 348/135 |
| 2012/0031557 | A1* | 2/2012 | Kinouchi | B81C 99/0025 |
| | | | | 156/324.4 |
| 2012/0190138 | A1* | 7/2012 | Tanida | H01L 21/681 |
| | | | | 257/E21.53 |
| 2013/0027070 | A1* | 1/2013 | Dietrich | G01R 31/2891 |
| | | | | 324/754.03 |
| 2013/0228015 | A1* | 9/2013 | Wimplinger | H01L 21/67253 |
| | | | | 73/632 |
| 2013/0292454 | A1* | 11/2013 | Yung | H01L 24/75 |
| | | | | 228/102 |
| 2015/0214082 | A1* | 7/2015 | Huang | H01L 21/187 |
| | | | | 438/14 |
| 2017/0103963 | A1* | 4/2017 | Sakuma | H01L 24/75 |

FOREIGN PATENT DOCUMENTS

| | | |
|---|---|---|
| JP | 2008-300394 A | 12/2008 |
| JP | 2011-228507 A | 11/2011 |
| JP | 2012-191037 A | 10/2012 |
| JP | 2013-258377 | 12/2013 |
| JP | 2014-146807 A | 8/2014 |
| TW | 200913120 A | 3/2009 |

OTHER PUBLICATIONS

Office Action issued by the Taiwan Intellectual Property Office dated May 4, 2020 in counterpart Taiwanese Patent Application No. 105143175, and English Translation thereof.
Office Action dated Jul. 31, 2020 in counterpart Japanese Patent Application No. 2017-558937, and English translation thereof.
Office Action issued by the Taiwan Intellectual Property Office dated Aug. 10, 2020 in counterpart Taiwanese Patent Application No. 105143175, and English machine translation thereof.
Japanese Office Action, dated Mar. 29, 2022, issued by Japanese Patent Office in Japanese Application No. 2021-072741, and English language translation thereof.
Japanese Office Action, dated Jun. 21, 2022, issued by Japanese Patent Office in Japanese Application No. 2021-072741, and English language translation thereof.
Office Action issued by the Taiwan Intellectual Property Office dated Jan. 11, 2023 in counterpart Taiwanese Patent Application No. 110144507, and English Translation thereof.
Office Action issued by the Japanese Patent Office dated Aug. 1, 2023 in counterpart Japanese Patent Application No. 2022-147634, and English Translation thereof.

* cited by examiner

SUBSTRATE BONDING APPARATUS AND SUBSTRATE BONDING METHOD

The contents of the following International patent application are incorporated herein by reference:
PCT/JP2016/087793 filed on Dec. 19, 2016.

BACKGROUND

1. Technical Field

The present invention relates to a substrate bonding apparatus and a substrate bonding method.

2. Related Art

There are apparatuses that bond pairs of substrates by activating front surfaces of the substrates and bring the activated front surfaces into contact with each other (please see Patent Document 1, for example).

Patent Document 1: Japanese Patent Application Publication No. 2013-258377

Lengths of time required from the start to the completion of bonding differ in some cases depending on the conditions of pairs of substrates to be bonded or the like. Because of this, if bonding is considered as having been completed when a certain length of time has passed after the start of bonding, differences in bonding time are absorbed by setting the certain length of time longer. As a result, if an actual length of time required for bonding substrates is shorter than a set length of time, waiting time is generated after the completion of the bonding until a next process is started, so the waiting time becomes waste.

SUMMARY

A first aspect of the present invention provides a substrate bonding apparatus that bonds a first substrate and a second substrate so that contact regions in which the first substrate and the second substrate contact are formed in parts of the first substrate and the second substrate and the contact regions enlarge from the parts, the substrate bonding apparatus including: a detecting unit that detects information about the contact regions; and a determining unit that determines that the first substrate and the second substrate can be carried out based on the information detected at the detecting unit.

A second aspect of the present invention provides a substrate bonding method of bonding a first substrate and a second substrate so that contact regions in which the first substrate and the second substrate contact are formed in parts of the first substrate and the second substrate and the contact regions enlarge from the parts, the substrate bonding method including: detecting information about the contact regions; and determining that the first substrate and the second substrate can be carried out based on the information detected at the detecting.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
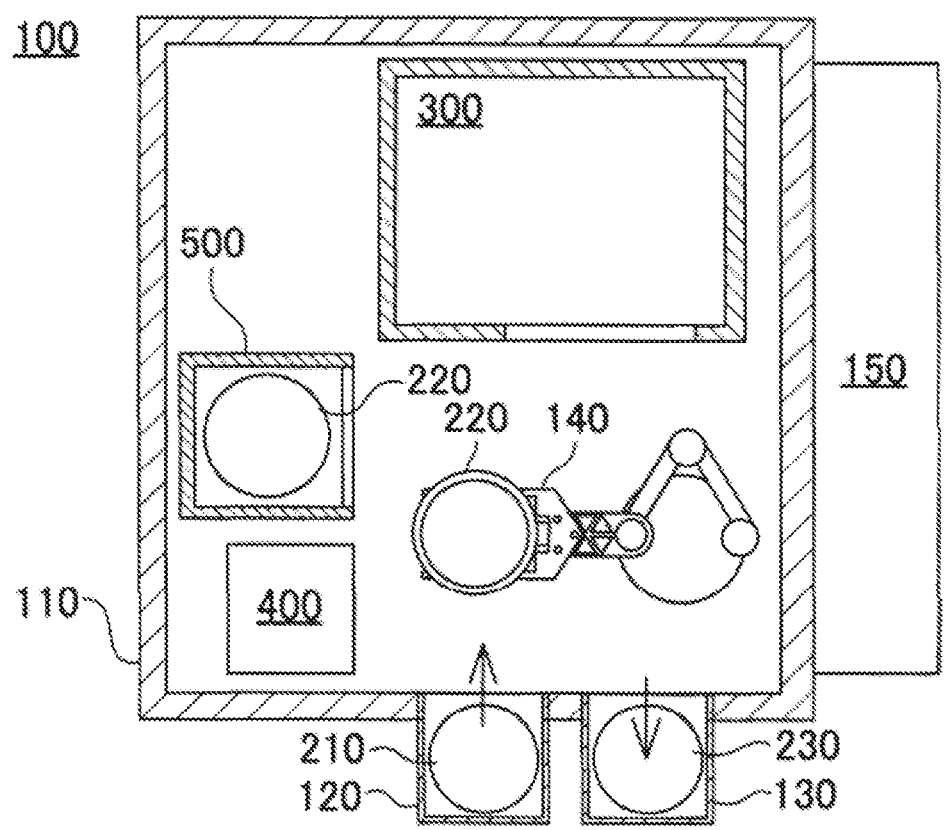
FIG. 1 is a schematic view of a substrate bonding apparatus 100.

FIG. 1 is a schematic plan view of a substrate bonding apparatus 100. The substrate bonding apparatus 100 includes: a housing 110; substrate cassettes 120, 130 and a control unit 150 that are disposed on the outside of the housing 110; and a carrying unit 140, a bonding unit 300, a holder stocker 400 and a pre-aligner 500 that are disposed inside the housing 110. The internal temperature of the housing 110 is managed, and is for example kept at room temperature.

One of the substrate cassettes, the substrate cassette 120, houses a plurality of substrates 210 that are about to be placed one upon another. The other of the substrate cassettes, the substrate cassette 130, can house a plurality of bonded substrates 230 fabricated by placing the substrates 210 one upon another. The substrate cassettes 120, 130 can be individually attached to and detached from the housing 110. In this manner, by using the substrate cassette 120, the plurality of substrates 210 can be carried into the substrate bonding apparatus 100 at once. In addition, by using the substrate cassette 130, the plurality of bonded substrates 230 can be carried out of the substrate bonding apparatus 100 at once.

The carrying unit 140 serves the carriage function inside the housing 110. The carrying unit 140 carries a single substrate 210, a substrate holder 220, a substrate holder 220 holding a substrate 210, a bonded substrate 230 formed by stacking substrates 210 and the like.

The control unit 150 performs overall control of the respective units of the substrate bonding apparatus 100 such that they cooperate with each other. In addition, by receiving a user instruction from the outside, the control unit 150 sets manufacturing conditions to be applied in manufacturing bonded substrates 230. Furthermore, the control unit 150 also has a user interface on which the operational state of the substrate bonding apparatus 100 is displayed to the outside.

The bonding unit 300 has a pair of stages each of which holds a substrate 210 and faces the other, and under the control of the control unit 150, positions the two substrates 210 held on the stages relative to each other and thereafter brings them into contact with each other and bonds them together. Thereby, the substrates 210 form a bonded substrate 230. The bonded state includes a state where terminals provided to the two substrates 210, respectively, are electrically connected together between the substrates 210 and a state where insulating films formed on front surfaces of the two substrates 210 are joined together and an electrical connection is not made between the substrates 210. In either state, the two substrates 210 may be separable or inseparable. If the two bonded substrates 210 are separable, the two substrates 210, after being bonded together, are preferably carried into a heating apparatus such as an annealing furnace and heated.

The holder stocker 400 houses a plurality of substrate holders 220. A substrate holder 220 is formed of a hard material such as alumina ceramics, and has a holding unit that adsorbs a substrate 210 and an edge portion disposed on the outside of the holding unit. Inside the substrate bonding apparatus 100, substrate holders 220 individually hold substrates 210 and are handled integrally with the substrates 210. Thereby, flatness of substrates 210 that are warped or bent can be ensured.

If a bonded substrate 230 is to be carried out of the substrate bonding apparatus 100, a substrate holder 220 is separated from the bonded substrate 230 and housed in the holder stocker 400 again. Thereby, a small number of substrate holders 220 can be used repeatedly. Accordingly, substrate holders 220 can also be considered as a part of the substrate bonding apparatus 100.

The pre-aligner 500 cooperates with the carrying unit 140 to cause a substrate 210 carried into the substrate bonding apparatus 100 to be held by a substrate holder 220. In addition, the pre-aligner 500 may be used if a bonded substrate 230 carried out of the bonding unit 300 is to be separated from a substrate holder 220.

The substrate bonding apparatus 100 can also bond unprocessed silicon wafers, compound semiconductor wafers, glass substrates or the like, besides substrates 210 on which elements, circuits, terminals or the like are formed. In addition, it can also bond a circuit substrate on which a circuit is formed and an unprocessed substrate together, and also bond substrates of the same type together, such as circuit substrates or unprocessed substrates. Furthermore, substrates 210 to be joined may themselves be bonded substrates 230 already formed by stacking a plurality of substrates.

Figure 2:
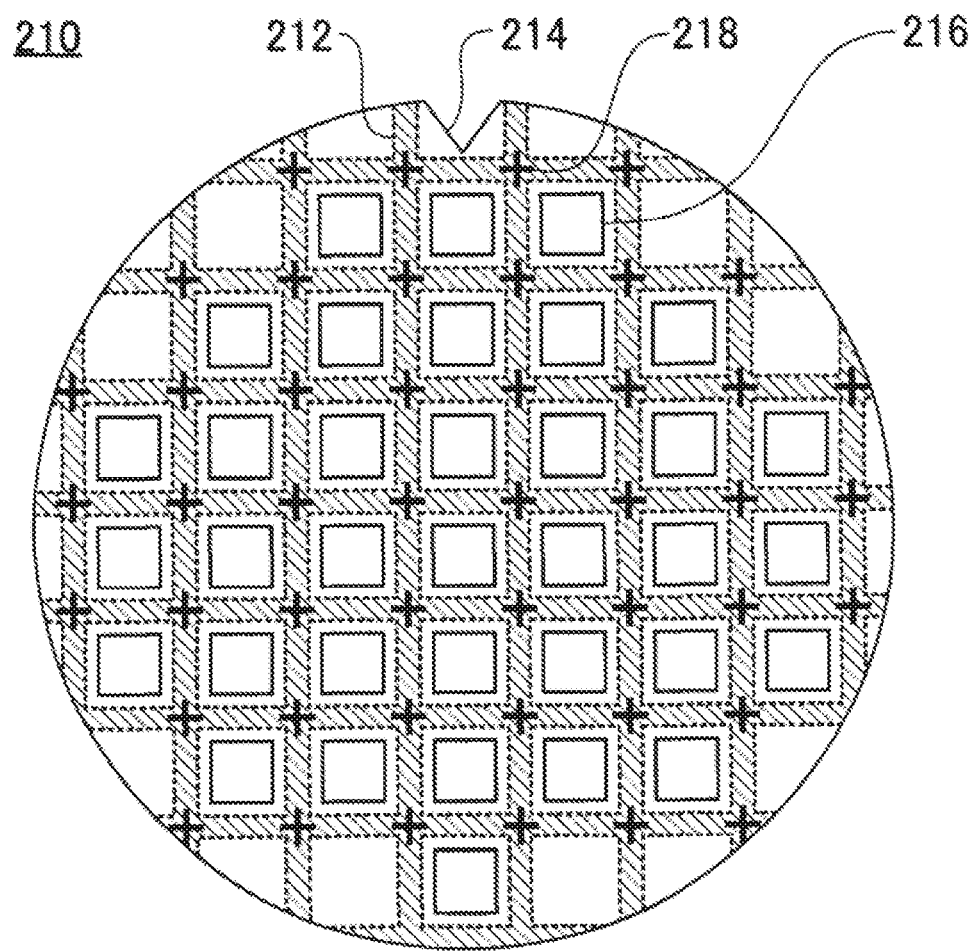
FIG. 2 is a schematic plan view of a substrate 210.

FIG. 2 is a schematic plan view of a substrate 210 that can be bonded in the substrate bonding apparatus 100. The substrate 210 has: a notch 214; and a plurality of circuit regions 216 and a plurality of alignment marks 218.

The notch 214 is formed in the circumference of the substrate 210 which is approximately circular as a whole, and serves as an index mark indicating the crystal orientation of the substrate 210. In addition, when the substrate 210 is handled, the array direction of the circuit regions 216 in the substrate 210 and the like can also be known by detecting the position of the notch 214. Furthermore, if circuit regions 216 including mutually different circuits are formed in a single substrate 210, the circuit regions 216 can be distinguished from one another using the notch 214 as a reference point.

The circuit regions 216 are disposed on a front surface of the substrate 210 orderly in the plane direction of the substrate 210. Each of the circuit regions 216 is provided with a semiconductor apparatus, wire, protection film or the like formed by a photolithography technique or the like. Also in the circuit regions 216 are disposed pads, bumps or the like to serve as connection terminals if the substrate 210 is to be electrically connected to another substrate 210, a lead frame or the like.

The alignment marks 218 are disposed for example overlapping scribe lines 212 disposed between the circuit regions 216, and are used as index marks if the substrate 210 is to be positioned relative to another substrate 210 which is a stacking target. Because the scribe lines 212 are regions to be removed finally by dicing, the area of the circuit regions 216 is never squeezed by providing the alignment marks 218. The alignment marks 218 may be disposed inside the circuit regions 216 or parts of structures formed in the circuit regions 216 may be utilized as the alignment marks 218.

Figure 3:
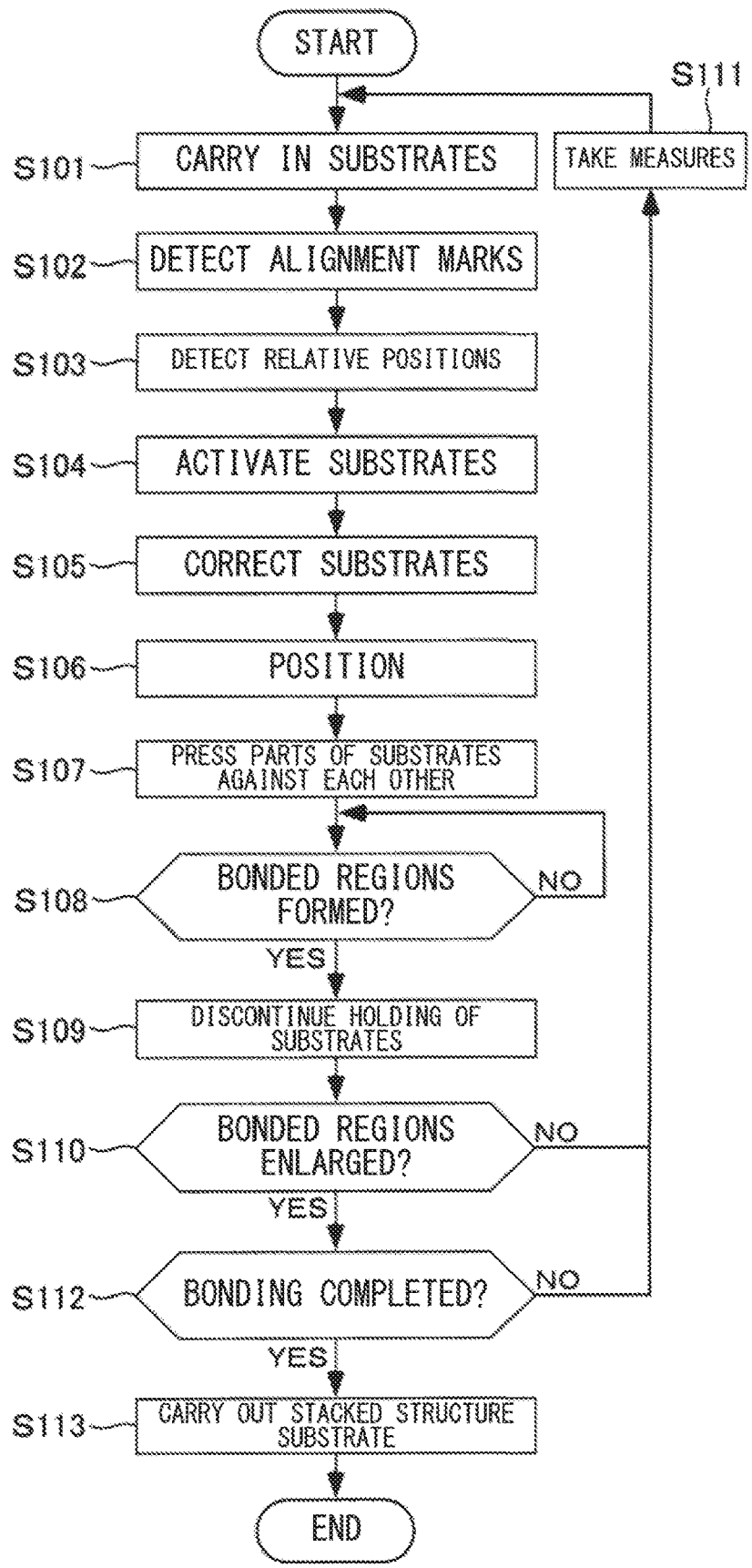
FIG. 3 is a flowchart showing a procedure of placing the substrates 210 one upon another.

FIG. 3 is a flowchart showing a procedure of fabricating a bonded substrate 230 by bonding substrates 210 in the substrate bonding apparatus 100. In the substrate bonding apparatus 100, the control unit 150 controls operation of the respective units. In addition, the control unit 150 operates also as a determining unit that determines whether or not bonding of substrates 210 is completed.

Inside the substrate bonding apparatus 100, substrates 210 are manipulated by being held by substrate holders 220 one by one. Accordingly, the control unit 150 first causes substrate holders 220 to hold substrates 210 taken out of the substrate cassette 120 one by one in the pre-aligner 500. Next, the control unit 150 causes a plurality of substrates 210 which are to be bonded together to be carried into the bonding unit 300 together with substrate holders 220 (Step S101).

Next, the control unit 150 detects alignment marks 218 provided to each of the substrates 210 carried into the bonding unit 300 (Step S102). In addition, based on the positions of the detected alignment marks 218, the control unit 150 detects the relative positions of the plurality of substrates 210 to be bonded (Step S103).

Next, the control unit 150 activates front surfaces of the substrates 210 (Step S104). The substrate 210 can activate the front surfaces of the substrates 210 for example by making them exposed to plasma and purifying them. Thereby, if a substrate 210 is brought into contact with another substrate 210, the substrates 210 adhere to each other and become integrated. Substrates 210 can be activated also by a mechanical process such as polishing or a chemical process such as washing. In addition, a plurality of types of activation methods may be used together.

Next, the control unit 150 starts temperature control on the substrates 210 to be bonded (Step S105). The temperature control executed here is, for example, temperature control for correction to compensate for differences in magnification from the design specifications of substrates 210. In addition, deformation of substrates 210 such as warping may be corrected using also a method other than temperature control, for example, a correction approach using an actuator mentioned below. Thereby, even if individual substrates 210 are distorted uniquely, the plurality of substrates 210 can be positioned accurately.

Next, the control unit 150 positions the plurality of substrates 210 to be bonded relative to each other (Step S106). The positioning is executed by relatively moving one substrate 210 relative to another substrate 210 based on the relative positions of the substrates 210 detected at Step S103.

Next, in order to form a bonding starting point between parts of the substrates 210, the control unit 150 brings parts of the substrates 210 that are placed one upon another into contact with each other (Step S107). The mutually contacting parts are contact regions where the substrates 210 contact each other, and which are formed when bonding is started. The starting point may be a region having an area. The bonding starting point between a pair of substrates 210 to be bonded is formed by pressing a part of one substrate 210 against a part of another substrate 210 to expel the atmosphere or the like sandwiched between the substrates 210 and bring the substrate 210 into direct contact with each other.

Due to this contact, the contact regions of the two substrates 210 that have been activated are bonded by a chemical bond such as a hydrogen bond. After the parts of the two substrates 210 are brought into contact, the two substrates 210 are kept in contact with each other. At this time, the contact regions may be enlarged by increasing the areas of the contacting parts by pressing the substrates 210 against each other. After the passage of a predetermined length of time while the contacting state is being maintained, bonding force which is sufficiently high to keep a positional shift from occurring between the two substrates 210 in the course of bonding between the substrates 210 is ensured between the two substrates 210. Thereby, a bonding starting point is formed between the mutually contacting parts of the substrates 210.

If bonding starting points are formed at a plurality of locations in the plane direction of the substrates 210, bubbles left in regions sandwiched by the plurality of starting points cannot be discharged in the course of bonding so that voids are generated in a finally completed bonded substrate 230, in some cases. Accordingly, if two substrates 210 are bonded, preferably, a bonding starting point is formed at one location of the substrates 210, and the contact regions where the substrates 210 are bonded together are enlarged from the bonding starting point to bond the entire substrates 210.

To cope with this, if substrates 210 are bonded in the bonding unit 300, for example, a raised portion is formed in one of the substrates 210 to be bonded, and the raised portion is brought into contact with the other substrate 210 so that a bonding starting point is formed at one preliminarily decided position. If a bonding starting point is formed, for the purpose of preventing starting points to be formed at a plurality of locations, preferably the shape of a raised portion of a substrate is maintained until a bonding starting point is formed.

Next, the control unit 150 checks whether or not contact regions of the substrates 210, parts of which are pressed against each other, are formed, and the above-mentioned predetermined bonding force is ensured between the two substrates 210 (Step S108). If it is to be detected that the substrates 210 are bonded at this stage, it is checked whether or not a bonding starting point to serve as a trigger of the start of bonding of the substrates 210 is formed. Accordingly, at Step S108, it is checked whether or not a region to serve as a bonding starting point is formed in a region where parts of the substrates 210 are pressed against each other at Step S107 or at a position near the region.

Thereby, if it is determined that a bonding starting point is formed between the substrates 210 (Step S108: YES), that is, if the control unit 150 determines that the above-mentioned predetermined bonding force is ensured between the contacting parts of the two substrates 210, holding of at least one substrate 210 is discontinued to release the substrate 210 (Step S109), and it is allowed for the two substrates 210 to be adsorbed to each other and bonded together by expanding the contact regions of the two substrates 210. That is, the bonding unit 300 constitutes a contacting unit. If it is not confirmed at Step S108 that a starting point is formed between the substrates 210 (Step S108: NO), the control unit 150 keeps pressing parts of the substrates 210 against each other so as to form a bonding starting point while at the same time continuing holding of both the substrates 210.

Next, the control unit 150 checks whether or not the contact regions of the substrates 210 are expanding from the bonding starting point formed between the substrates 210 (Step S110). Whether or not the contact regions of the substrates 210 have enlarged can be confirmed for example by checking whether or not contact regions are formed in regions different from the regions where the bonding starting point is formed.

If it is not confirmed at Step S110 that the contact regions of the substrates 210 are enlarging (Step S110: NO), the control unit 150 determines that bonding of the substrates 210 is inhibited for some reason. To cope with this, after measures such as stopping operation of the bonding unit 300, issuing an alert to the outside, or carrying substrates 210 being bonded out of the bonding unit 300 are taken (Step S111), the control returns to Step S101 so as to start bonding of next substrates 210.

If it is confirmed at Step S110 that the contact regions of the substrates 210 are enlarging (Step S110: YES), the control unit 150 determines that bonding of the substrates 210 is progressing, and the control proceeds to a next step. Next, the control unit 150 checks whether or not bonding of the substrates 210 has been completed (Step S112). Completion of the bonding may be known for example by checking whether or not the contact regions of the substrates 210 are formed at the outer edges of the substrates 210. Thereby, the control unit 150 can surely confirm completion of the bonding even if lengths of time required for bonding differ substrate 210-by-substrate 210.

If the control unit 150 confirms at Step S112 that bonding of the substrates has been completed (Step S112: YES), it ends temperature control or the like on the substrates 211, 213 and carries out the bonded substrate 230 out of the bonding unit 300 by the carrying unit 140 (Step S113). The substrates 210 carried out of the bonding unit 300 are separated into the bonded substrate 230 and a substrate holder 220 and housed in the substrate cassette 130.

In addition, if the control unit 150 cannot confirm at Step S112 that bonding of the substrates has been completed (Step S112: NO), the control unit 150 may repeatedly check completion of bonding of the substrates 210 until completion of bonding of the substrates 210 is confirmed, but if completion of bonding of the substrates 210 cannot be confirmed even after the passage of a predetermined threshold length of time, bonding of the substrates 210 may be stopped as in the case of Step S110: NO.

If the control unit 150 confirms at Step S110 that the contact regions of the substrates 210 have enlarged, the control unit 150 may predict a time at which bonding of the substrates 210 will be completed by detecting also the speed at which the contact regions of the substrates 210 enlarge. The speed at which the contact regions of the substrates 210 enlarge may be calculated by the control unit for example by measuring a length of time from when parts of the substrates 210 are pressed against each other at Step S107 until when it is detected that the substrate 210 are bonded in a region different from a bonding starting point at Step S110.

In addition, upon formation of a bonding starting point between parts of the substrates 210, the relative positions of the plurality of substrates 210 to be bonded are fixed in the plane direction of the substrates 210, and even if holding of at least one of the substrates 210 to be bonded is discontinued, the substrates 210 will never be displaced or a positional shift of one of the substrates 210 to the other substrate never occurs. Accordingly, the control unit 150 may carry two substrates 210 out of the bonding unit 300 before bonding of the substrates 210 is completed up to their circumference.

Figure 4:
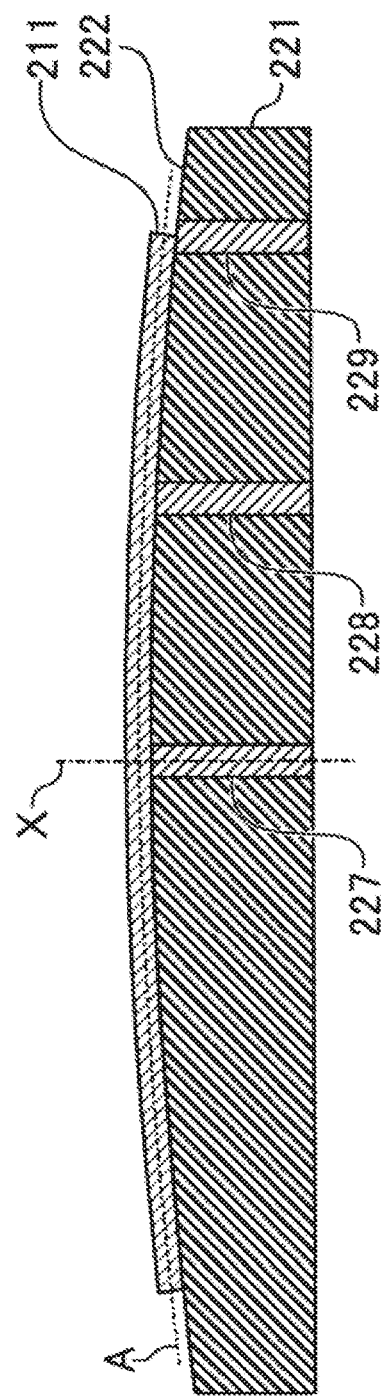
FIG. 4 is a schematic sectional view of a substrate holder 221 holding a substrate 211.

FIG. 4 is a schematic section showing the state where one substrate 211 carried into the bonding unit 300 at Step S101 is held by a substrate holder 221. The substrate holder 221 has an electrostatic chuck, vacuum chuck or the like which causes the substrate 211 to be adsorbed to a holding surface 222, and thereby holds the substrate 211.

The holding surface 222 of the substrate holder 221 has a curved shape with an elevated middle side portion and low circumference. Accordingly, the substrate 211 adsorbed to the holding surface 222 also is curved into a shape with a projecting middle side portion. In addition, while the substrate holder 221 keeps holding the substrate 211, the convex shape of the substrate 210 is maintained. The shape of the holding surface 222 of the substrate holder 221 may be a spherical surface, a paraboloid, a cylindrical surface or the like.

If the substrate 211 is adsorbed to the holding surface 222, in the curved substrate 211, at the upper surface of the substrate 211 in the figure, the front surface of the substrate 211 deforms to enlarge in the plane direction, as compared to a thickness-wise central line A of the substrate 211 indicated with an alternate long and short dash line in the figure. In addition, at the lower surface of the substrate 211 in the figure, the front surface of the substrate 211 deforms to shrink in the plane direction.

Accordingly, by the substrate holder 221 holding the substrate 211, the magnification, on the plane, of circuit regions 216 formed on a front surface of the substrate 211 relative to design specifications also increases. Accordingly, the magnification correction amount for substrates 211 may be adjusted by preparing a plurality of substrate holders 221 with holding surfaces 222 having different curvatures and changing the deformation amount for the substrates 211.

In addition, the substrate holder 221 has a plurality of observation holes 227, 228, 229 penetrating the substrate holder 221 in the thickness direction. One of the observation holes, the observation hole 227, is disposed in a region including the central axis X in the radial direction of substrate holder 221. In addition, another one of the observation holes, the observation hole 229, is disposed in a region including the circumference of the substrate 211 held by the substrate holder 221. Furthermore, still another one of the observation holes, the observation hole 228, is disposed at an intermediate position between the other observation holes 227, 229. Each of the observation holes 227, 228, 229 is filled with a material which is transparent to the wavelength of illumination light used when the substrate 211 is observed, and the holding surface 222 of the substrate holder 221 forms a smooth curved surface.

Figure 5:
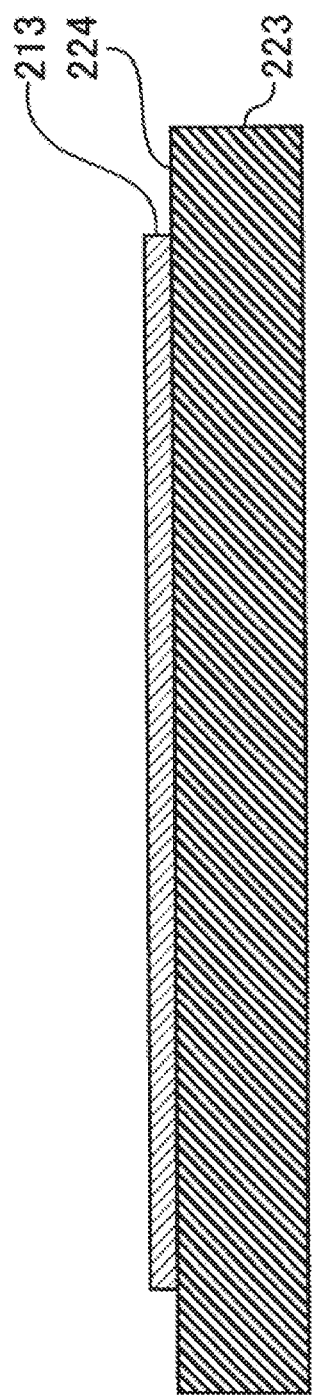
FIG. 5 is a schematic sectional view of a substrate holder 223 holding a substrate 213.

FIG. 5 is a schematic section showing the state where another substrate 213 is held by a substrate holder 223. The substrate holder 223 has a flat holding surface 224 and the function of adsorbing the substrate 213 which is achieved by an electrostatic chuck, vacuum chuck or the like. The substrate 213 held by being adsorbed to the substrate holder 223 closely contacts the holding surface 224 and becomes flat conforming to the shape of the holding surface 224.

Accordingly, if in the bonding unit 300, the substrate 211 deformed convexly by being held by the substrate holder 221 shown in FIG. 4 is pressed against the substrate 213 held by the substrate holder 223 shown in FIG. 5 in the flat state, the substrates 211, 213 are pressed hard against each other at one point in the middle. In addition, while each of the substrate holders 221, 223 is holding the corresponding substrate 211 or 213, regions of the substrates 211, 213 on the circumference side remain separated from each other.

In the above-mentioned example, a combination of the convexly deformed substrate 211 and the flat substrate 213 is mentioned as an example. But for example also in cases that both the substrates 211, 213 are convexly deformed, that the substrates 211, 213 are deformed into a convex shape and a concave shape with mutually different curvatures, and that the substrates 211, 213 are deformed into cylindrical shapes with non-parallel central axes, the substrates 211, 213 can be brought into contact at one point in the bonding unit 300.

Figure 6:
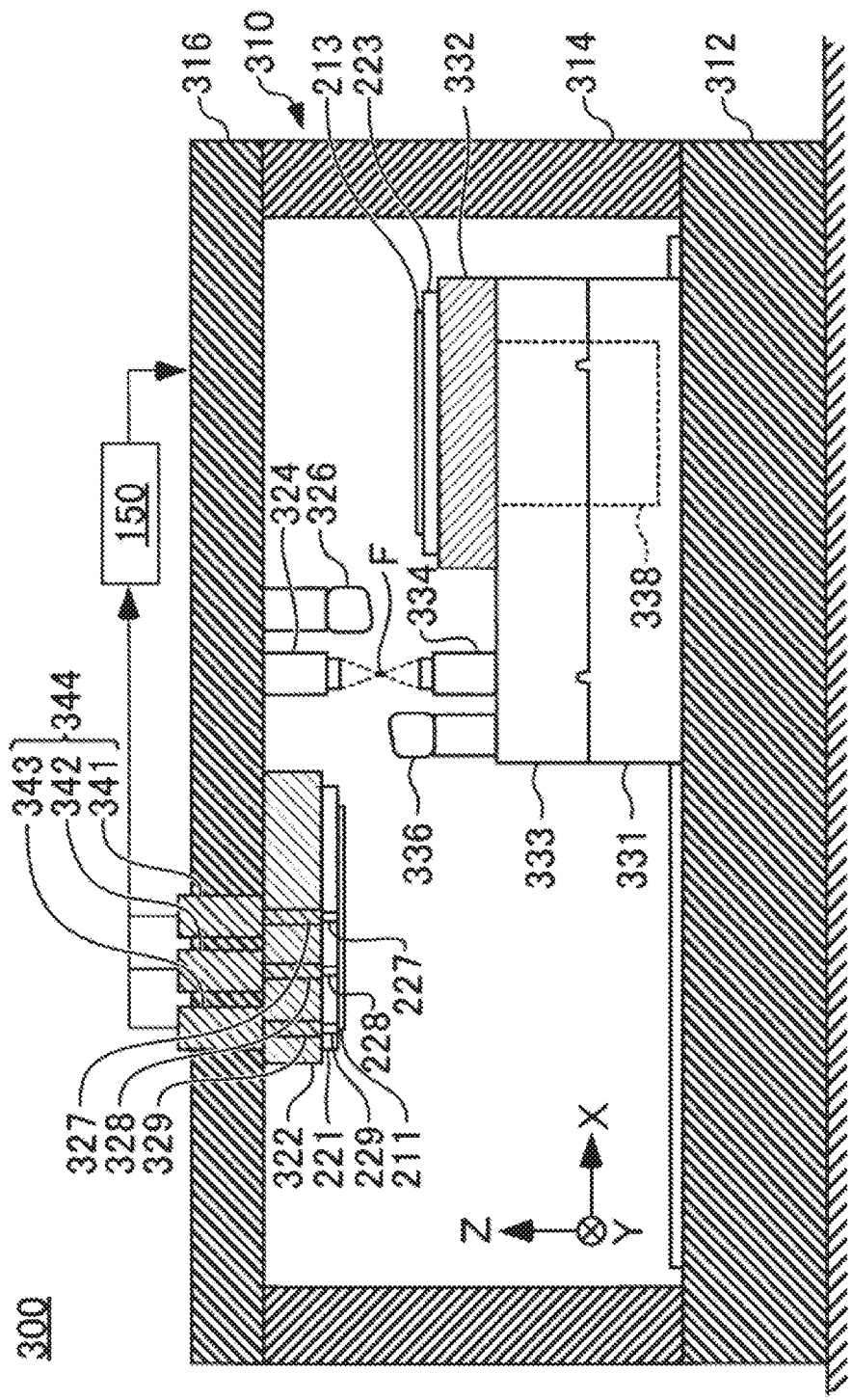
FIG. 6 is a schematic sectional view of a bonding unit 300.

FIG. 6 is a schematic sectional view showing the structure of the bonding unit 300. In addition, FIG. 6 is also a figure showing the state of the bonding unit 300 immediately after substrates 211, 213 and substrate holders 221, 223 are carried out. The bonding unit 300 includes a frame body 310, an upper stage 322 and a lower stage 332.

The frame body 310 has a base plate 312 and a top plate 316 that are parallel with the horizontal floor surface, and a plurality of supports 314 that are vertical to the floor plate. The base plate 312, support 314 and top plate 316 form the rectangular parallelepiped frame body 310 to house other members of the bonding unit 300.

The upper stage 322 is fixed to the lower surface of the top plate 316 in the figure and faces downward. The upper stage 322 has the holding function that is realized by a vacuum chuck, electrostatic chuck or the like, and forms a holding unit to hold the substrate holder 221. In the illustrated state, the substrate holder 221 holding the substrate 211 already is held by the upper stage 322.

In addition, the upper stage 322 has a plurality of observation windows 327, 328, 329 provided corresponding to the positions of the observation holes 227, 228, 229 of the substrate holder 221 held by the upper stage 322. Each of the observation windows 327, 328, 329 is filled with a material that is transparent to the wavelength of illumination light used when the substrate 211 is observed, and the lower surface of the upper stage 322 forms a flat surface including also the regions where the observation windows 327, 328, 329 are disposed.

The bonding unit 300 has a plurality of detectors 341, 342, 343 that are provided at the positions corresponding to the above-mentioned observation windows 327, 328, 329 provided to the upper stage 322, and the detectors 341, 342, 343 penetrate the top plate 316 of the frame body 310 in the thickness direction. The detectors 341, 342, 343 form an observing unit 344 to observe the bonding state of the substrates 211, 213 in the bonding unit 300 through: the observation windows 327, 328, 329 that optically communicate with the lower surface of the upper stage 322; and the observation holes 227, 228, 229 of the substrate holder 221.

The detectors 341, 342, 343, for example, can be formed using a light-receiving unit such as a photodiode and an irradiation light source. In this case, upon the substrate holder 221 holding the substrate 211 being held by the upper stage 322, the optical intensity of light reflected on the substrates 211, 213 or the like can be observed by the detectors 341, 342, 343 through the observation windows 327, 328, 329 and observation holes 227, 228, 229.

In addition, the detectors 341, 342, 343, for example, can be formed using an image-capturing element such as a CCD or a CMOS sensor and an illumination light source. In this case, upon the substrate holder 221 holding the substrate 211 being held by the upper stage 322, an image of the substrate 211 held by the upper stage 322 can be captured by the detectors 341, 342, 343 through the observation windows 327, 328, 329 and observation holes 227, 228, 229, and the substrate 211 can be observed thereby. In addition, if the substrates 211, 213 overlap in the bonding unit 300, images of the substrates 211, 213 can be captured at once.

Furthermore, by using light at a long wavelength such as infrared light as an irradiation light source or an illumination light source, the detectors 341, 342, 343 can observe the substrate 213 bonded with the substrate 211 through the substrate 211 held by the upper stage 322. Outputs of the detectors 341, 342, 343 are processed for example at the control unit 150, and bonding of the substrates 211, 213 is detected based on a result of observation by the detectors 341, 342, 343.

If infrared light is used as an illumination light source, changes in the position of the boundary between the contact regions and non-contact regions of the substrates 211, 213 may be observed by capturing images of regions including the centers of the substrates 211, 213. In this case, at the moment when a bonding starting point is formed or in the course of enlargement of the contact regions, the shape of the contact regions is detected. The shape of the contact regions is one piece of information about the state of enlargement of the contact regions. That is, the observing unit 344 constitutes a detecting unit to detect information about enlargement of the contact regions. The information about enlargement of the contact regions is information that changes corresponding to the degree of progress of the enlargement of the contact regions. If it is determined at the control unit 150 that the shape of the contact regions is a shape meeting a predetermined condition, it may be determined that the contacting state of the contact regions is in a state where bonding can be performed appropriately later on so that the substrates 211, 213 may be carried out of the lower stage 332. The predetermined condition is, for example, that the shape of the contact regions is almost completely round. The shape of the contact regions that meets a predetermined condition is stored preliminarily. In addition, if the shape of the contact regions is unique to each type of wafers, each lot, each wafer manufacturing process or the like, the respective shapes of the contact regions during their enlargement may be stored in a storage unit preliminarily, and compared with an actual shape detected during joining.

In addition, if infrared light is used as an illumination light source, regions that extend from at least the centers of the substrates 211, 213 toward their circumferential portions in the radial direction may be treated as observed regions. In this case, in the course of enlargement of the contact regions, the progress direction and/or progress speed of enlargement of the contact regions can be estimated by performing a process of capturing a plurality of images consecutively for example every 500 msec, and comparing an image of the contact regions captured at one moment with an image of the contact regions captured at one prior moment.

The lower stage 332 is arranged oppositely to the upper stage 322, and is mounted on the upper surface, in the figure, of a Y-direction driving unit 333 placed on an X-direction driving unit 331 disposed on the upper surface of the base plate 312. The lower stage 332 forms a holding unit to hold the substrate 213 oppositely to the substrate 211 held by the upper stage 322. In the illustrated state, the substrate holder 223 holding the substrate 213 already is held by the lower stage 332.

In the illustrated state, the substrate holder 221 having the curved holding surface 222 is held by the upper stage 322 positioned on an upper side in the figure and the substrate 213 held by the substrate holder 223 having the flat holding surface 224 is held by the lower stage 332 positioned on a lower side in the figure. But combinations of the upper stage 322 and lower stage 332, and the substrate holders 221, 223 are not limited to them. In addition, the flat substrate holder 223 or curved substrate holder 221 may be carried into both the upper stage 322 and the lower stage 332.

In the bonding unit 300, the X-direction driving unit 331 moves in the direction indicated by the arrow X in the figure, parallelly with the base plate 312. On the X-direction driving unit 331, the Y-direction driving unit 333 moves in the direction indicated by the arrow Y in the figure, parallelly with the base plate 312. Operation of these X-direction driving unit 331 and Y-direction driving unit 333 is combined to move the lower stage 332 parallelly with the base plate 312 and two-dimensionally. Thereby, the substrate 213 mounted on the lower stage 332 can be positioned relative to the substrate 211 held by the upper stage 322.

In addition, the lower stage 332 is supported by a raising/lowering drive unit 338 that rises and lowers vertically to the base plate 312 in the direction indicated by the arrow Z. The lower stage 332 can rise and lower relative to the Y-direction driving unit 333. Thereby, the raising/lowering drive unit 338 forms a pressing unit that presses the substrate 213 mounted on the lower stage 332 against the substrate 211 held by the upper stage 322.

The amount of movement of the lower stage 332 realized by the X-direction driving unit 331, Y-direction driving unit 333 and raising/lowering drive unit 338 is precisely measured by using an interferometer or the like. In addition, the X-direction driving unit 331 and Y-direction driving unit 333 may be configured as two stages consisting of a coarse moving unit and a fine moving unit. Thereby, highly accurate positioning and high throughput can both be achieved to make it possible to join the substrate 213 mounted on the lower stage 332, moving the substrate 213 fast without lowering control accuracy.

On the Y-direction driving unit 333, a microscope 334 and an activation apparatus 336 respectively are further mounted laterally next to the lower stage 332. The microscope 334 allows observation of the downward-facing lower surface of the substrate 211 held by the upper stage 322. The activation apparatus 336 generates plasma to purify the lower surface of the substrate 211 held by the upper stage 322.

The bonding unit 300 may further include a rotation drive unit that rotates the lower stage 332 about a rotation axis vertical to the base plate 312 and an oscillation drive unit that oscillates the lower stage 332. Thereby, the positioning accuracy of the substrates 211, 213 can be improved by rotating the substrate 213 held by the lower stage 332, as well as by making the lower stage 332 parallel with the upper stage 322.

Furthermore, the bonding unit 300 has a pair of a microscope 324 and the microscope 334 and a pair of an activation apparatus 326 and the activation apparatus 336. One of the microscopes, the microscope 324 and one of the activation apparatuses, the activation apparatus 326, are fixed to the lower surface of the top plate 316 and laterally next to the upper stage 322. The microscope 324 allows observation of the upper surface of the substrate 213 held by the lower stage 332. The activation apparatus 326 generates plasma to purify the upper surface of the substrate 213 held by the lower stage 332.

In addition, the other one of the microscopes, the microscope 334, and the other one of the activation apparatuses, the activation apparatus 336, are mounted on the Y-direction driving unit 333 and laterally next to the lower stage 332. The microscope 334 allows observation of the lower surface of the substrate 211 held by the upper stage 322. The activation apparatus 336 generates plasma to purify the lower surface of the substrate 211 held by the upper stage 322.

The microscopes 324, 334 can be used at Step S102 in a procedure like the one explained next. The control unit 150 calibrates the relative positions of the microscopes 324, 334 by making the foci of the microscopes 324, 334 coincide with each other, as shown in FIG. 6.

Figure 7:
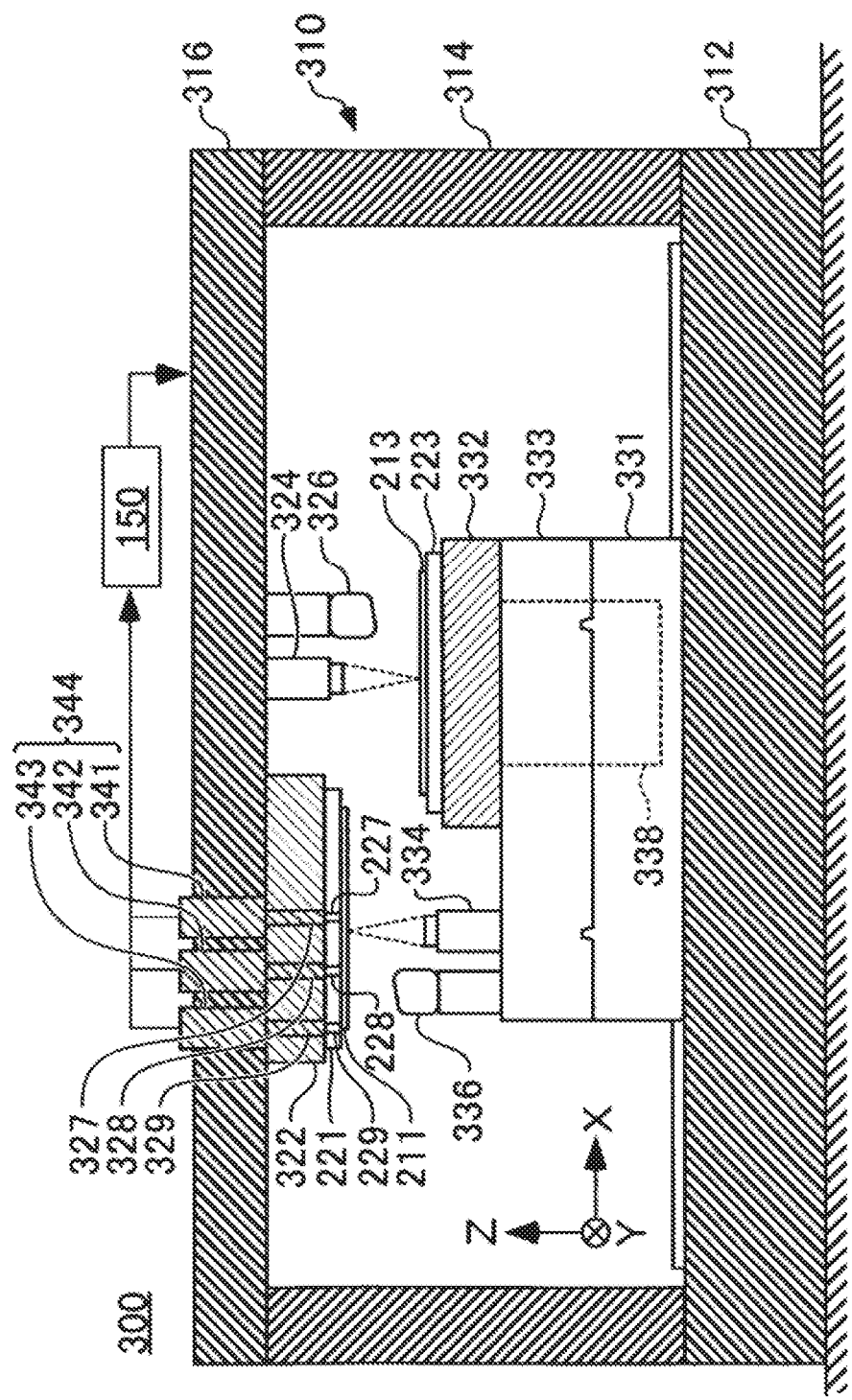
FIG. 7 is a schematic sectional view of the bonding unit 300.

Next, as shown in FIG. 7, the control unit 150 operates the X-direction driving unit 331 and Y-direction driving unit 333 to detect, using the microscopes 324, 334, alignment marks 218 provided to the respective substrates 211, 213 (Step S102 in FIG. 3). The control unit 150 knows the amount of movement of the lower stage 332 realized by the X-direction driving unit 331 and Y-direction driving unit 333 that has been made until the alignment marks 218 are detected.

In this manner, by detecting the positions of the alignment marks 218 of the substrates 211, 213 using the microscopes 324, 334 whose relative positions are known, the relative positions of the substrates 211, 213 can be known (Step S103 in FIG. 3). Thereby, if the substrates 211, 213 to be placed one upon another are to be positioned, the relative movement amounts including the amounts of relative movement and rotation of the substrates 211, 213 that are necessary to make the positions of the detected alignment marks 218 coincide with each other may be calculated.

However, the respective substrates 211, 213 to form a bonded substrate 230 are each distorted in some cases. Distortion that occurs to the substrates 211, 213 include: distortion that has certain tendency in the entire substrates 211, 213 such as warping or deflection of the substrates 211, 213; and non-linear distortion that occurs in the plane directions or radial directions of the substrates.

These types of distortion occur due to: stress that has occurred in processes of forming circuit regions 216 in the substrates 211, 213; anisotropy due to crystalline orientation of the substrates 211, 213; cyclic changes in rigidity or the like due to arrangement of scribe lines 212, circuit regions 216 or the like; or the like. In addition, even if distortion is not occurring to individual ones of the substrates 211, 213, in the course of bonding, the substrates 211, 213 may be deformed at the boundary between contact regions which are regions already bonded and non-contact regions which are regions not bonded yet, and distortion also occur thereto in some cases.

If the respective substrates 211, 213 are distorted individually differently, the value for making the positions of the alignment marks 218 coincide with each other cannot be calculated in some cases even if it is attempted to calculate the relative movement amounts at Step S106. To cope with this, it is possible to improve the positioning accuracy of the substrates 211, 213 by correcting distortion of at least one of the substrates 211, 213 by temperature control (Step S105).

For example, distortion due to differences in magnification of the circuit regions 216 in the substrates 211, 213 from design specifications can be corrected by changing the overall sizes of the substrates 211, 213 by adjusting the temperature of at least one of the substrates 211, 213. In addition, as has been explained already, distortion of the substrate 211 can also be corrected by causing the substrate holder 221, which has the curved or bent holding surface 222, to hold the substrate 211.

Furthermore, in the bonding unit 300, at least one of the upper stage 322 and the lower stage 332 on which the substrates 211, 213 are mounted can also be provided with an actuator to mechanically deform the substrate(s) 211, 213 to perform correction by deforming the at least one of the substrates 211, 213. Thereby, the bonding unit 300 can correct distortion of the substrate(s) 211, 213 irrespective of whether it is linear distortion or non-linear distortion.

Figure 8:
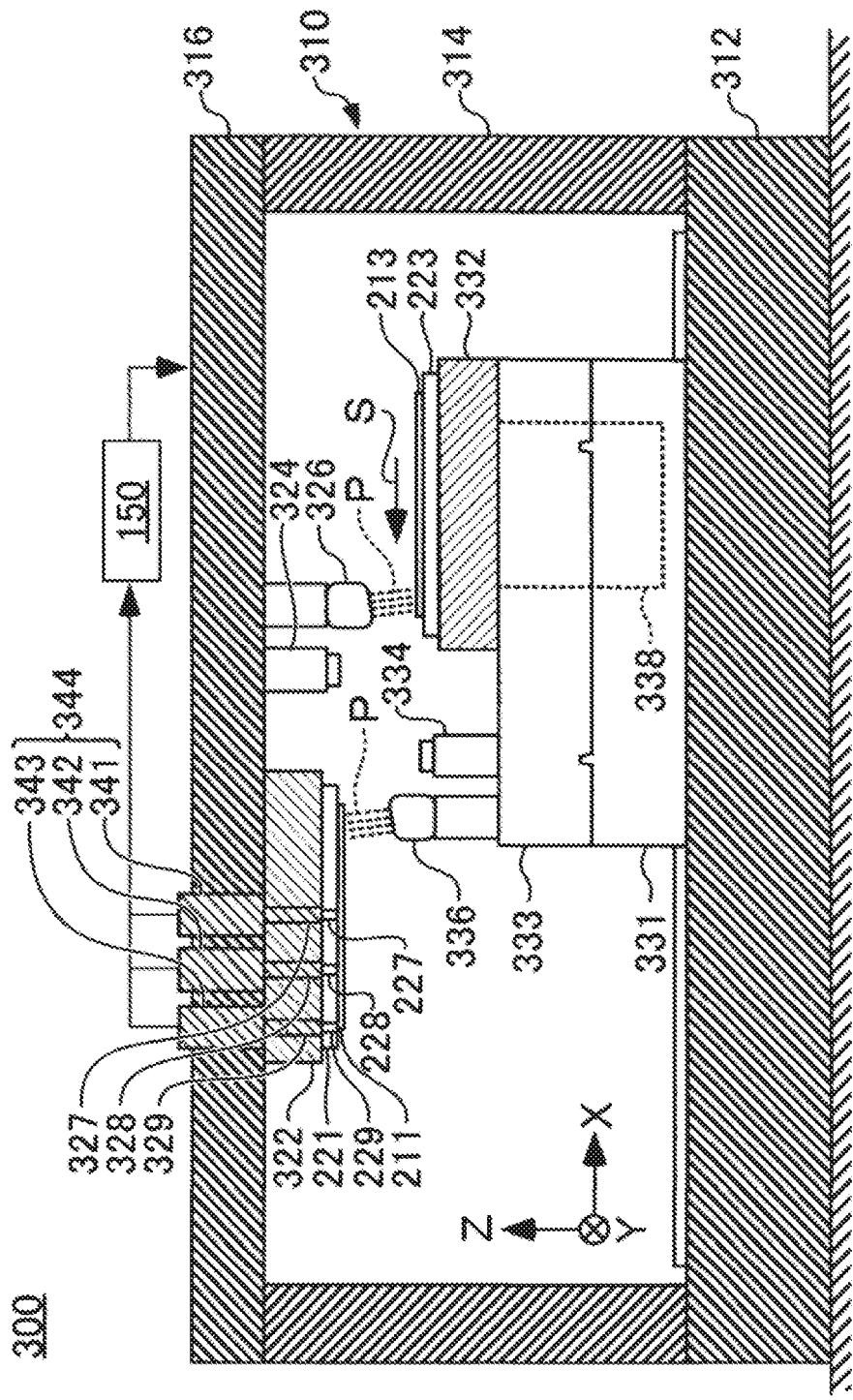
FIG. 8 is a schematic sectional view of the bonding unit 300.

FIG. 8 shows operation performed by the bonding unit 300 to activate the substrates 211, 213 (Step S104 in FIG. 3).

The control unit 150 moves the position of the lower stage 332 horizontally after resetting it to an initial position to scan front surfaces of the substrates 211, 213 with plasma generated by the activation apparatuses 326, 336. Thereby, the respective front surfaces of the substrates 211, 213 are purified and become chemically highly active. Because of this, the substrates 211, 213 can now autonomously adsorb each other and join with each other simply by being brought close to each other.

The activation apparatuses 326, 336 radiate plasma P in a direction away from each of the microscopes 324, 334. Thereby, it is possible to prevent the microscopes 324, 334 from being contaminated by fragments generated by the substrates 211, 213 irradiated with plasma.

In addition, although the bonding unit 300 includes the activation apparatuses 326, 336 to activate the substrates 211, 213, a different structure in which the activation apparatuses 326, 336 of the bonding unit 300 are omitted can also be employed, which structure is made possible by carrying, into the bonding unit 300, the substrates 211, 213 that are activated preliminarily by using the activation apparatuses 326, 336 provided separately from the bonding unit 300.

Furthermore, the substrates 211, 213 can also be activated by sputter etching using an inert gas, an ion beam, a fast atomic beam or the like, besides a method of exposing them to plasma. If an ion beam or fast atomic beam is used, it is possible to generate the bonding unit 300 under reduced pressure. Still furthermore, the substrates 211, 213 can also be activated by ultraviolet light irradiation, ozone asher or the like. Furthermore, for example, activation may be performed by using a liquid or gas etchant to chemically purify front surfaces of the substrates 211, 213.

Step S104 of activating at least one of the substrates 211, 213 and Step S105 of controlling the temperature of any of the substrates 211, 213 may be replaced with each other in terms of the order. That is, as explained above, the substrates 211, 213 may be activated (Step S104), and thereafter the temperature of at least one of the substrates 211, 213 may be controlled (Step S105), or the temperature of at least one of the substrates 211, 213 may be controlled first (Step S105), and thereafter the substrates 211, 213 may be activated (Step S104).

Figure 9:
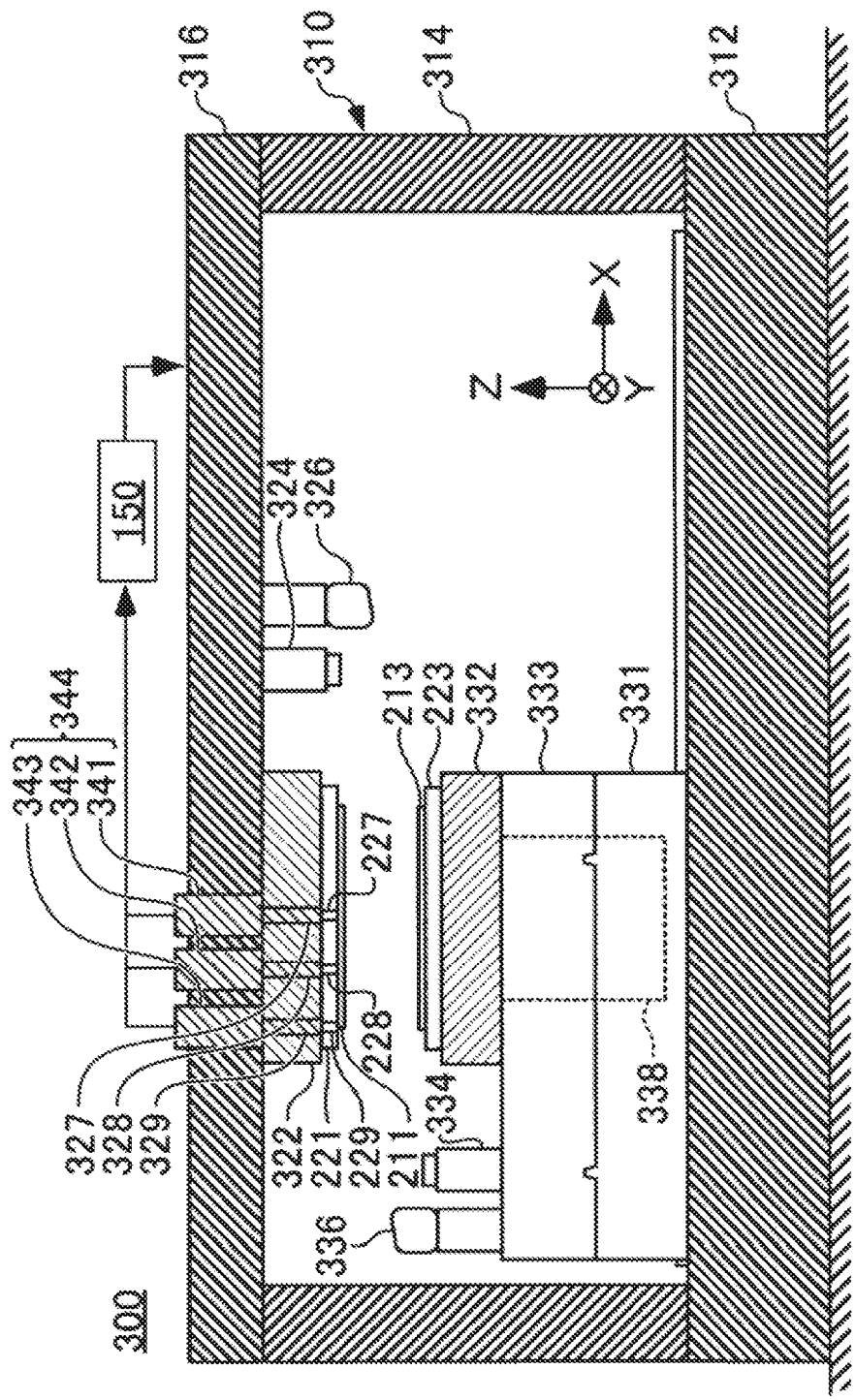
FIG. 9 is a schematic sectional view of the bonding unit 300.

FIG. 9 shows operation performed by the bonding unit 300 to position the substrates 211, 213 (Step S106 in FIG. 3). First, based on the relative positions of the microscopes 324, 334 detected first and the positions of the alignment marks 218 of the substrates 211, 213 detected at Step S102, the control unit 150 moves the lower stage 332 such that the amount of a positional shift between the substrates 211, 213 becomes smaller than a predetermined value.

Figure 10:
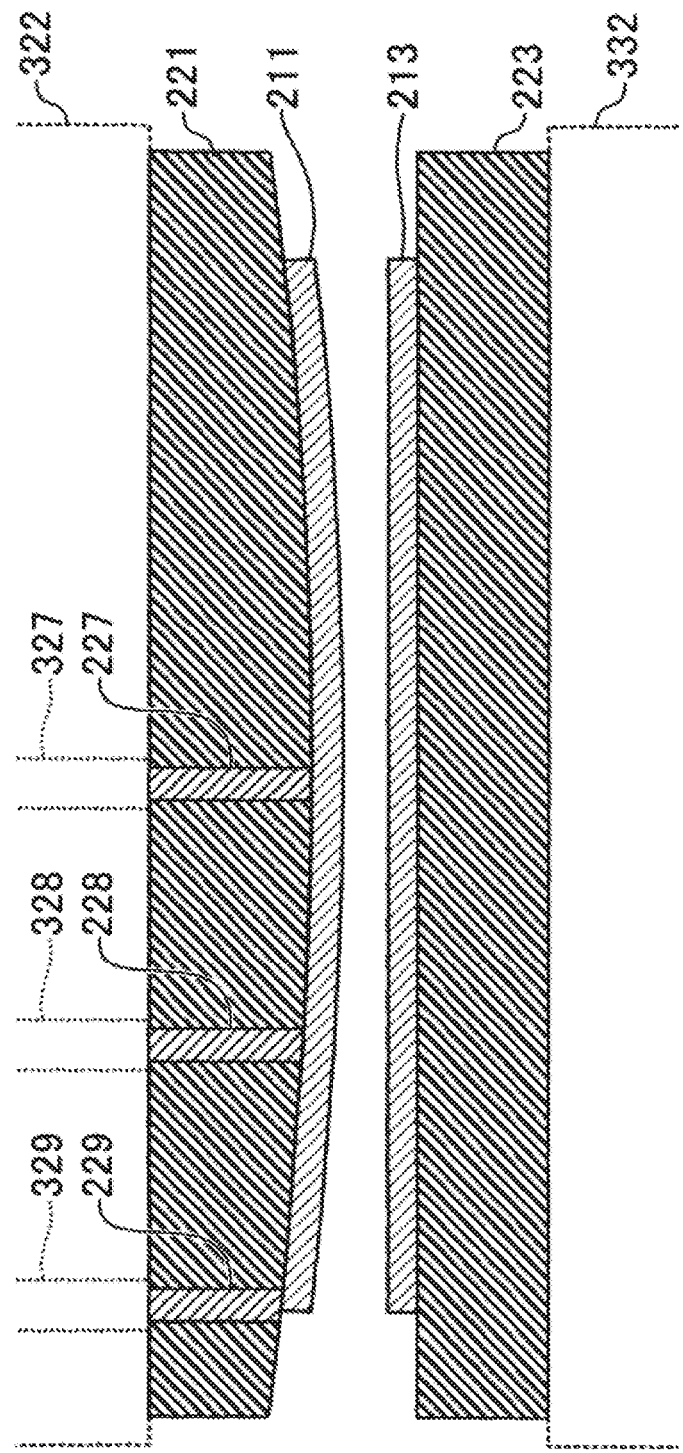
FIG. 10 is a schematic view showing the state of the substrates 211, 213 in the course of bonding.

FIG. 10 is a figure schematically showing how the substrates 211, 213 appear in the state at Step S106 shown in FIG. 9. As illustrated, the substrates 211, 213 held by the upper stage 322 and lower stage 332 respectively through the substrate holders 221, 223 face each other in a state where they are positioned relative to each other.

Here, because, as has been explained already, the substrate holder 221 held by the upper stage 322 is holding the substrate 211 on the holding surface 222 with a raised middle portion, the substrate 211 also is raised at its middle portion. On the other hand, because the substrate holder 223 held by the lower stage 332 has the flat holding surface 224, the substrate 213 is held in a flat state. Accordingly, the interval between the substrates 211, 213 facing each other in the bonding unit 300 is narrow at their middle portions and increases as the distance from the circumferential portions decreases.

Figure 11:
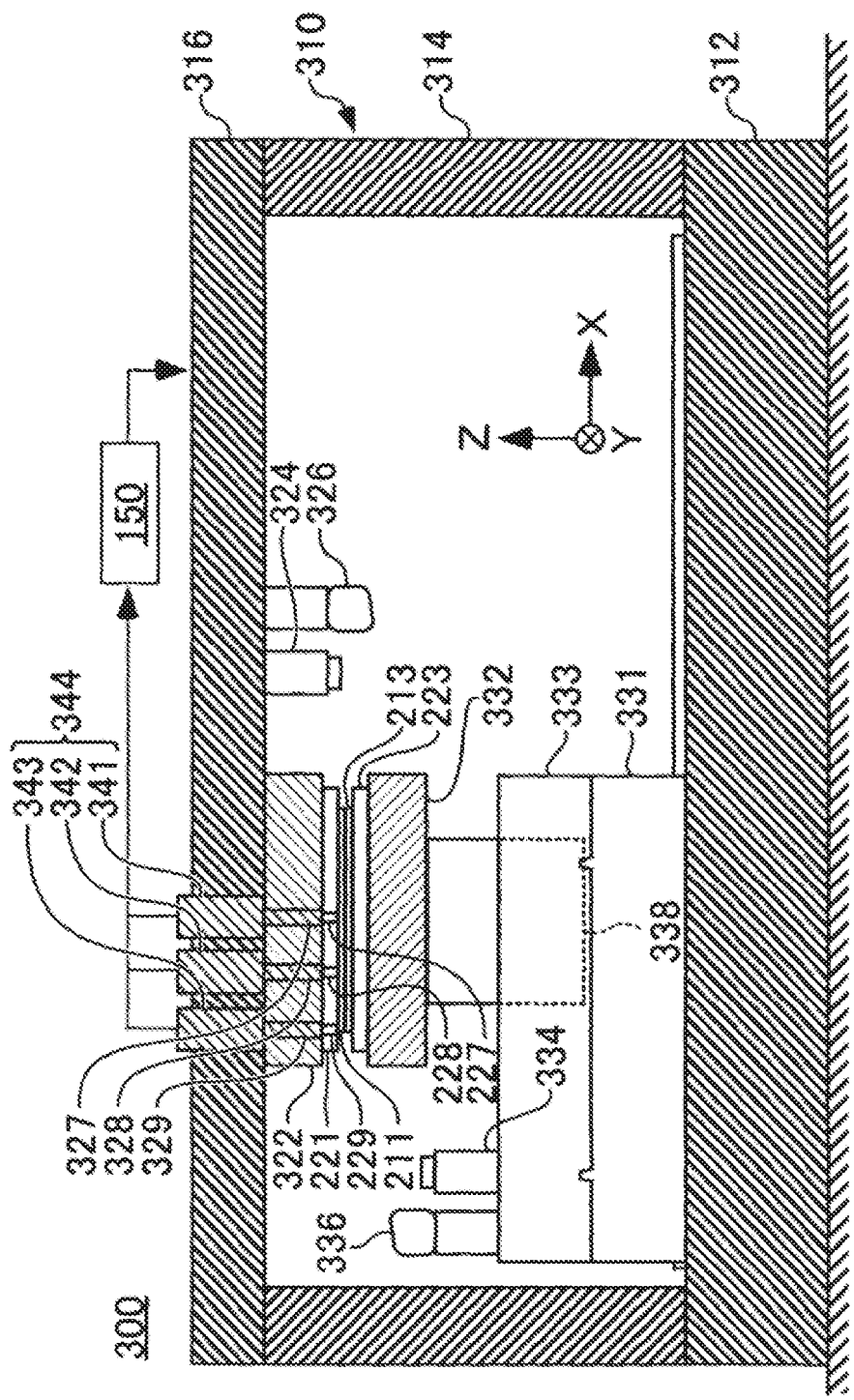
FIG. 11 is a schematic sectional view of the bonding unit 300.

FIG. 11 shows operation performed by the bonding unit 300 to bring the substrate 213 held by the lower stage 332 into contact with the substrate 211 held by the upper stage 322 (Step S107 in FIG. 3). The control unit 150 operates the raising/lowering drive unit 338 to raise the lower stage 332 to bring the substrates 211, 213 into contact with each other.

Figure 12:
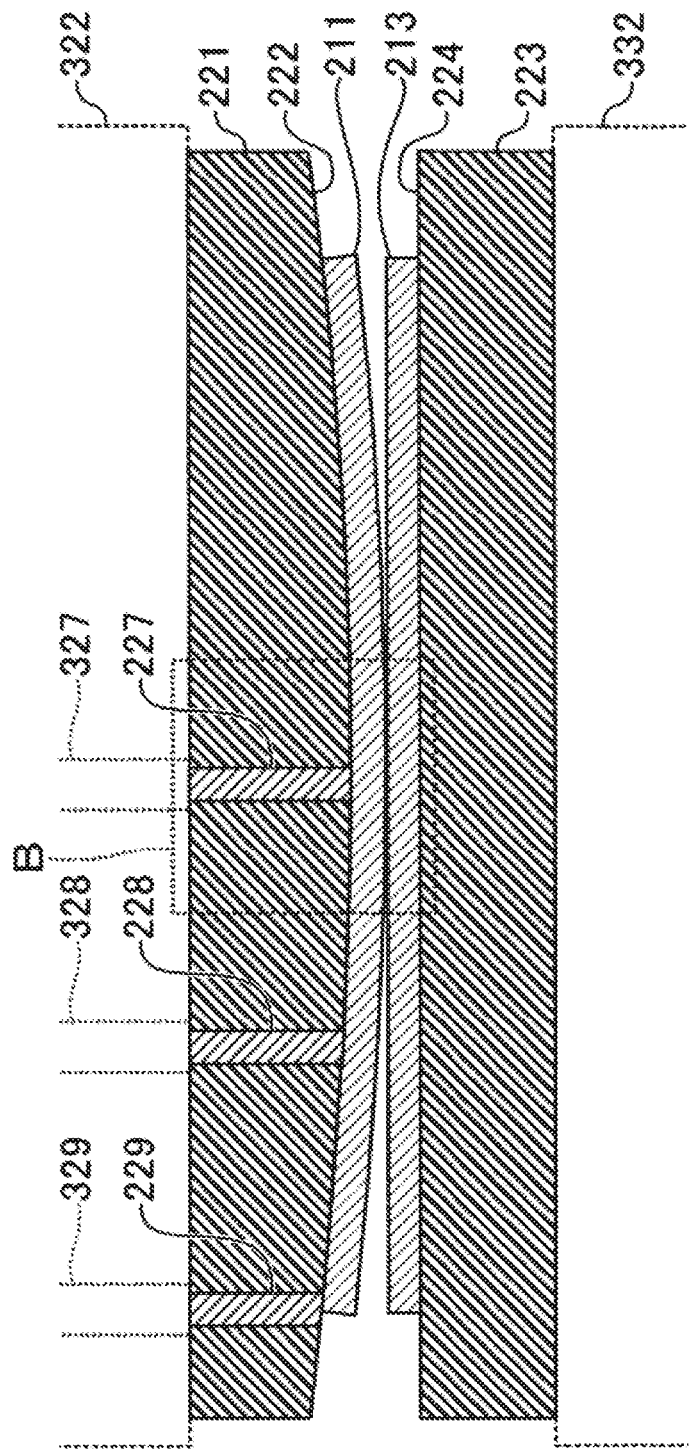
FIG. 12 is a schematic view showing the state of the substrates 211, 213 in the course of bonding.

FIG. 12 is a figure schematically showing how the substrates 211, 213 appear at Step S107 to Step S108 shown in FIG. 10. As illustrated, because the middle portion of the substrate 211 held by the upper stage 322 is raised, if the lower stage 332 approaches the upper stage 322, first, the middle portions of the substrates 211, 213 contact each other. Furthermore, by the control unit 150 continuing operation of the raising/lowering drive unit 338, the middle portions of the substrates 211, 213 contact each other, and a bonding starting point is formed between the substrates 211, 213.

At this time, the substrate 211 is still held by the curved holding surface 222 of the substrate holder 221. Accordingly, at the moment when the middle portion of the substrate 211 abuts against the flat substrate 213, circumferential portions of the substrate 211 are held by the substrate holder 221 and separated from the substrate 213. Stated differently, the substrate holder 221 keeps holding the substrate 211 such that portions of the substrates 211, 213 other than their middle portions do not contact other other.

Preferably, before the above-mentioned bonding starting point is formed, a temperature difference is generated by temperature control or the like to correct the substrates 211, 213. Thereby, a bonded substrate 230 in which the middle portions of the substrates 211, 213 are positionally less shifted can be manufactured.

Figure 13:
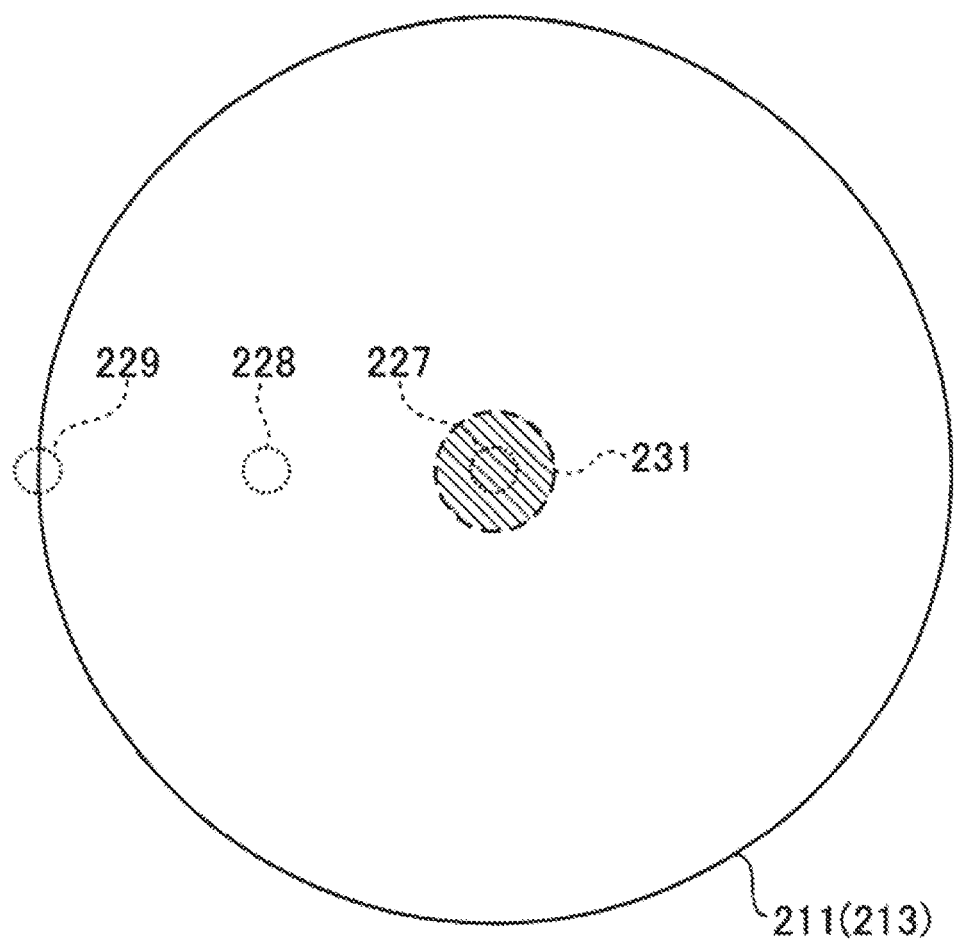
FIG. 13 is a schematic view showing the state of the substrates 211, 213 in the course of bonding.

FIG. 13 is a figure showing the state of the substrates 211, 213 in a period following Step S107 shown in FIG. 3. At Step S107, the substrates 211, 213 are pressed against each other at parts of their middle portions in the plane direction. Thereby, a bonding starting point 231 at which the substrates 211, 213 are partially bonded is formed near the middle portions of the substrates 211, 213. However, because, as has been explained with reference to FIG. 12, the substrate 211 is still held by the substrate holder 221, the substrates 211, 213 are not bonded yet in regions thereof away from their middle portions.

Figure 14:
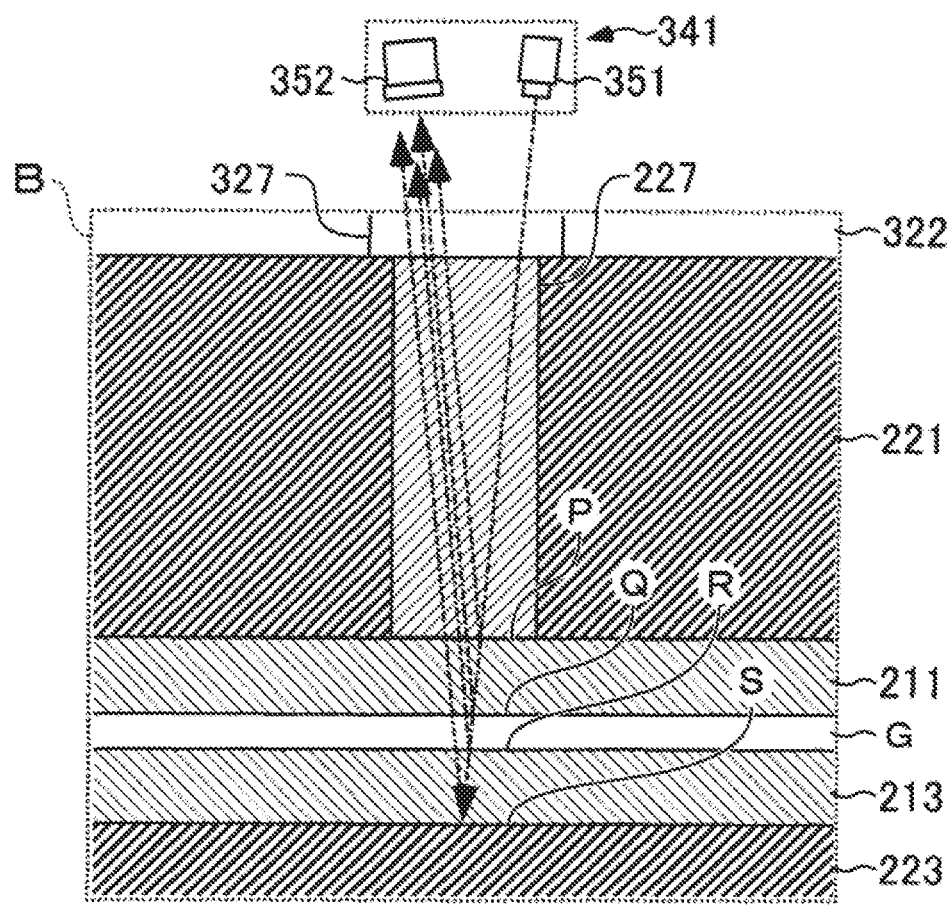
FIG. 14 is a schematic view for explaining operation of a detector 341.

FIG. 14 is a partially enlarged view showing the state of the substrates 211, 213 immediately before they contact each other during execution of Step S107 (please see FIG. 3). The region shown in FIG. 14 corresponds to the region indicated with the dotted line B in FIG. 12.

In the illustrated state, a gap G is left between the substrates 211, 213. The gap G is formed by the internal atmosphere of the bonding unit 300 or the like being sandwiched by the substrates 211, 213. The atmosphere or the like sandwiched by the substrates is expelled by the bonding unit 300 continuously pressing the substrates 211, 213 against each other, and eventually the substrates 211, 213 closely contact each other and are bonded together; however, lengths of time required for bonding of the substrates 211, 213 differ in some cases depending on the density of the atmosphere or the like.

In the bonding unit 300, parts of the substrates 211, 213 near their middle portions optically communicate with the detector 341 through the observation window 327 and observation hole 227 even in the state where the substrates 211, 213 are sandwiched by the upper stage 322 and the lower stage 332. In the illustrated example, the detector 341 has a light source 351 and a light-receiving unit 352.

The light source 351 generates irradiation light at a wavelength that can at least partially be transmitted through the substrate 211. Irradiation light generated by the light source 351 is radiated toward the substrate 211 through the observation window 327 and observation hole 227. The light-receiving unit 352 has a photoelectric conversion element such as a photodiode, and receives irradiation light reflected on the substrates 211, 213 or the like to generate an electric signal corresponding to the intensity of the reflected light. The electric signal generated by the light-receiving unit 352 is input to the control unit 150.

As indicated with alternate long and short dash lines in the figure, between the upper stage 322 and the lower stage 332, reflection surfaces are formed at boundaries between media with different refractive indices. In the illustrated example, reflection surfaces P, Q, R, S are formed at: the boundary between the observation hole 227 and the substrate 211; the boundary between the substrate 211 and the gap G; the boundary between the gap G and the substrate 213; and the boundary between the substrate 213 and the substrate holder 221, respectively. Accordingly, irradiation light radiated from the light source 351 of the detector 341 through the observation window 327 and observation hole 227 is reflected on each of the reflection surfaces P, Q, R, S, and the intensity of the reflected light is detected at the light-receiving unit 352 of the detector 341.

Figure 15:
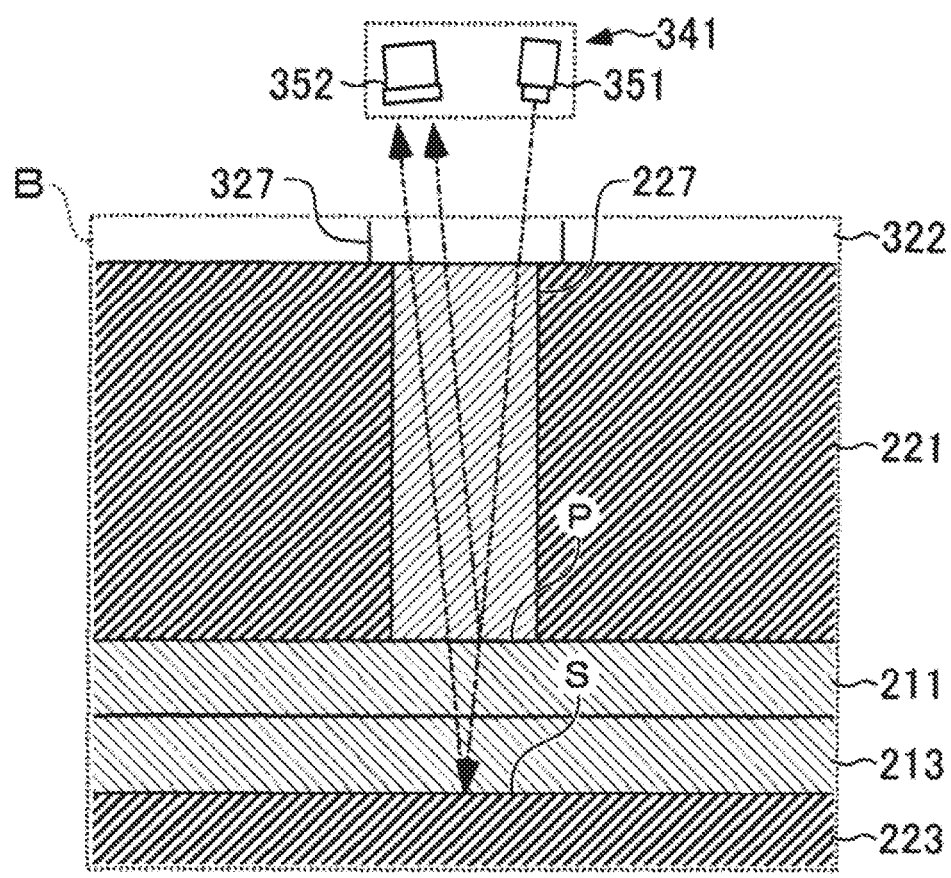
FIG. 15 is a schematic view for explaining operation of the detector 341.

FIG. 15 shows the state where the middle portions of the substrates 211, 213 are bonded after Step S107, from the point of view which is the same as that in FIG. 14. If the substrates 211, 213 are bonded and closely contact each other, a pair of the reflection surfaces R, Q formed between the substrates 211, 213 and the gap G disappears. Because of this, the number of reflection surfaces to reflect irradiation light from the detector 341 decreases, and the reflected light intensity detected by the detector 341 changes. That is, depending on the size of the gap G, the overall reflectance of light from the substrates 211, 213 changes, and for example the larger the size of the gap G is, the higher the reflectance is. The reflected light intensity is one piece of information about the state of enlargement of the contact regions, and such information may be the luminance (cd/m$^2$) of reflected light or may be the luminous intensity (lm·s) of reflected light. Accordingly, the control unit 150 having received an output of the detector 341 can determine that contacting portions of the substrates 211, 213, that is, the bonding starting point 231 is formed between the substrates 211, 213 if it detects that the reflected light intensity has become constant or that the rate of changes in the reflected light intensity has become lower than a predetermined value. That is, the control unit 150 determines that the contacting state of the contact regions is the state where the starting point 231 is formed. Accordingly, the control unit 150 can form a determining unit that determines whether or not the substrates 211, 213 have been bonded together.

Upon determining that the bonding starting point 231 has been formed, the control unit 150 may discontinue holding of the substrate 211 (Step S109 in FIG. 3). With this series of control, the bonding starting point 231 is surely formed between the substrates 211, 213 and holding of the substrate 211 can be discontinued without wasteful waiting time is spent after the bonding starting point 231 is formed. Accordingly, in manufacturing of the bonded substrates 230, the yield is improved and the throughput is also increased.

In FIG. 14 and FIG. 15, irradiation light is illustrated as if it is radiated at an angle relative to the substrates 211, 213, for the purpose of facilitating distinction between the irradiation light and reflected light in the figures. But even if irradiation light is radiated vertically to the substrates 211, 213, an optical system to detect the reflected light intensity can be formed by using an optical device such as a half mirror. In addition, the detector 341 may also use an image sensor such as a CCD or a CMOS sensor, instead of the light-receiving unit 352. In addition, the above-mentioned structure of the detector 341 can also be applied to the other detectors 342, 343 shown in FIG. 6 or other figures.

Figure 16:
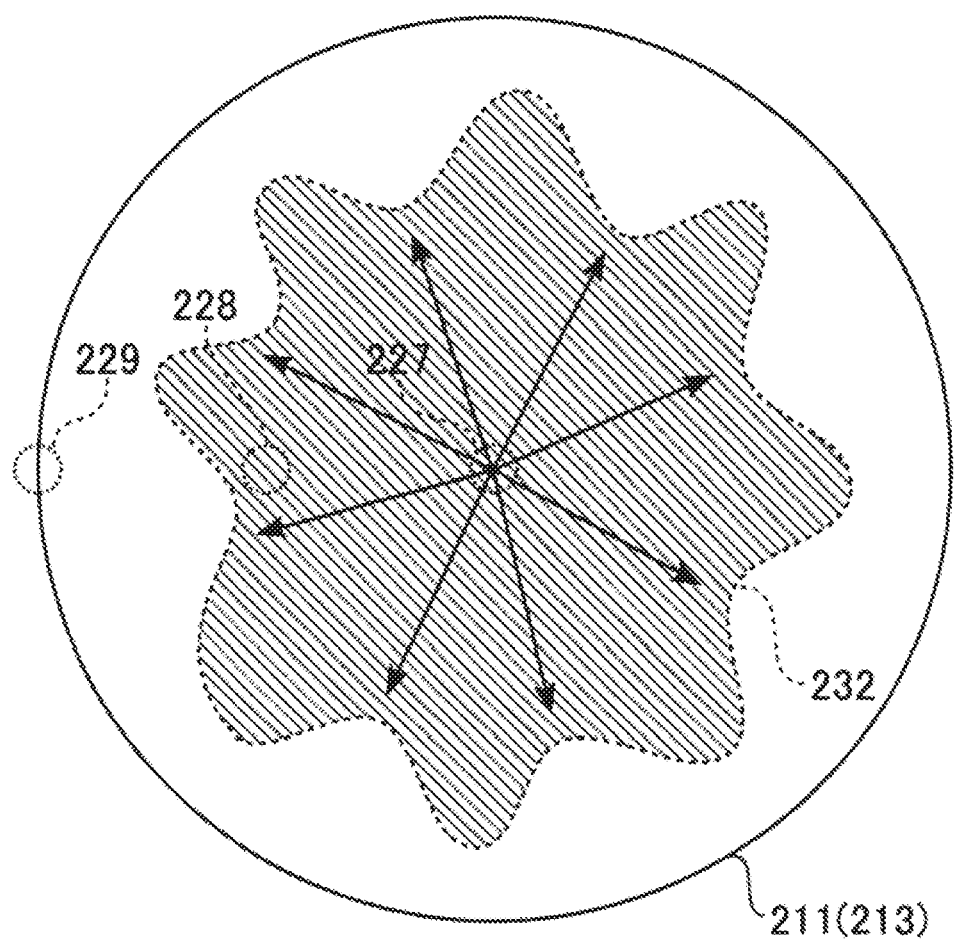
FIG. 16 is a schematic view showing the state of the substrates 211, 213 in the course of bonding.
Figure 17:
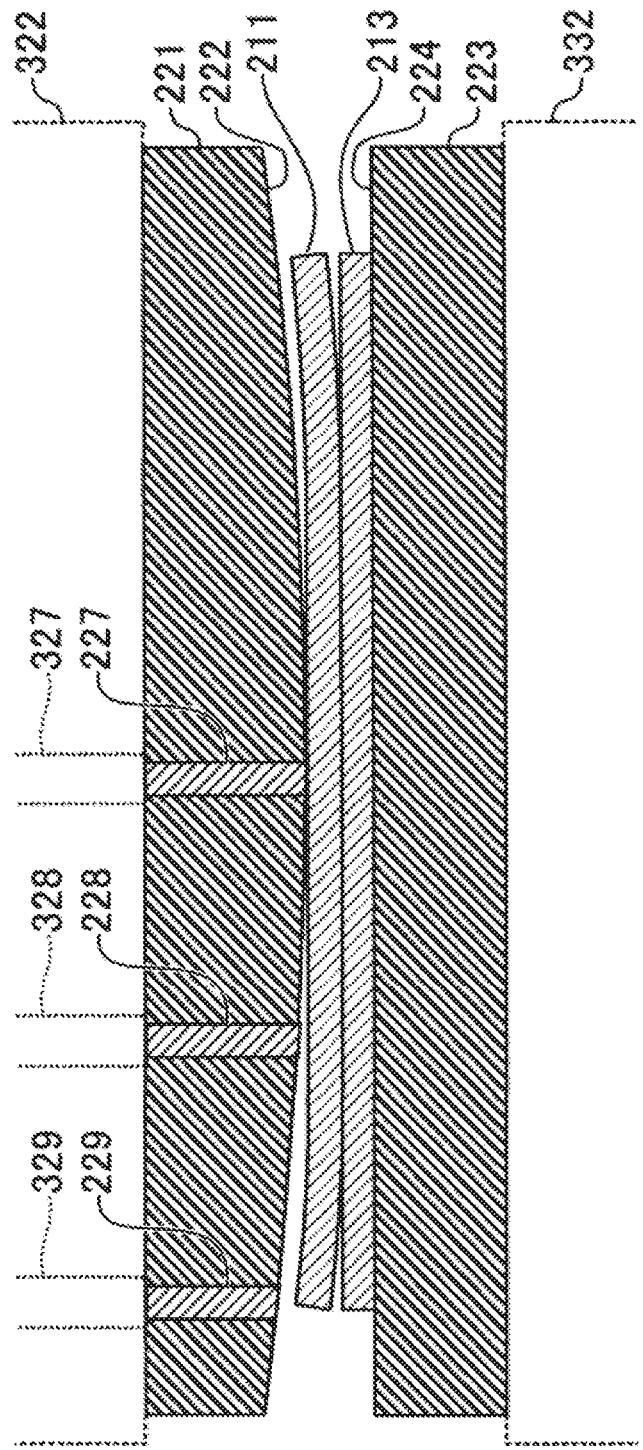
FIG. 17 is a schematic view showing the state of the substrates 211, 213 in the course of bonding.

FIG. 16 is a schematic plan view showing the state of the substrates 211, 213 during a period following Step S109 (please see FIG. 3). In addition, FIG. 17 is a schematic longitudinal sectional view of the substrates 211, 213 in the state shown in FIG. 16.

At Step S109, holding by the substrate holder 221 held by the upper stage 322 is discontinued, and the substrate 211 is released. Because a front surface(s) of at least one of the substrates 211, 213 is activated, a part thereof closely contact to form a bonding starting point, and if one of the substrates 211, 213 is released from holding by the substrate holder 221 or 223, adjacent regions are autonomously adsorbed to each other and bonded together due to intermolecular force between the substrates 211, 213. The contact regions of the substrates 211, 213 sequentially expand to adjacent regions along with the passage of time.

Thereby, a bonding wave 232, which is the boundary between contact regions which are regions where the substrates 211, 213 are bonded together and non-contact regions which are regions where they are not bonded together yet, moves in each radial direction from inner portions of the substrates 211, 213 to their outer portions, and bonding of the substrates 211, 213 progresses. That is, along with movement of the bonding wave, the contact regions enlarge. However, in a region outside the region surrounded by the bonding wave 232, the substrates 211, 213 are not bonded together yet.

Here, as has been explained already, the substrate holder 221 held by the upper stage 322 of the bonding unit 300 also has the observation hole 228 at the intermediate position between the center of the substrate 211 that it holds and its circumference. In addition, the upper stage of the bonding unit 300 has the observation window 328 and detector 342 at positions corresponding to the position of the observation hole 228 when the substrate holder 221 is being held by the upper stage.

Accordingly, if the substrates 211, 213 are bonded together in the bonding unit 300, it can be determined, also at the position of the observation hole 228, whether or not the substrates 211, 213 are bonded together. The same structure as that of the detector 341 disposed at the central portions of the substrates 211, 213 can be used for the detector 342, but this is not the sole example.

If, after it is detected at Step S108 that the bonding starting point 231 is formed between the centers of the substrates 211, 213, bonding of the substrates 211, 213 is detected through the observation hole 228, as Step S110, the control unit 150 can determine that the contact regions of the substrates 211, 213 have enlarged to the intermediate portion between the centers of the substrates 211, 213 and their circumference (Step S110: YES). That is, it is determined that the bonding wave has reached an intermediate position which is a predetermined position. The position of the bonding wave is one piece of information about the state of enlargement of the contact regions. Thereby, the control unit 150 can proceed to Step S112 of the control procedure.

Furthermore, the substrate holder 221 also has the observation hole 229 at the circumference of the substrate 211 that it holds. In addition, the upper stage of the bonding unit 300 has the observation window 329 and detector 343 at positions corresponding to the position of the observation hole 229 when the substrate holder 221 is being held by the upper stage.

Accordingly, if the substrates 211, 213 are bonded together in the bonding unit 300, it can be determined, also at the position of the observation hole 229, whether or not the substrates 211, 213 are bonded together.

In the state shown in FIG. 16 and FIG. 17, the substrates 211, 213 are bonded together at the position of the observation hole 228, but are not bonded together yet at the position of the observation hole 229. Accordingly, the control unit 150 can determine that although the bonding wave 232 has been enlarging, and bonding of the substrates 211, 213 is progressing, the entire substrates 211, 213 have not been bonded together yet.

Figure 18:
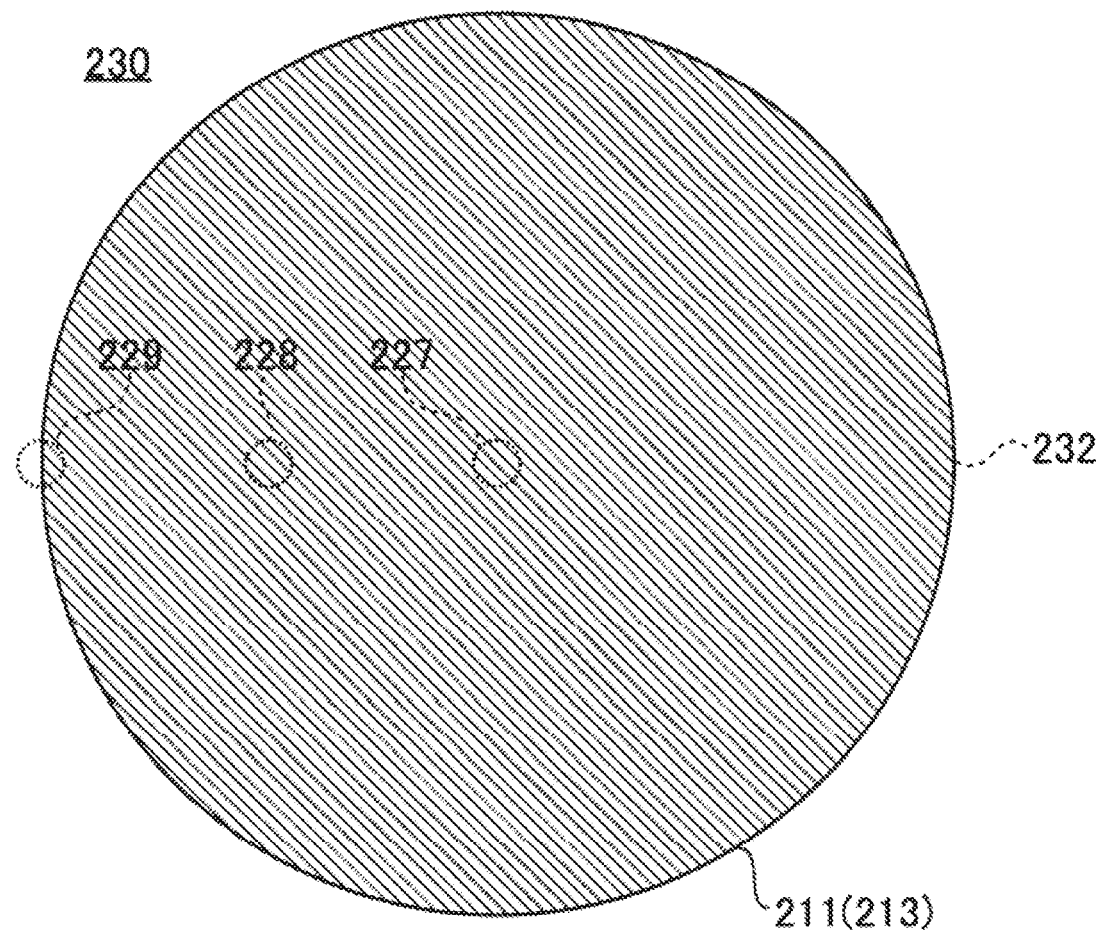
FIG. 18 is a schematic view showing the state of the substrates 211, 213 in the course of bonding.
Figure 19:
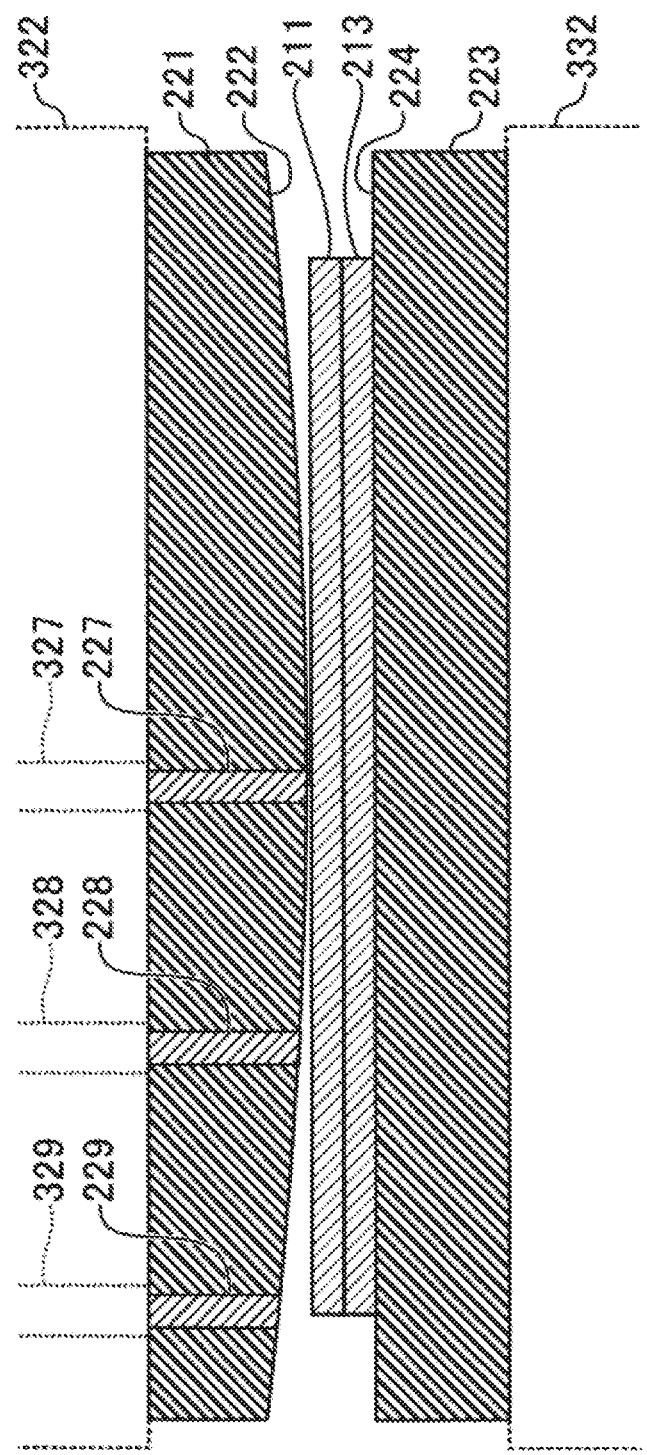
FIG. 19 is a schematic view showing the state of the substrates 211, 213 in the course of bonding.

FIG. 18 is a schematic plan view showing the state of the substrates 211, 213 at the moment when the control unit 150 determines at Step S112 (please see FIG. 3) that bonding of the substrates 211, 213 has been completed (Step S112: YES). In addition, FIG. 19 is a schematic longitudinal sectional view of the substrates 211, 213 in the state shown in FIG. 18.

At Step S110, the control unit 150 confirmed that bonding of the substrates 211, 213 is progressing, through the observation hole 228, observation window 328 and detector 342. If bonding of the substrates 211, 213 proceeds further and the bonding wave 232 reaches the circumference of the substrates 211, 213, the contact regions spread to the entire substrates 211, 213. Thereby, the substrates 211, 213 are bonded together to form the bonded substrate 230.

As has been explained already, the substrate holder 221 held by the upper stage 322 of the bonding unit 300 also has the observation hole 229 at a position of the circumference of the substrate 211 that it holds. In addition, the upper stage of the bonding unit 300 has the observation window 329 and detector 343 at positions corresponding to the position of the observation hole 229 when the substrate holder 221 is being held by the upper stage.

Accordingly, if the substrates 211, 213 are bonded together in the bonding unit 300, it can be determined, also at the position of the observation hole 229, whether or not the substrates 211, 213 are bonded together.

In the bonding unit 300, after enlargement of the contact regions of the substrates 211, 213 that are surrounded by the bonding wave 232 which is the boundary between the contact regions and the non-contact regions is detected at Step S110 (Step S110: YES), it can be detected through the observation hole 229 whether or not the bonding wave has reached the outer edges of the substrates 211, 213, that is, whether or not the bonding is completed (Step S112). The same structure as that of the detector 341 disposed at the central portions of the substrates 211, 213 can be used for the detector 342, but this is not the sole example. In particular, the circumferential portions of the substrates 211, 213 are exposed to the outside even after the substrates 211, 213 are bonded together. Accordingly, the detector 343 to detect bonding at the circumferential portions of the substrates 211, 213 can also have a structure different from those of the other detectors 341, 342.

In this manner in the bonding unit 300, enlargement of the contact regions of the substrates 211, 213 progresses from the middle portions of the substrates 211, 213 toward their outer edges. Because of this, the atmosphere that was sandwiched between the substrates 211, 213 at the stage before bonding, for example, the atmospheric air, is expelled from inner portions of the substrates 211, 213 toward their outer portions in the course of expansion of the area of the contact regions of the substrates 211, 213, and it is possible to prevent bubbles from being left between the bonded substrates 211, 213.

In order to expel bubbles or the like from between the substrates 211, 213 smoothly in the course of placing the substrates 211, 213 one upon another, preferably, at the moment when the substrates 211, 213 start contacting each other, there is a sufficient space between the substrates 211, 213 that does inhibit movement of bubbles, and a continuous clearance is formed at the circumference of the substrates 211, 213. Accordingly, a procedure for deformation of the substrate 211 by adsorption to the substrate holder 221 with the curved holding surface 222 is preferably selected such that a certain degree of curvature remains in the stage of causing the substrate 211 to contact the substrate 213 at Step S107 (FIG. 3). In addition, if it is predicted that the degree of the curvature of the substrate 211 lowers at the stage of placing the substrates 211, 213 one upon another, a substrate holder 223 with a curved holding surface 224 like the substrate holder 221 may also be used as the substrate holder 223 to hold the substrate 213 held by the lower stage 332, for the purpose of ensuring a gap for passage of bubbles.

In addition, in the above-mentioned example, holding of the substrate 211 held by the upper stage 322 is discontinued at Step S109. But at the step, holding by the lower stage 332 may be discontinued, or holding of the substrates 211, 213 may be discontinued at both the stages.

However, the substrate 211 holding of which has been discontinued is inevitably subjected also to discontinuation of correction of distortion due to adsorption by the substrate holder 221. Accordingly, if holding of a substrate is to be discontinued at Step S109, holding of one of the substrates 211, 213 that is relatively less deformed and whose correction amount is smaller is preferably discontinued.

Figure 20:
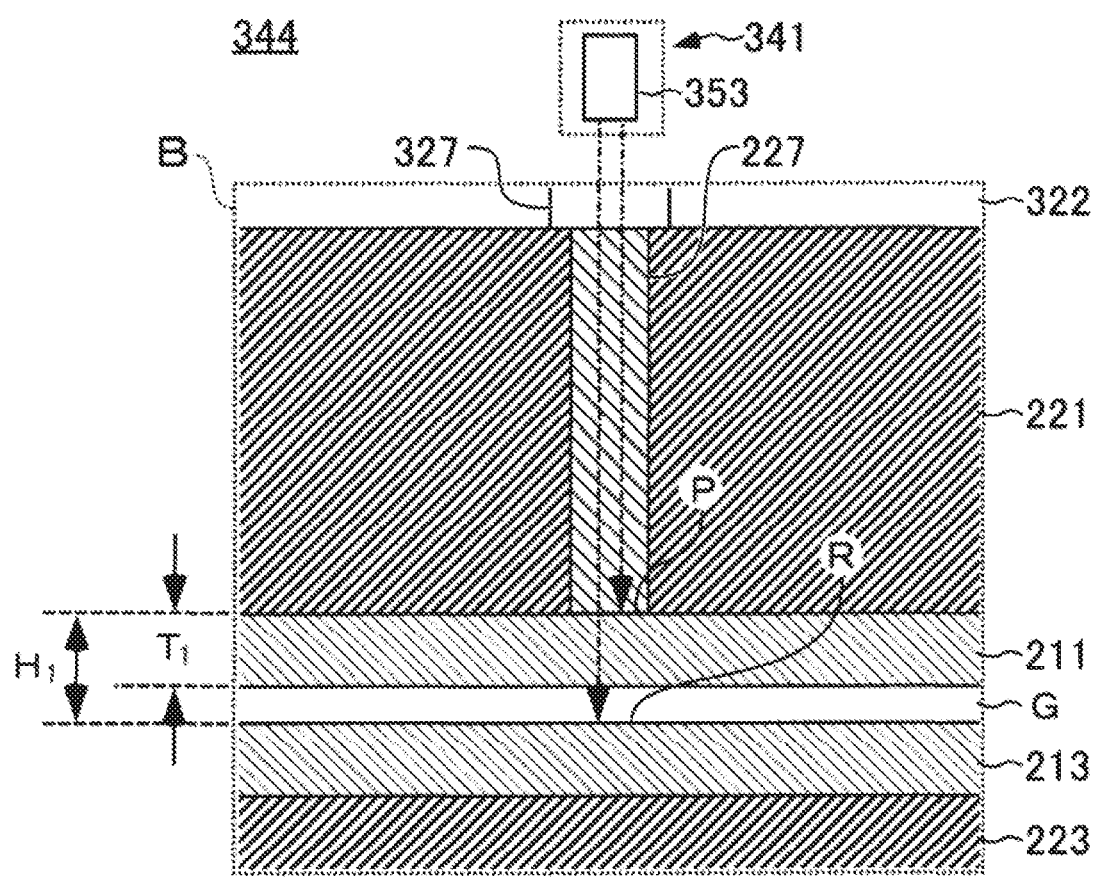
FIG. 20 is a schematic view for explaining another structure of the detector 341.

FIG. 20 is a schematic view showing an example of another structure of the detector 341 in the bonding unit 300. FIG. 20 is depicted from the point of view which is the same as those in FIG. 14 and FIG. 15.

In the bonding unit 300, the illustrated detector 341 has a displacement gauge 353. The displacement gauge 353 has a relative position fixed to the upper stage 322, and detects displacement of the substrates 211, 213 or the like as a measurement target object based on changes in optical characteristics. Various types of gauges can be used as the optical displacement gauge 353, and examples thereof include triangulation-type gauges, laser focus-type gauges, spectral interference-type gauges or the like.

The illustrated detector 341 brings the substrate 211, which is located on the upper side in the figure, and the substrate 213, which is located on the lower side in the figure, close to each other at Step S107 (please see FIG. 3) while continuously measuring the relative interval $H_1$ between the upper surface of the substrate 211 and the upper surface of the substrate 213, and eventually press them against each other. In the course of these processes, if the value of the interval $H_1$ becomes equal to the known thickness $T_1$ of the upper substrate 211, it is detected that the substrates 211, 213 are in contact with each other and bonded together with no clearance therebetween. In this manner, by using the displacement gauge 353 as the detector 341, the control unit 150 can continuously observe bonding of the substrates 211, 213 and reflect a result of the observation in the control of the bonding unit 300. The value of the interval $H_1$ is one piece of information about the state of enlargement of the contact regions.

Figure 21:
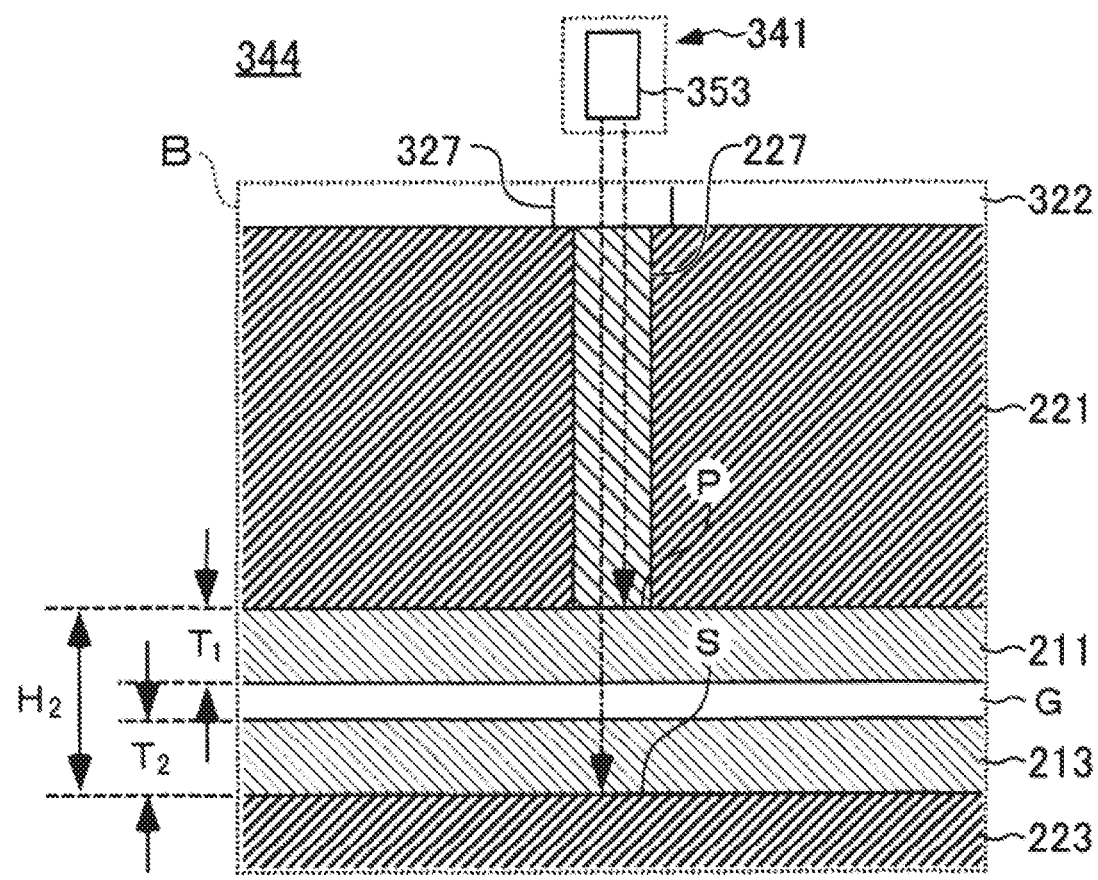
FIG. 21 is a schematic view for explaining operation of the detector 341.

FIG. 21 shows the same structure as that of the bonding unit 300 shown in FIG. 20, but a target of measurement by the displacement gauge 353 as the detector 341 is different. In the illustrated bonding unit 300, the displacement gauge 353 measures the interval $H_2$ between the position of the upper surface of the substrate 211 on the upper side in the figure and the position of the lower surface of the substrate 213 on the lower side in the figure or position of the upper surface of the substrate holder 221 on the lower side in the figure. Then, at Step S107 (please see FIG. 3), the substrates 211, 213 are brought close to each other and eventually pressed against each other. In the course of these processes, if the value of the interval $H_2$ becomes equal to the total of the known thickness $T_1$ of the substrate 211 and the known thickness $T_2$ of the substrate 213, it can be detected that the substrates 211, 213 are brought into contact with each other and bonded together with no clearance therebetween.

Figure 22:
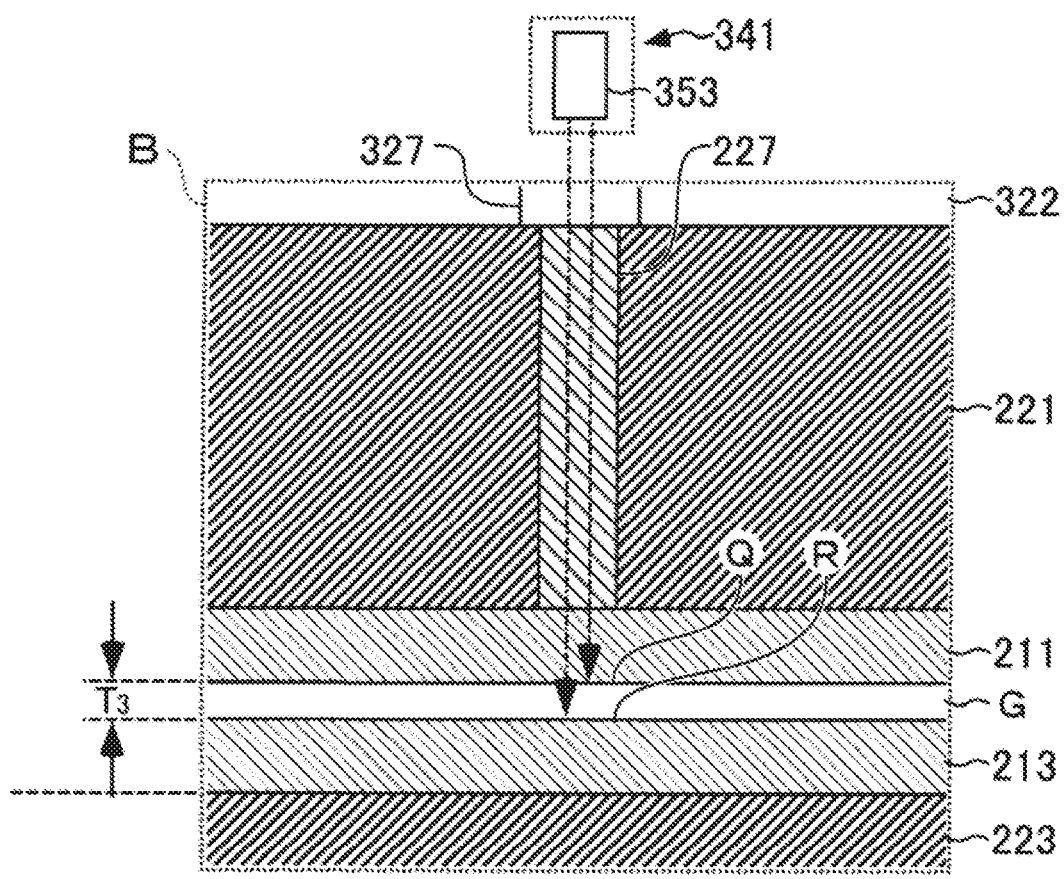
FIG. 22 is a schematic view for explaining operation of the detector 341.

FIG. 22 shows the same structure as that of the bonding unit 300 shown in FIG. 20 and FIG. 21, but a target of measurement by the displacement gauge 353 as the detector 341 is different. In the illustrated bonding unit 300, the displacement gauge 353 measures the thickness $T_3$ of the gap G between the substrate 211 on the upper side in the figure and the substrate 213 on the lower side in the figure based on the position of the lower surface of the substrate 211 and the position of the upper surface of the substrate 213. Then, at Step S107 (please see FIG. 3), the substrates 211, 213 are brought close to each other and eventually pressed against each other. In the course of these processes, if the value of the thickness $T_3$ became zero, it can be detected that the substrates 211, 213 are brought into contact with each other and bonded together with no clearance therebetween.

Like the detectors 341, 342, 343, displacement gauges 353 may be arranged respectively at central portions, intermediate portions and circumferential portions of the substrates 211, 213 to detect the position of the boundary of the contact regions at each position. In this case, the control unit 150 determines that formation of the starting point 231 is completed if it detects contact at the central portions, and determines that bonding is completed if it detects contact at the circumferential portions.

As shown in FIG. 20, FIG. 21 and FIG. 22, there are a plurality of targets of measurement by the displacement gauge 353 as the detector 341 at the observing unit 344. Accordingly, the detection accuracy of the detector 341 may be improved by measuring, in parallel, two selected ones among a plurality of detection targets, for example, the detection targets shown in FIG. 20, FIG. 21 and FIG. 22.

In addition, although in the above-mentioned example explained, an optical displacement gauge is used, there are multiple types of known displacement gauges that use other schemes such as eddy current-type gauges, ultrasonic wave-type gauges or contact-type gauges. Naturally, displacement gauges using schemes other than these schemes may also be used. In addition, displacement gauges using different schemes may be mixed into the plurality of detectors 341, 342, 343 forming the observing unit 344. In addition, a displacement amount of the upper surface of the substrate 213, that is, a distance between the upper surface of substrate 213 and the holding surface of the substrate holder 223 while enlargement of the contact regions is progressing relative to the state where the upper substrate 213 is being held by the substrate holder 223 may be measured by the displacement gauge 353. The value of this distance is one piece of information about the state of enlargement of the contact regions. In this case, the control unit 150 may determine that bonding is completed when displacement of the upper surface of the substrate 213 became 0 and the displacement amount became constant, or when the change amount became smaller than a predetermined value.

Figure 23:
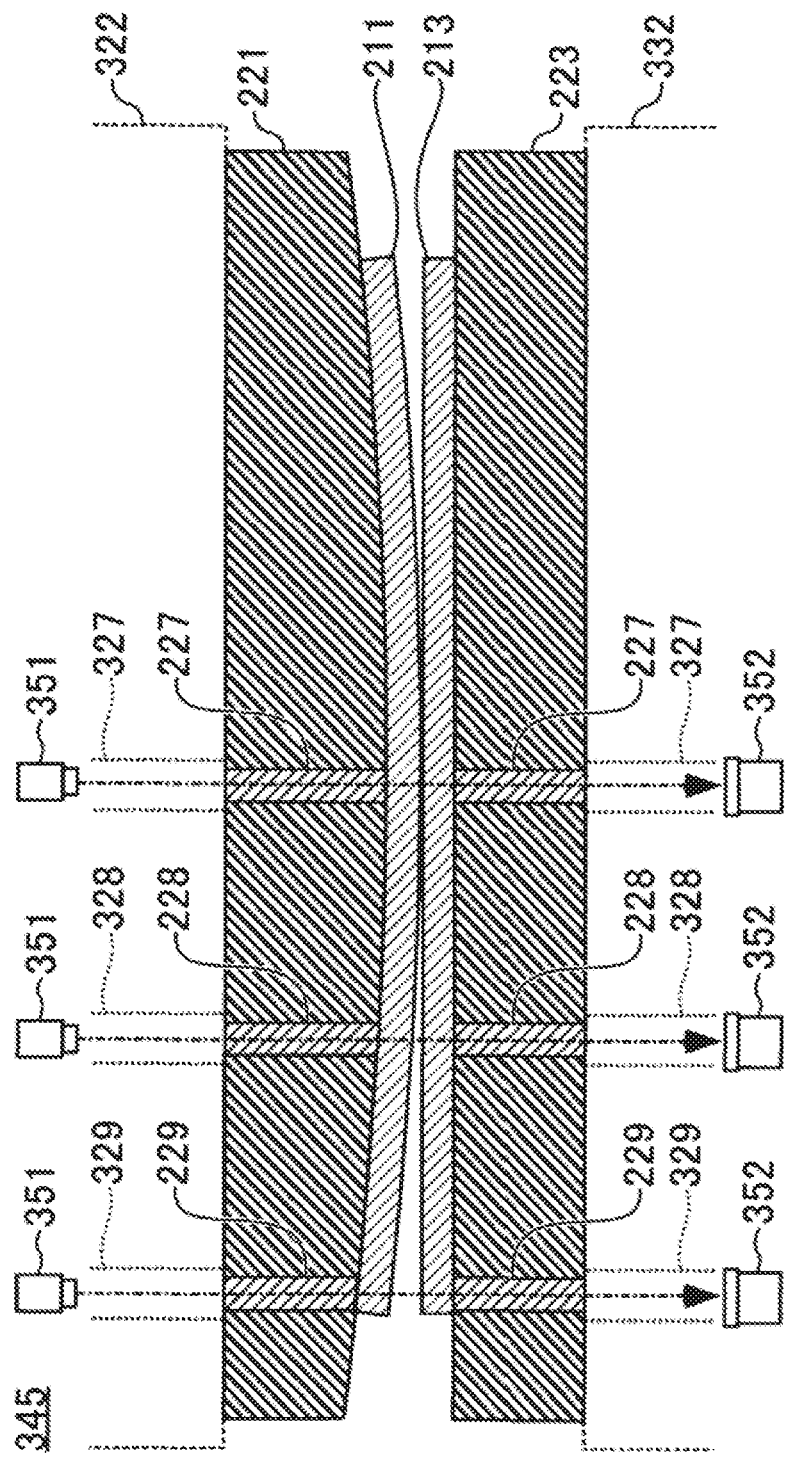
FIG. 23 is a schematic view for explaining the structure of an observing unit 345.

FIG. 23 is a schematic view of an observing unit 345 having another structure. In the bonding unit 300 having the observing unit 345, similar to the observing unit 344 shown up to FIG. 22, the observation windows 327, 328, 329 are provided to the upper stage 322, and the observation holes 227, 228, 229 are provided to the substrate holder 221 held by the upper stage.

Furthermore, in the bonding unit 300 having the observing unit 345, the observation windows 327, 328, 329 are provided also to the lower stage 332. In addition, the observation holes 227, 228, 229 are provided also to the flat substrate holder 223 held by the lower stage 332.

Still furthermore, in the observing unit 345, the light source 351 irradiates the substrates 211, 213 with irradiation light through the observation windows 327, 328, 329 of the upper stage 322 and the observation holes 227, 228, 229 of the substrate holder 221 on the upper side in the figure; on the other hand, the light-receiving unit 352 receives the irradiation light through the observation windows 327, 328, 329 of the lower stage 332 and the observation holes 227, 228, 229 of the substrate holder 223 on the lower side in the figure. With such a structure, the light-receiving unit 352 may observe the state of bonding of the substrates 211, 213 based on the light amount of the irradiation light that is transmitted through the substrates 211, 213. The light amount of the irradiation light is one piece of information about the state of enlargement of the contact regions. By preliminarily experimentally determining a light amount that is observed when formation of the starting point 231 is completed and a light amount that is observed when bonding is completed, the control unit 150 determines that formation of the starting point 231 is completed and bonding is completed based on that an amount detected by the observing unit 345 became the preliminarily determined values.

In the examples shown in FIG. 4 to FIG. 23, the speed of progress of the bonding wave, that is, the speed of enlargement of the contact regions may be predicted and the moment when bonding will be completed may be predicted based on a length of time from when the detector 341 detects completion of starting point formation until when the detector 342 detects the boundary of the contact regions or a length of time from when the detector 342 detects the boundary until when the detector 343 detects the boundary.

In addition, although in an example shown, the three detectors 341, 342, 343 are arranged at central portions, intermediate portions and circumferential portions of the substrates 211, 213, instead of this or in addition to this, a plurality of detectors may be arranged such that the circumference of a substrate among the two substrates 211, 213 which is fixed and is not released from a stage at the time of bonding can be observed. In this case, it is determined that bonding is completed when circumferential portions of a released substrate are detected by all of the plurality of detectors. In addition, the situation of progress of the bonding wave can be known based on timing at which the circumferential portions of a substrate are detected by the plurality of detectors. That is, if timing of detection by one detector is different from timing of detection by other detectors, it can be known that the progress of the bonding wave is slow at a region including a circumferential portion, detection timing of which is late. In this case, the control unit 150 gives an apparatus feedback, instructing to speed up the progress of the region where the progress of the bonding wave is slow.

Figure 24:
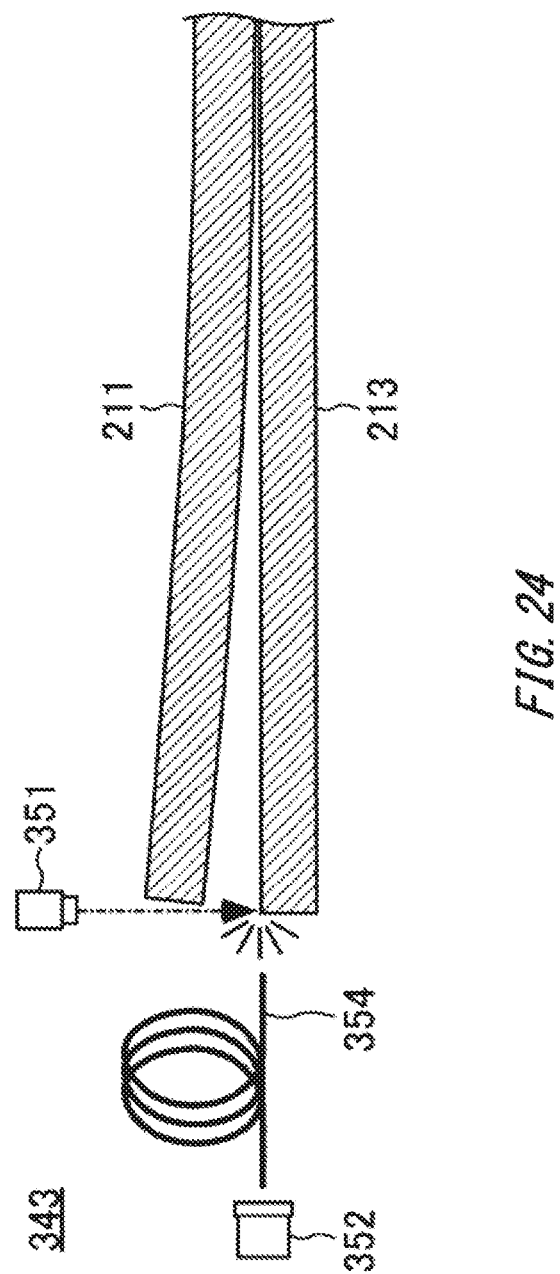
FIG. 24 is a schematic view for explaining another structure of a detector 343.

FIG. 24 is a schematic view showing another structure of the detector 343 in the bonding unit 300. As has been explained already, circumferential portions of the substrates 211, 213 are exposed to the outside even after the substrates 211, 213 are bonded together. Accordingly, the detector 343 to detect bonding at the circumferential portions of the substrates 211, 213 can also have a structure different from those of the other detectors 341, 342.

The illustrated detector 343 has the light source 351, the light-receiving unit 352 and an optical fiber 354. The light source 351 radiates irradiation light toward circumferential end portions of the substrates 211, 213 through the observation window 329 and observation hole 229. The optical fiber 354 has one end disposed near an end portion of the substrate 213 held by the lower stage 332. Thereby, the optical fiber 354 receives irradiation light scattered by a circumferential end portion of the substrate 213.

The other end of the optical fiber 354 is disposed to face the light-receiving unit 352. Thereby, irradiation light having entered the optical fiber 354 enters the light-receiving unit 352. Upon receiving the irradiation light, the light-receiving unit 352 generates an electric signal and inputs it to the control unit 150. The electric signal input from the light-receiving unit 352 to the control unit 150 is one piece of information about the state of enlargement of the contact regions.

Figure 25:
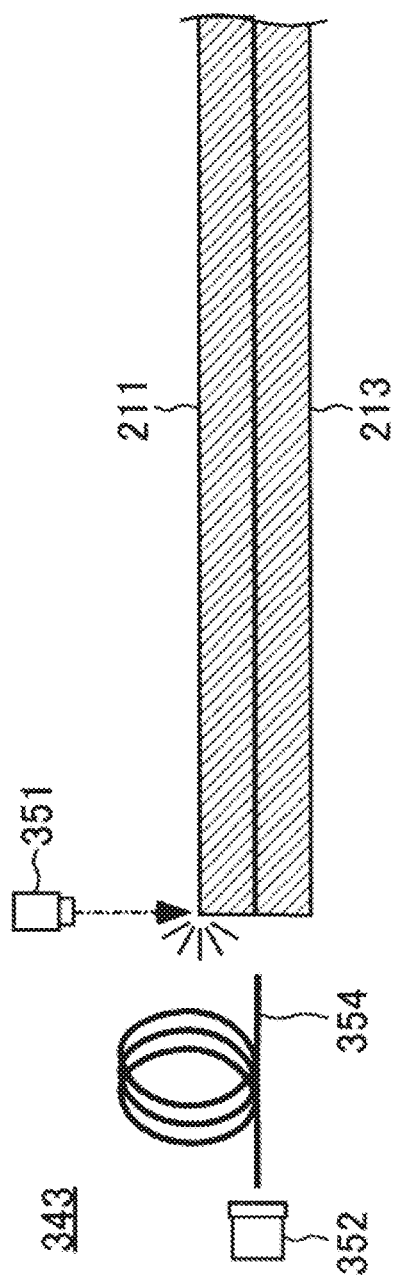
FIG. 25 is a schematic view for explaining operation of the detector 343.

FIG. 25 is a schematic view for explaining operation of the detector 343 shown in FIG. 24. If the substrates 211, 213 are bonded together up to their circumferential end portions in the bonding unit 300, irradiation light radiated by the light source 351 is radiated onto and scattered by the substrate 211, instead of the substrate 213. Because of this, the optical fiber 354 disposed laterally next to the substrate 213 no longer receives irradiation light. Thereby, because an electric signal input from the light-receiving unit 352 to the control unit 150 changes, the control unit 150 can determine that the substrate 211 is bonded to the substrate 213 up to their circumference.

Figure 26:
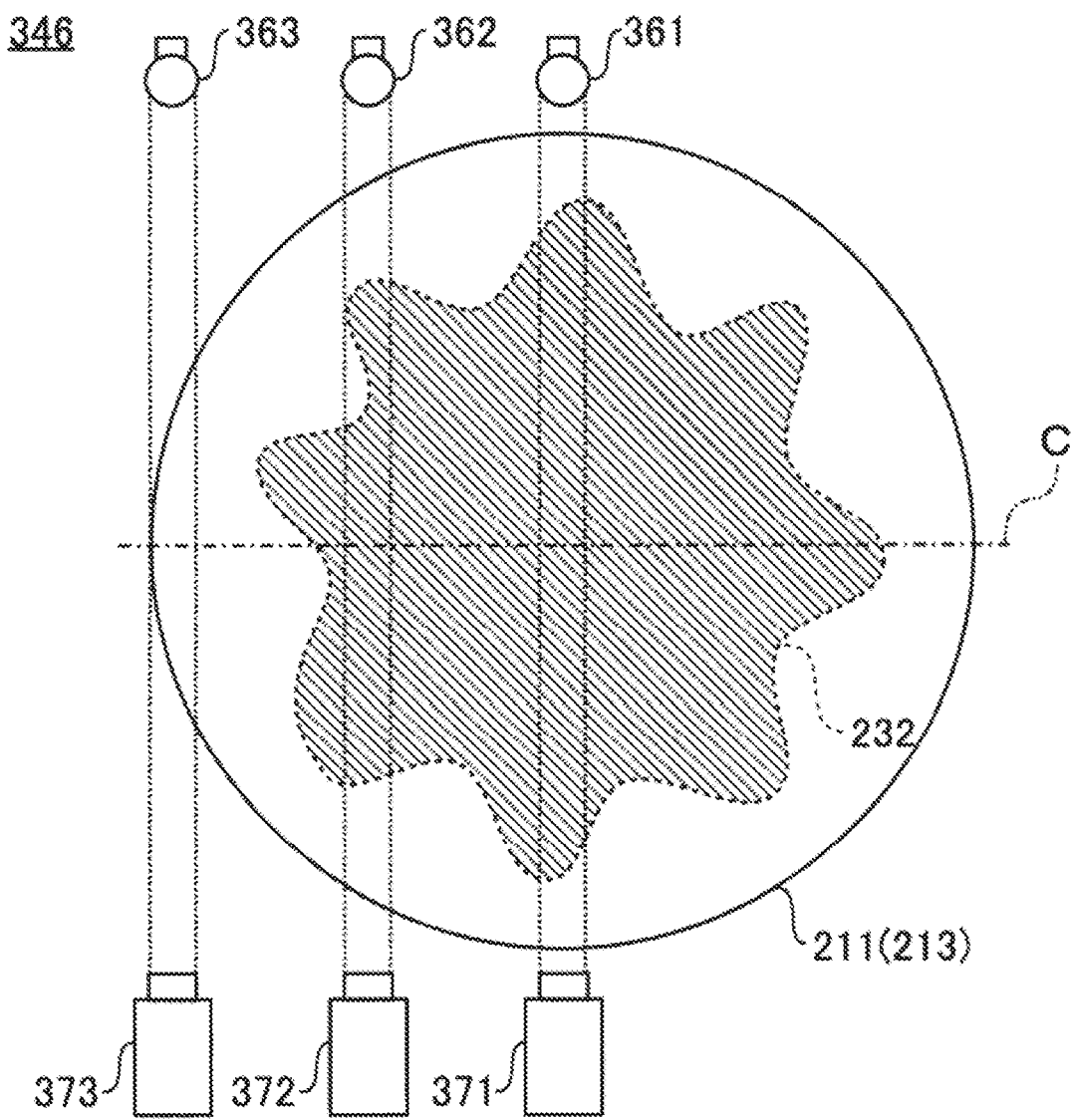
FIG. 26 is a schematic view for explaining the structure of an observing unit 346.

FIG. 26 is a schematic view of an observing unit 346 having still another structure. The observing unit 346 has a plurality of light sources 361, 362, 363 and a plurality of light-receiving units 371, 372, 373.

The light-receiving units 371, 372, 373 are disposed to face the light sources 361, 362, 363 with the substrates 211, 213 being sandwiched therebetween in the plane direction of the substrates 211, 213. One of the light-receiving units, the light-receiving unit 371, is disposed at a position at which it faces one of the light sources, the light source 361, with the centers of the substrates 211, 213 being sandwiched therebetween. Another one of the light-receiving units, the light-receiving unit 373, is disposed at a position where it faces another one of the light sources, the light source 363, with a region including the circumference of the substrates 211, 213 being sandwiched therebetween. Still another one of the light-receiving units, the light-receiving unit 372, is disposed at a position at which it faces the light source 362 disposed between the light sources 361, 362.

Figure 27:
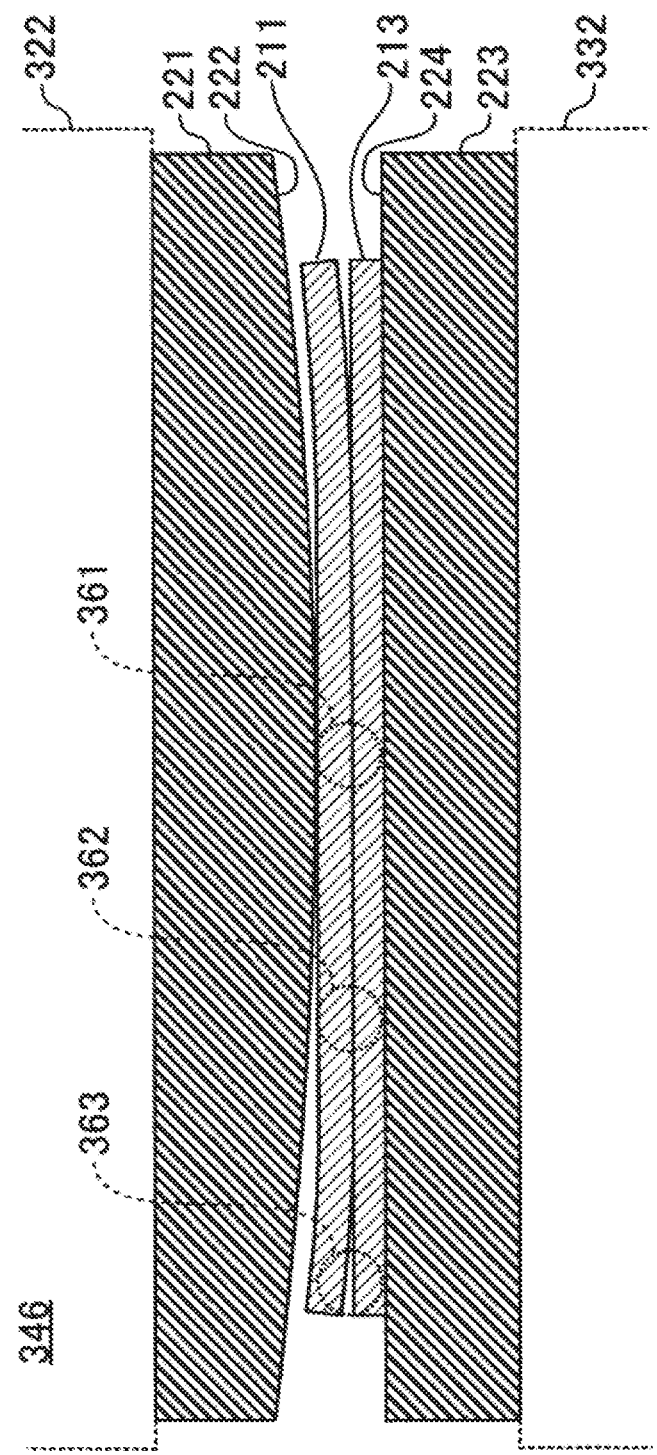
FIG. 27 is a schematic view for explaining operation of the observing unit 346.

FIG. 27 is a schematic view for explaining operation of the observing unit 346 shown in FIG. 26. FIG. 27 shows how the substrates 211, 213, which are being observed by the observing unit 346, appear from the side where the light-receiving unit 371, 372, 373 at lateral sides of the substrates 211, 213 in the plane direction are located.

The illustrated substrates 211, 213 are in the state shown in FIG. 17 where the upper substrate 211 is released from the upper stage 322 (Step S109 in FIG. 3) and bonding has already progressed. Because of this, when seen from the side on which the light-receiving units 371, 372 are located, the width of a luminous flux of irradiation light radiated by the light sources 361, 362 onto the substrates becomes thin by being blocked by the substrates 211, 213 bonded together. Accordingly, the light-receiving units 371, 372 input, to the control unit 150, electric signals corresponding to reception of small amounts of irradiation light. The electric signals input from the light-receiving units 371, 372 to the control unit 150 are one piece of information about the state of enlargement of the contact regions. By starting receiving light at the light-receiving unit 371 before the two substrates 211, 213 contact each other and detecting changes in the reception light amount, it may be determined that a starting point is formed when the rate of the changes became zero and the value of the light amount stayed constant until a predetermined length of time passes, or when the rate of the changes became lower than a predetermined value. Also about the light-receiving unit 372, it may be determined, by detecting changes in the reception light amount, that the bonding wave expanded from the bonding starting point 231 has reached an intermediate point between the centers of the substrates 211, 213 and their circumferential portions when the rate of the changes became zero and the value of the light amount stayed constant until a predetermined length of time passes or when the rate of the changes has become lower than a predetermined value.

In contrast to this, in the illustrated state, the circumference of the substrates 211, 213 is not bonded yet. Because of this, light radiated by the light source 363 onto the substrates 211, 213 passes through between the substrates 211, 213 and received by the light-receiving unit 372 at a wide luminous flux width. Accordingly, the light-receiving units 371, 372 input, to the control unit 150, electric signals corresponding to reception of strong irradiation light.

In this manner, the observing unit 346 can detect that the bonding starting point 231 is formed between the centers of the substrates 211, 213 based on an output from the light-receiving unit 371. In addition, the observing unit 346 can detect that bonding of the substrates 211, 213 is expanding from the centers toward their circumference based on an output from the light-receiving unit 372. Furthermore, the observing unit 346 can determine that bonding of the substrates 211, 213 is completed up to their circumferential portions if it detects, based on an output from the light-receiving unit 373, that the rate of the changes became zero and the value of the light amount stayed constant until a predetermined length of time passes or that the rate of the changes became lower than a predetermined value.

Front surfaces of the substrates 211, 213 are not necessarily flat due to the circuit regions 216 or the like. In addition, the substrates 211, 213 themselves are deformed (e.g., warped) due to a process of forming the circuit regions 216, in some cases. Furthermore, in the bonding unit 300, the substrates 211, 213 to be bonded are deformed to correct the magnifications, distortion or the like of the substrates 211, 213, in some cases. Because of this, between the substrates 211, 213, a gap where light can advance linearly from the light sources 361, 362, 363 to the light-receiving unit 371, 372, 373 is not formed in some cases.

But if a gap between the substrates 211, 213 is continuous from the light sources 361, 362, 363 to the light-receiving units 371, 372, 373, a part of irradiation light reaches the light-receiving units 371, 372, 373. Accordingly, even if a gap between the substrates 211, 213 is not the one in which sightlines from the light-receiving units 371, 372, 373 to the light sources 361, 362, 363 can be ensured, the observing unit 346 can detect whether or not the substrates 211, 213 are bonded together.

In addition, irradiation light generated by the light source 351, 361, 362, 363 at the observing units 344, 345, 346 or the like may be modulated at a predetermined frequency, and the irradiation light may be lock-in detected at the light-receiving units 352, 371, 372, 373. Thereby, faint irradiation light can be detected accurately excluding influence of background light.

Figure 28:
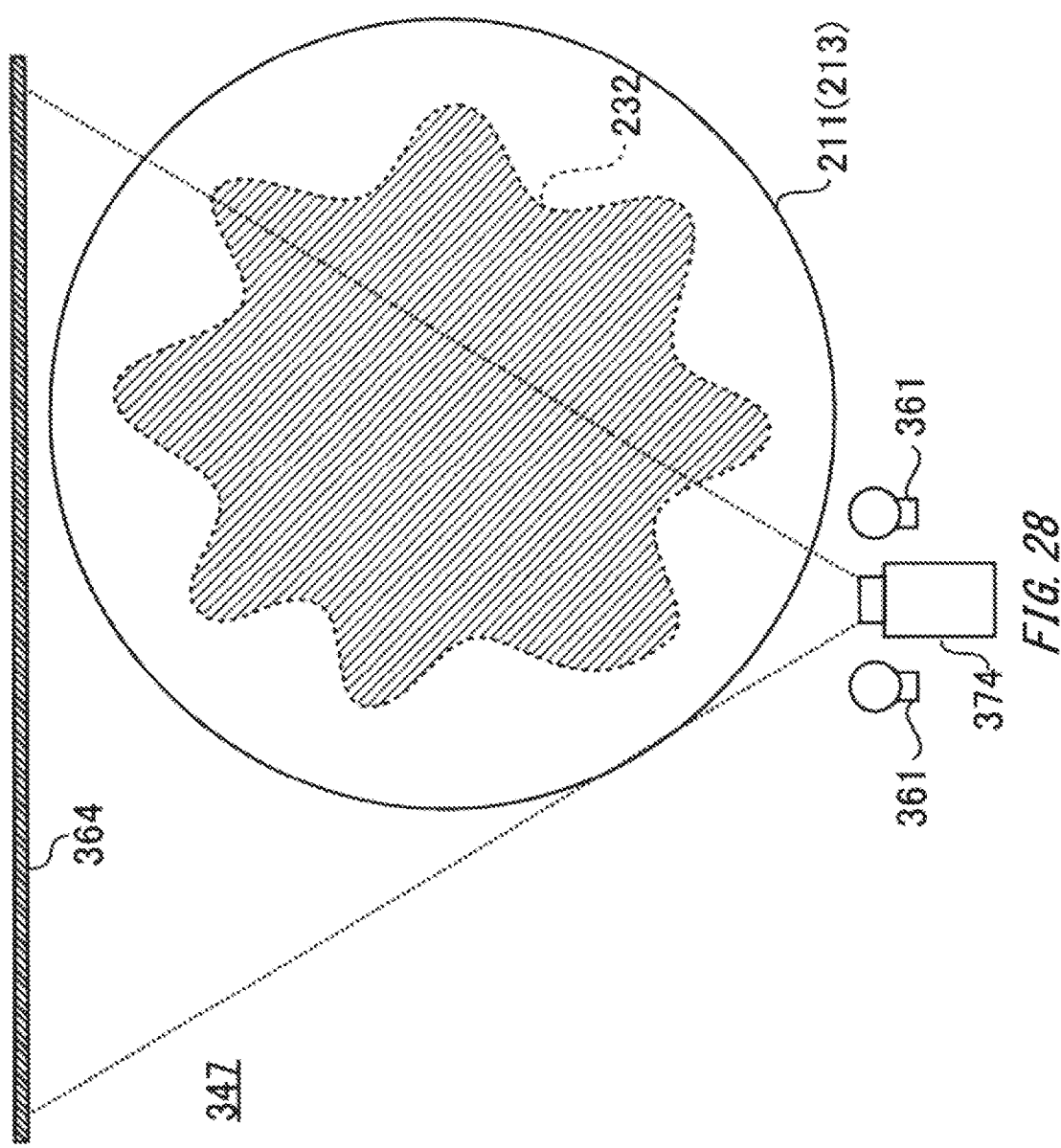
FIG. 28 is a schematic view for explaining the structure of an observing unit 347.

FIG. 28 is a schematic view of an observing unit 347 having still another structure. The observing unit 347 has the light sources 361, an image-capturing unit 374 and a background board 364.

The light source 361 and image-capturing unit 374 are disposed laterally next to the substrates 211, 213 in the plane direction of the substrates 211, 213, and on the side where the substrates 211, 213 are located. Illumination light generated by the light sources 361 is radiated from the side where the image-capturing unit 374 is located toward the substrates 211, 213, and illuminates the image-capturing field of view of the image-capturing unit 374.

The background board 364 is disposed on the side, relative to the light source 361 and image-capturing unit 374, that is opposite to the side where the substrates 211, 213 are located. Thereby, if the image-capturing unit 374 captures an image of the substrates 211, 213, the background board 364 forms the background of the substrates 211, 213. The background board 364 has a color and luminosity that have a high contrast against an image of the substrates 211, 213 captured by the image-capturing unit 374.

At the observing unit 347, the image-capturing field of view of the image-capturing unit 374 spreads from the centers of the substrates 211, 213 to their circumference as indicated by dotted lines in the figure. Thereby, at the observing unit 347, the role of the light-receiving units 371, 372, 373 of the observing unit 346 shown in FIG. 26 and FIG. 27 is played collectively by the image-capturing unit 374. A video captured by the image-capturing unit 374 is acquired by the control unit 150 and is subjected to image processing.

If the upper stage 322 and lower stage 332 holding the substrates 211, 213, respectively, in the bonding unit 300 came to positions where they face each other, the image-capturing unit 374 captures an image of the background board 364 seen through between the substrates 211, 213. If the substrates 211, 213 formed the bonding starting point 231 at Step S108 (please see FIG. 3), a part of the image of the background board 364 in the image captured by the image-capturing unit 374 is blocked and divided by the substrates 211, 213. Thereby, the control unit 150 can detect that the bonding starting point 231 has been formed.

Subsequently, the image-capturing unit 374 can continuously monitor how enlargement of the contact regions of the substrates 211, 213 appears at Step S110. Furthermore, at Step S112, the image-capturing unit 374 can detect that the contact regions of the substrates 211, 213 have reached the circumference of the substrates and bonding is completed. In this manner, the observing unit 347 can directly capture an image showing how bonding of the substrates 211, 213 appears and continuously detect the bonding based on the distance between the substrates 211, 213 in the captured image.

In the above-mentioned example, the image-capturing unit 374 is arranged laterally next to the substrates 211, 213 in the plane direction to detect bonding. But for example, the image-capturing unit 374 may be one that is sensitive to light at a wavelength that is transmitted through at least one of the upper stage 322 and the lower stage 332 and the substrate holder 221 or 223 held by the at least one stage, and the image-capturing unit 374 may be arranged laterally next to the substrates 211, 213 in their thickness direction to detect bonding.

In addition, an image acquired by the image-capturing unit 374 is not limited to an image obtained by directly capturing the shapes of the substrates 211, 213. For example, the state of bonding of the substrates 211, 213 may be detected based on changes in an image of interference fringes generated by optical phenomena such as interference occurring between the substrates 211, 213 or the like.

Figure 29:
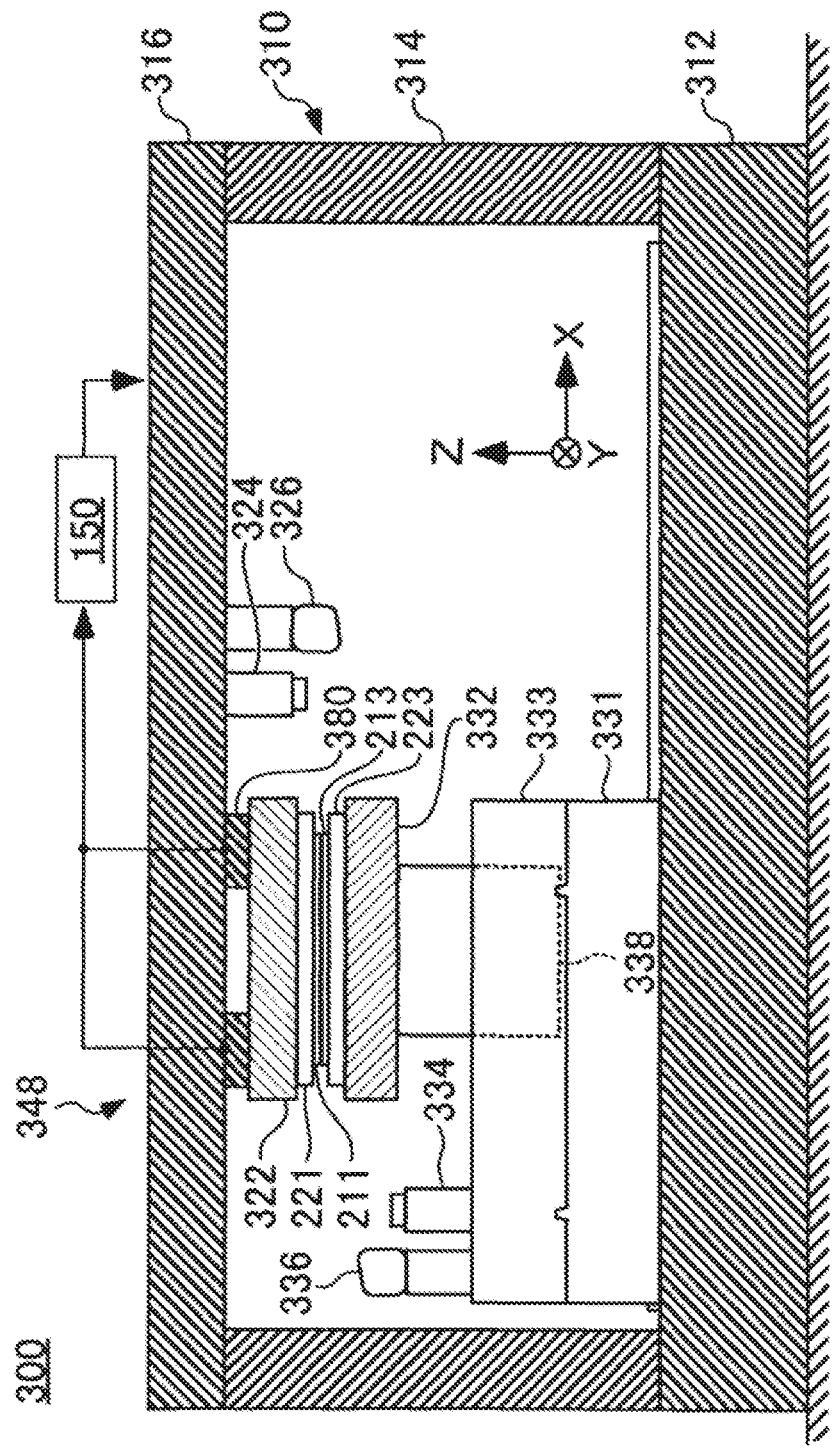
FIG. 29 is a schematic view for explaining the structure of an observing unit 348.

FIG. 29 is a schematic view of the bonding unit 300 including an observing unit 348 having another structure. The illustrated bonding unit 300 has the same structure as that of the bonding unit 300 shown in FIG. 6 or other figures, except for a portion explained next. Accordingly, common constituent elements are given the same reference numbers, and the same explanation is not repeated.

The structure of the illustrated bonding unit 300 is different from that of the bonding unit 300 shown in FIG. 6 in that it has the observing unit 348 having a load cell 380, in place of the observing unit 344 to observe the state of bonding optically. The load cell 380 is disposed between the top plate 316 of the frame body 310 and the upper stage 322.

Thereby, if the substrates 211, 213 are pressed against each other by the lower stage 332 being raised by the raising/lowering drive unit 338, the observing unit 348 can continuously detect reaction force that the upper stage 322 receives from the substrates 211, 213 using the load cell 380. That is, the load cell 380 first detects increase in the reaction force if the substrates 211, 213 that are pressed against each other at Step S107 (please see FIG. 3) contacted each other and formed the bonding starting point 231. The reaction force detected by the load cell 380 is one piece of information about the state of enlargement of the contact regions and is conveyed to the control unit 150. When the reaction force reaches a preliminarily determined value or if it remains equal to or higher than a predetermined value for a threshold length of time, the control unit 150 can determine that the bonding starting point 231 is formed between the substrates 211, 213 (Step S108: YES).

In addition, when the starting point 231 is to be formed, a part of the substrate 213 is pressed against a part of the substrate 211 through the atmosphere or the like sandwiched between the substrates 211, 213, and the atmosphere or the like is expelled, and thereafter the substrates 211, 213 directly contact each other. Because of this, the reaction force detected by the load cell 380 becomes small temporarily when the atmosphere is expelled. The control unit 150 may determine that the bonding starting point 231 is formed between the substrates 211, 213 if it detects that the value of the load cell 380 became small temporarily or it detects that the value of the load cell 380 became small temporarily and thereafter became large again to exceed a predetermined value.

Thereafter, if the entire substrates 211, 213 are bonded together, force of the raising/lowering drive unit 338 to raise the lower stage 332 is directly applied to the load cell 380. Accordingly, the control unit 150 can determine that the entire substrates 211, 213 are bonded together based on that the reaction force detected by the load cell 380 of the observing unit 348 is increasing.

In this manner, the state of bonding of the substrates 211, 213 can also be detected based on changes in mechanical characteristics. The structure of the observing unit 348 to perform detection based on mechanical characteristics is not limited to the one mentioned above. The reaction force of the substrates 211, 213 may be detected based on changes in the driving power corresponding to changes in the driving load of the raising/lowering drive unit 338, changes in the pressure of working fluid, or the like. If completion of bonding is determined based on detection of the driving load of the raising/lowering drive unit 338, the load of the substrate 211 is applied to the lower stage 332 along with enlargement of the contact regions of the substrates 211, 213 when the upper substrate 211 is being stacked on the lower substrate 213 as in the illustrate example; therefore, the thrust of the raising/lowering drive unit 338 increases. The control unit 150 determines that bonding is completed if it detects that changes in this thrust are no longer observed, the load value became constant, and the load value remained constant for a threshold length of time or that the rate of changes in the thrust became lower than a predetermined value.

In addition, the observing unit 348 can be formed also by using a mechanical displacement gauge having a contactor that is brought into contact if circumferential portions of the substrate 211 released from holding of the upper stage 322 at Step S109 are displaced to a position where they contact the fixed substrate 213.

Figure 30:
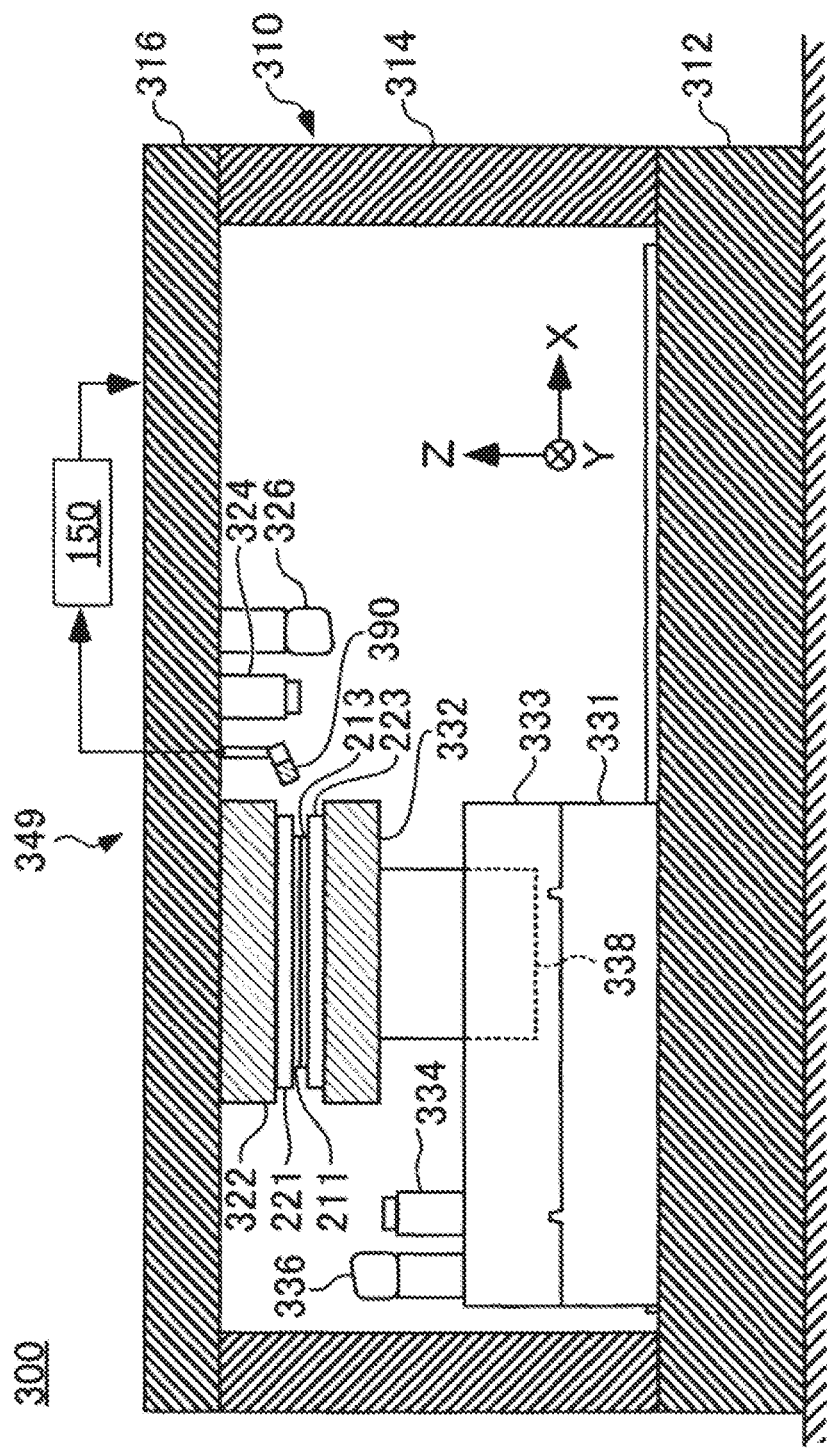
FIG. 30 is a schematic view for explaining the structure of an observing unit 349.

FIG. 30 is a schematic view of the bonding unit 300 including an observing unit 349 having another structure. The illustrated bonding unit 300 has the same structure as that of the bonding unit 300 shown in FIG. 6 or other figures, except for a portion explained next. Accordingly, common constituent elements are given the same reference numbers, and the same explanation is not repeated.

The structure of the illustrated bonding unit 300 is different from that of the bonding unit 300 shown in FIG. 6 in that it has the observing unit 349 having a microphone 390, in place of the observing unit 344 to detect the state of bonding optically. The microphone 390 is suspended from the top plate 316 of the frame body 310 to detect elastic waves generated between the upper stage 322 and the lower stage 332.

In the bonding unit 300, the substrates 211, 213 generate elastic waves in the course of bonding. For example, the substrate 211 held by the upper stage 322 is warped as it is held by the substrate holder 221 having the curved holding surface 222 until it is released at Step S109 (please see FIG. 3). On the other hand, upon being released at Step S109, the substrate 211 deforms into a shape conforming to the other substrate 213 along with the progress of bonding.

Along with this deformation, the substrate 211 generates very small elastic waves. Accordingly, the control unit 150 can determine that bonding is progressing between the substrates 211, 213 by acquiring electric signals based on sound detected by the microphone 390.

In addition, in the course of bonding of the substrates 211, 213, the atmosphere initially sandwiched between the substrates 211, 213 is expelled from between the substrates 211, 213. Along with this movement, vibration generated by the atmosphere can also be detected as acoustic elastic waves. Accordingly, continuation and end of bonding can be detected by detecting elastic waves generated by the atmosphere using the microphone 390.

Furthermore, if bonding of the substrates 211, 213 reached the circumference of the substrates 211, 213, the circumference of one of the substrates, the substrate 211, abuts against the other substrates, the substrate 213, and this abruptly stops displacement of the substrate 211 that had been continuing until then. Thereby, so-called collision sound is generated between the substrates 211, 213. Accordingly, the control unit 150 can determine that bonding of the substrates 211, 213 reached their circumference and is completed, by acquiring an electric signal generated by the microphone 390 that detected the collision sound.

Elastic waves generated by the substrate 211 are not limited to ones at a frequency in the audible band. Accordingly, the microphone 390 used at the observing unit 349 preferably is sensitive also to frequencies outside the audible band.

Figure 31:
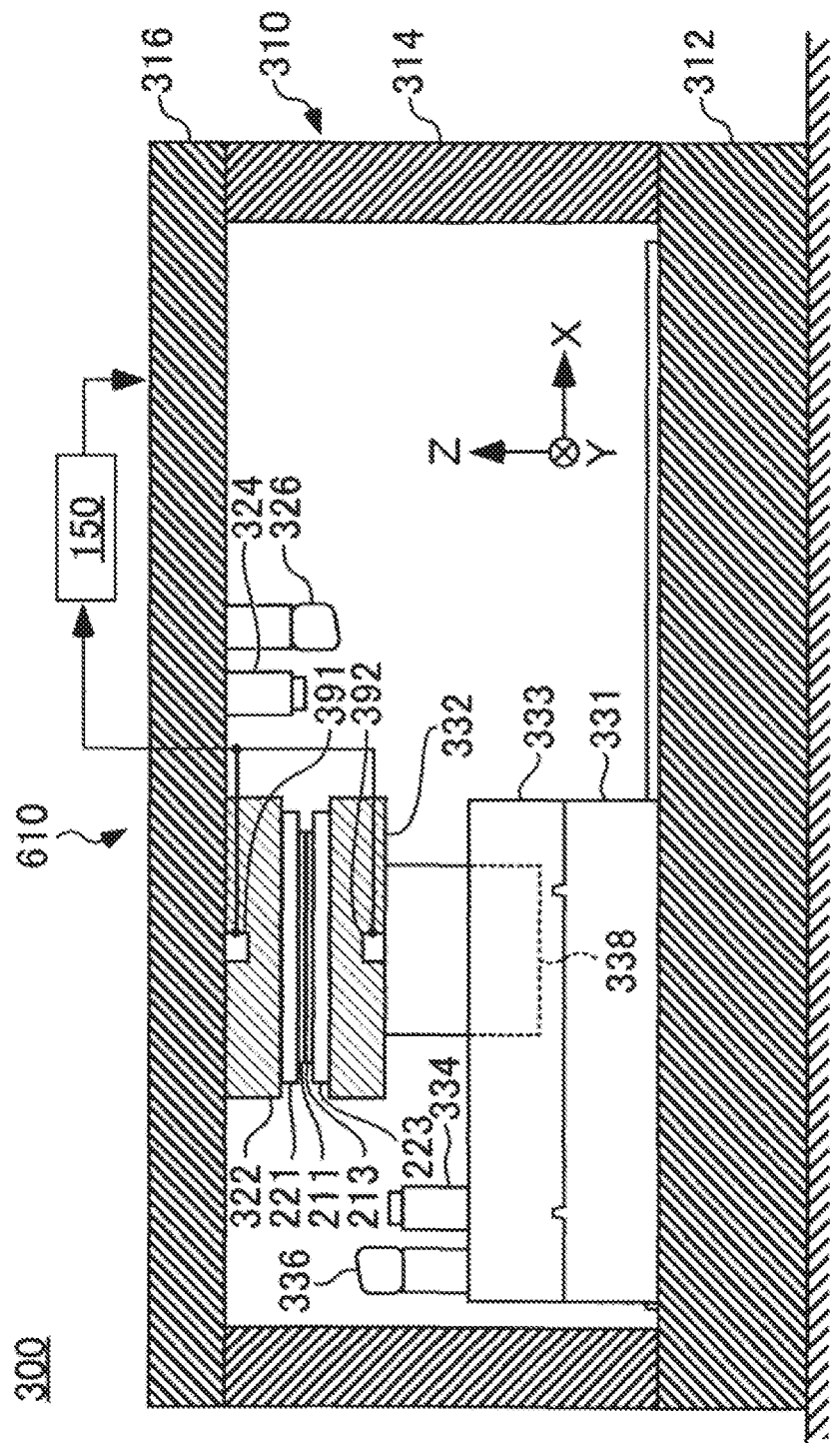
FIG. 31 is a schematic view for explaining the structure of an observing unit 610.

FIG. 31 is a schematic view of the bonding unit 300 including an observing unit 610 having another structure. The illustrated bonding unit 300 has the same structure as that of the bonding unit 300 shown in FIG. 30, except for a portion explained next. Accordingly, common constituent elements are given the same reference numbers, and the same explanation is not repeated.

In the illustrated bonding unit 300, the observing unit 610 has a vibration generating unit 391 and a vibration detecting unit 392, in place of the microphone 390. The vibration generating unit 391 is disposed in the upper stage 322, and generates vibration at a predetermined frequency. If the vibration generating unit 391 generates vibration, the generated vibration is conveyed to the substrate 211 through the upper stage 322 and substrate holder 221. The vibration generating unit 391 can be formed of a piezoelectric element or the like.

The vibration detecting unit 392 is disposed in the lower stage 332, and detects vibration conveyed from the substrate 211 through the substrate 213 and substrate holder 221 to the lower stage 332. Accordingly, until the substrates 211, 213 are pressed against each other at Step S107 (please see FIG. 3), the vibration detecting unit 392 does not detect vibration even if the vibration generating unit 391 generates the vibration. But if the substrates 211, 213 contact each other at Step S107, the vibration detecting unit 392 can detect vibration generated by the vibration generating unit 391.

In addition, even after the substrates 211, 213 contact each other at Step S107, the acoustic impedance of the vibration system formed of the upper stage 322, substrate holders 221, 223, substrates 211, 213 and lower stage 332 changes corresponding to changes in the contacting state of the substrates 211, 213. Accordingly, a result of detection by the vibration detecting unit 392 in a case where the vibration generating unit 391 generates vibration also changes. Thereby, the progress and completion of bonding between the substrates 211, 213 can be detected by the vibration detecting unit 392.

Figure 32:
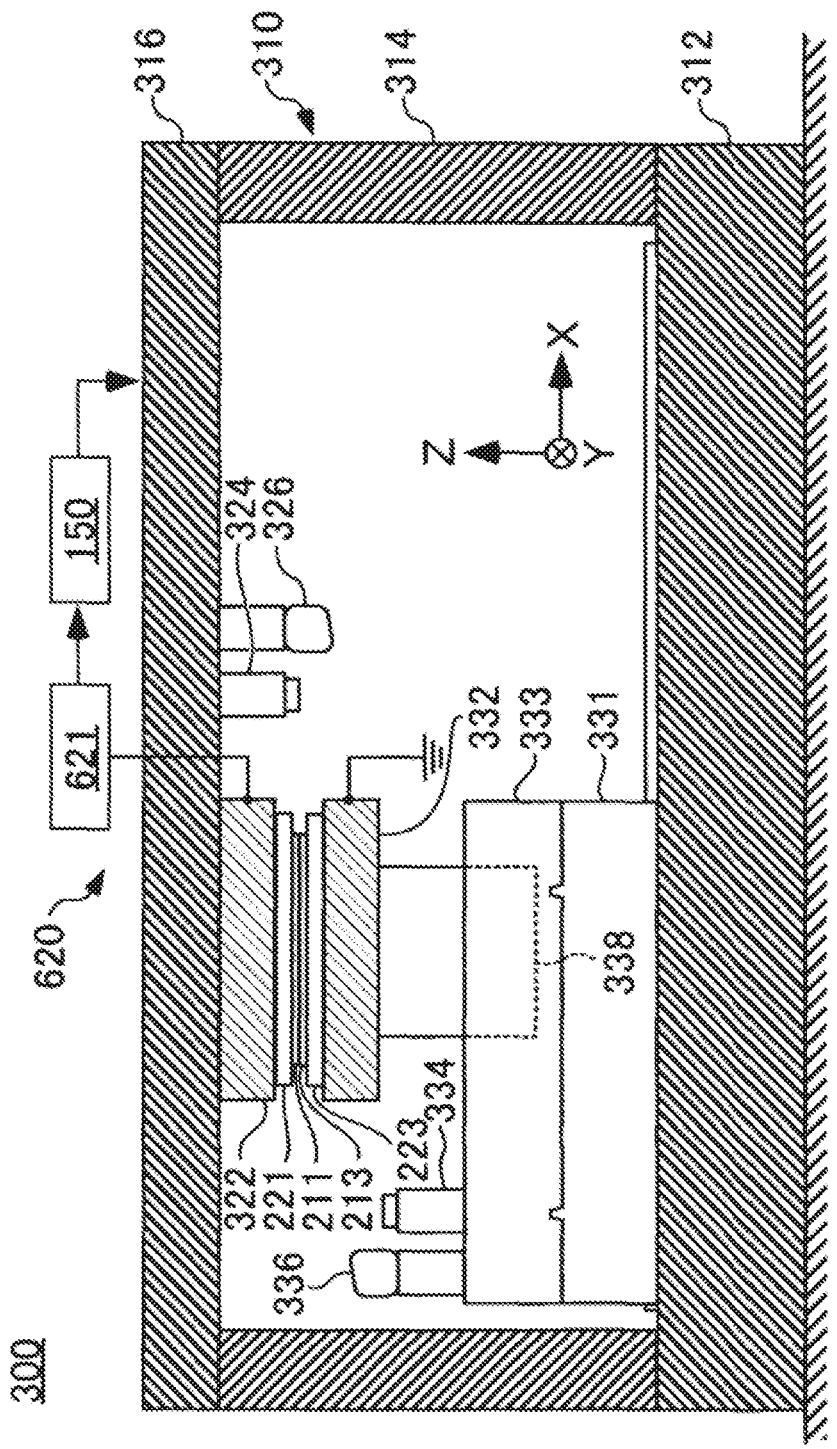
FIG. 32 is a schematic view for explaining the structure of an observing unit 620.

FIG. 32 is a schematic view of the bonding unit 300 including an observing unit 620 having still another structure. The illustrated bonding unit 300 has the same structure as that of the bonding unit 300 shown in FIG. 6 or other figures, except for a portion explained next. Accordingly, common constituent elements are given the same reference numbers, and the same explanation is not repeated.

In the illustrated bonding unit 300, the observing unit 620 has a capacitance detecting unit 621. The capacitance detecting unit 621 applies a periodically changing electric signal to an LC resonant circuit formed to include capacitance between the substrates 211, 213 to serve as a measurement target and a standard inductor. At this time, the capacitance detecting unit 621 superimposes an AC voltage to a DC voltage applied to electrodes of the two substrate holders 221, 223 having the function as electrostatic chucks, and detects AC components in an electric signal that change corresponding to changes in the capacitance at the substrates 211, 213. The value of the capacitance and the value of the rate of changes that are detected by the capacitance detecting unit 621 are one piece of information about the state of enlargement of the contact regions.

The overall capacitance between the two substrate holders 221, 232 is the composite of capacitance between an electrode of the substrate holder 221 and the substrate 211, capacitance between a silicon layer of the substrate 211 and an oxide film layer at its front surface, capacitance between the two substrates 211, 213, capacitance between a silicon layer of the substrate 213 and its oxide film layer and capacitance between an electrode of the substrate holder 223 and the substrate 213.

The value of capacitance between the substrates 211, 213 increases as the interval between the substrates 211, 213 narrows, and if parts of the substrates 211, 213 contact each other, it becomes the highest, and the value of the overall capacitance also becomes the highest. That is, it shows the highest value when a starting point is formed between the substrates 211, 213. Thereafter, because the interval between the substrate 211 and an electrode of the substrate holder 221 widens along with the progress of the bonding wave, the overall capacitance decreases.

In this manner, the capacitance changes corresponding to changes in the state of bonding of the substrates 211, 213. The state of bonding of the substrates 211, 213 is electrically detected by detecting the changes.

The control unit 150 determines that a starting point is formed between the substrates 211, 213 if it detects that the value of the capacitance exceeded a threshold or it became a value preliminarily determined as the highest value. Alternatively, the control unit 150 may determine that a starting point is formed if it detects that a predetermined length of time has passed after the value of the capacitance exceeded a threshold or after it became a value preliminarily determined as the highest value. The predetermined length of time is decided according to the strength of joining between contacting parts of the substrates 211, 213, and for example is set based on activation conditions of the substrates 211, 213. Alternatively, the control unit 150 may determine that a starting point is formed if it detects that the size of the area of contact between contacting parts of the substrates 211, 213 became a predetermined size. The predetermined size of the area is decided according to the strength of joining between the parts of the substrates 211, 213, or may be determined preliminarily experimentally. The size of the area can be detected based on changes in the capacitance that are observed when the contact regions enlarge minutely after the substrates 211, 213 contact each other at one point or by capturing an image from the outside by means like the one shown in FIG. 28.

In addition, the control unit 150 determines that bonding is completed if it detects that the value of the capacitance became constant, and the load value remained constant for a threshold length of time or that the rate of changes in the capacitance became lower than a predetermined value. Alternatively, the control unit 150 may determine that bonding is completed if it detects that the value of the overall capacitance has returned to its value that was observed before the substrates 211, 213 contact each other.

As mentioned above, in the bonding unit 300, changes in the state of bonding can be detected based on changes in various characteristics such as optical characteristics, mechanical characteristics, electrical characteristics or the like of the substrates 211, 213. Furthermore, the bonding unit 300 may be formed by combining multiple ones among the above-mentioned various observing units 344, 345, 346, 347, 348, 349, 610, 620.

Figure 33:
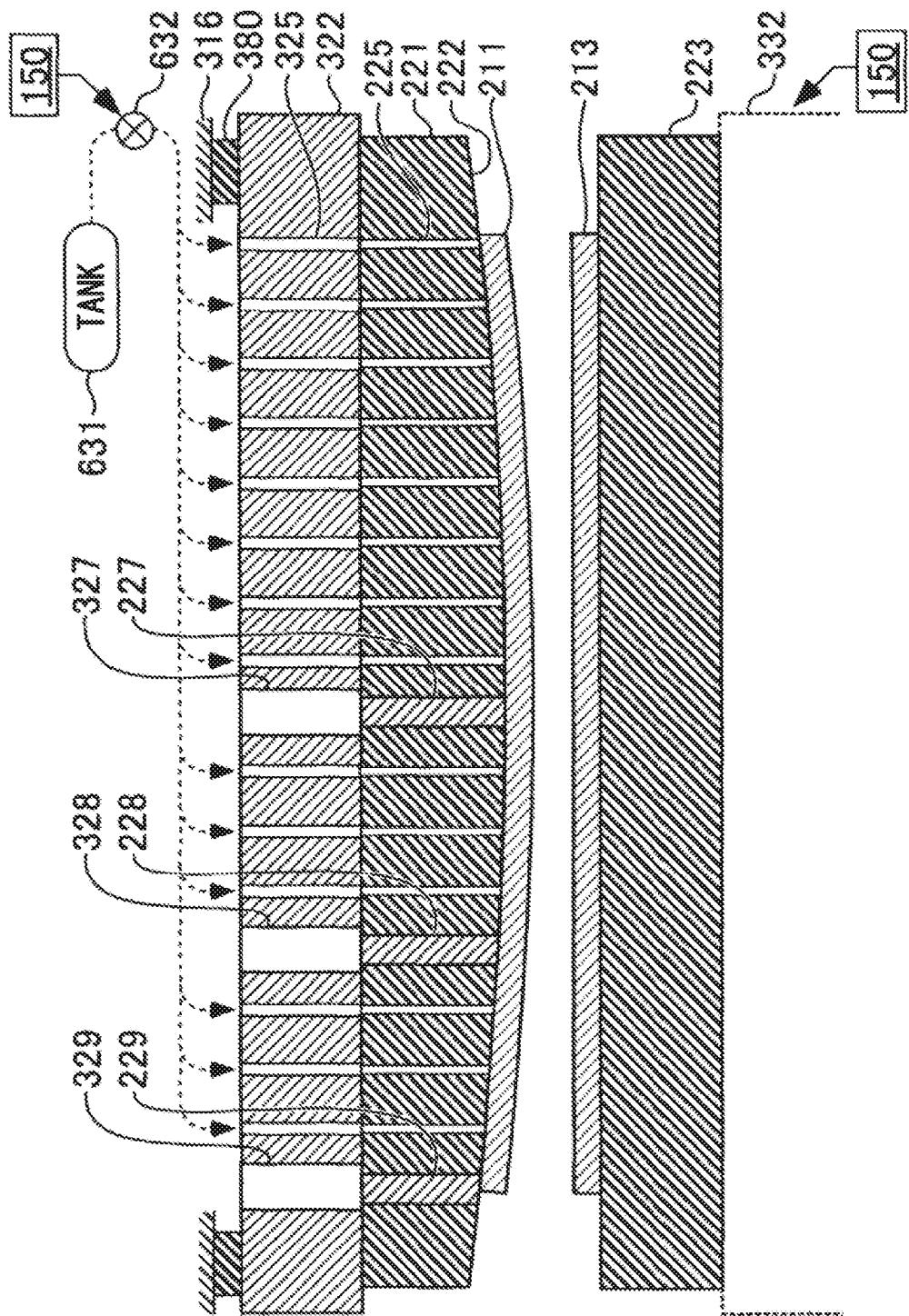
FIG. 33 is a schematic sectional view showing the structure of a part of the bonding unit 300.

FIG. 33 is a partially enlarged view showing a variant of the bonding unit 300 in a schematic section thereof. The illustrated bonding unit 300 has the same structure as that of the bonding unit 300 shown in FIG. 10, except for a portion explained next. Accordingly, common constituent elements are given the same reference numbers, and the same explanation is not repeated.

In the illustrated bonding unit 300, the upper stage 322 has a plurality of ventilation holes 325 penetrating therethrough in the thickness direction. The lower end, in the figure, of each of the ventilation holes 325 has an opening at the lower surface of the upper stage 322. The upper end, in the figure, of each of the ventilation holes 325 is coupled through a valve 632 to a tank 631 disposed outside the bonding unit 300.

Fluid that causes no problems even if it is mixed into the atmosphere of the substrates 211, 213 such as dry air or an inert gas is housed in the tank 631 at a pressure higher than the atmospheric pressure. The valve 632 opens and closes under the control of the control unit 150. If the valve 632 is opened, the fluid supplied from the tank 631 is injected from the upper stage 322 through the ventilation holes 325.

In addition, in the illustrated bonding unit 300, the substrate holder 221 held by the upper stage 322 also has a plurality of ventilation holes 225 penetrating therethrough in the thickness direction at positions corresponding to the ventilation holes 325 of the upper stage 322. Thereby, if the valve 632 is opened under the control of the control unit 150, the fluid supplied from the tank 631, for example, an inert gas such as a nitrogen gas or an argon gas, is injected from the ventilation holes 225 of the substrate holder 221. Thereby, for example, if the substrate 211 is adsorbed to the substrate holder 221 even after power supply to an electrostatic chuck or the like is terminated, the substrate 211 can be forcibly pushed off, thereby improving the throughput of the substrate bonding apparatus 100.

Figure 34:
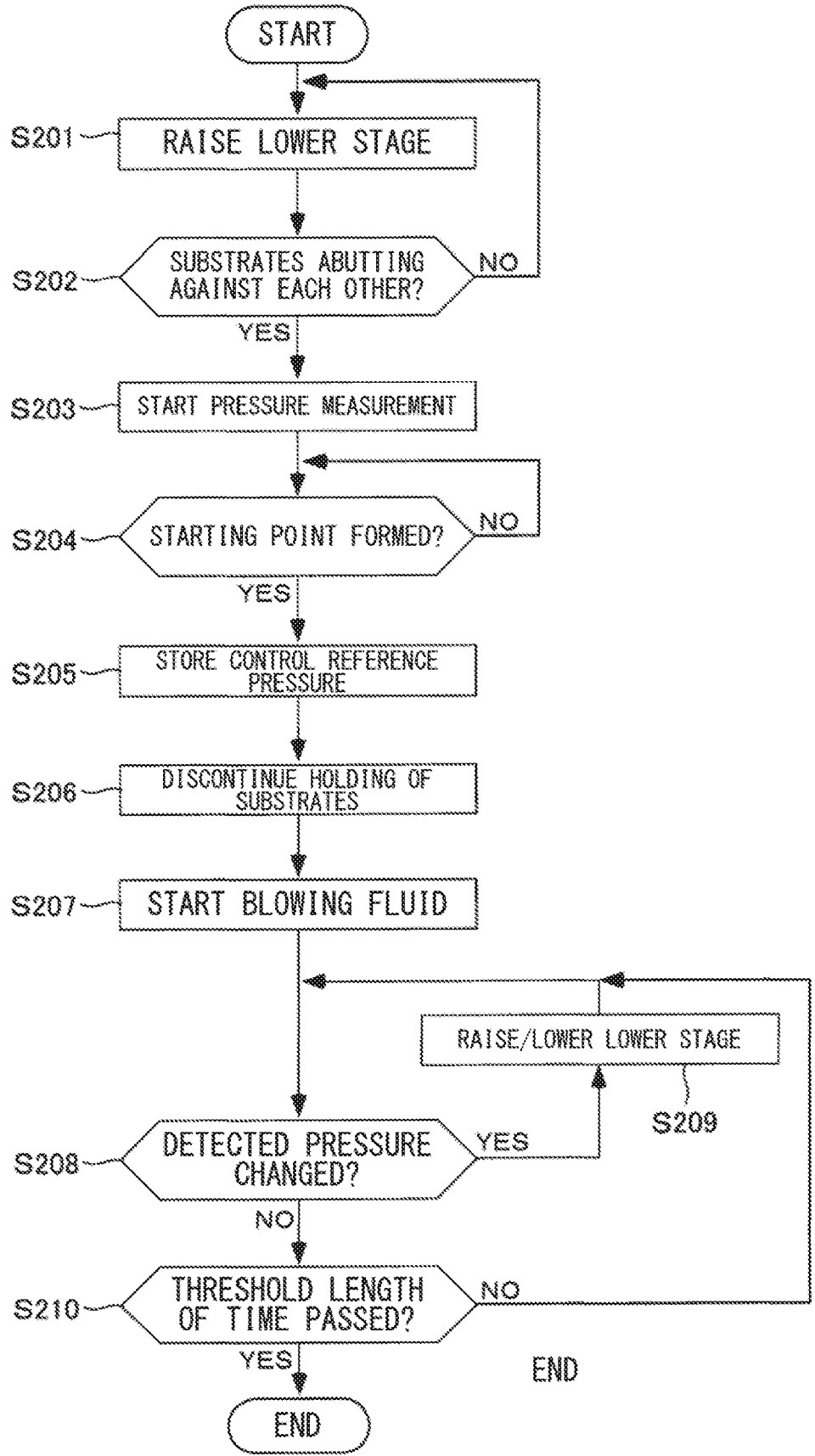
FIG. 34 is a flowchart showing a part of the procedure of operation of the bonding unit 300.

FIG. 34 is a flowchart showing a part of a control procedure performed on and around the stages of the above-mentioned bonding unit 300. The illustrated procedure may be executed in the course from Step S107 to Step S112 in the procedure shown in FIG. 3. Accordingly, in the following explanation, correspondence to the procedure shown in FIG. 3 is shown as well, together with the procedure shown in FIG. 34.

First, at Step S106 in FIG. 3, if the substrate 211 held by the upper stage 322 and the substrate 213 held by the lower stage 332 are positioned relative to each other, the control unit 150 raises the lower stage 332 (Step S201) and at the same time determines whether or not the substrates 211, 213 abut against each other (Step S202). The lower stage 332 is kept being raised until the substrates 211, 213 abut against each other (Step S202: NO).

Figure 35:
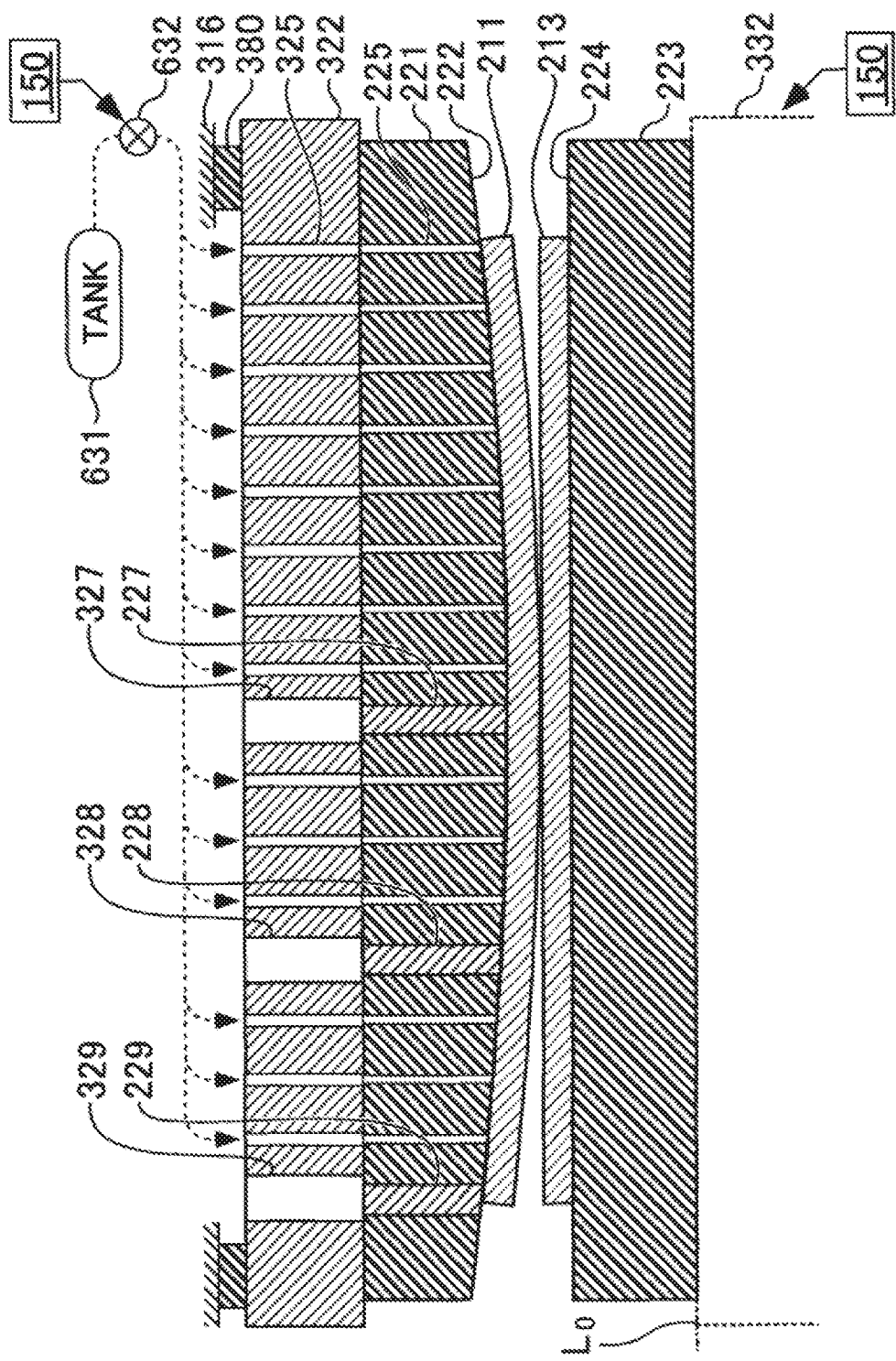
FIG. 35 is a figure showing operation of the bonding unit 300.

Upon detecting that the substrates 211, 213 which have been brought close to each other along with raising of the lower stage 332 abut against each other (Step S202: YES), the control unit 150 brings the substrate 213 held by the lower stage 332 and the substrate 211 held by the upper stage 322 close to each other. If the lower stage 332 is raised further, as shown in FIG. 35, the substrates 211, 213 abut against each other (Step S202: YES).

FIG. 35 is a schematic sectional view showing the state where the substrates 211, 213 abut against each other as a result of rising of the lower stage 332. Elements common to those in FIG. 34 are given the same reference numbers, and the same explanation is not repeated. As illustrated, because the substrate 211 held by the upper stage 322 is held in a state where a middle portion thereof is projecting downward in the figure, first, partially the middle portion is pressed against the substrate 213 held by lower stage 332 in a flat state (Step S107).

Referring again to FIG. 34, next, the control unit 150 starts measurement of pressure that the upper stage 322 receives due to rising of the lower stage 332, through the load cell 380 disposed between the upper stage 322 and the top plate 316 (Step S203). In addition, the control unit 150 determines whether or not a region where the abutting substrates 211, 213 are bonded together has been formed in the substrates 211, 213 (Step S108), and waits until a bonding starting point is formed between the substrates 211, 213 (Step S204: NO).

Thereby, upon detecting that a bonding starting point is formed between the substrates 211, 213 (Step S204: YES), the control unit 150 uses the position in the raising/lowering direction of the lower stage 332 at this moment, that is, a position $L_0$ in the Z direction shown in FIG. 35 as a reference position for the control of the position of the lower stage 332. In addition, the control unit 150 stores, as the control reference pressure for the control of the position of the lower stage in the Z direction, a pressure measured by the load cell 380 when the lower stage 332 is positioned at the reference position (Step S205).

Furthermore, upon detecting that a bonding starting point is formed between the substrates 211, 213 (Step S204: YES), the control unit 150 discontinues at least holding of the substrate 211 on the upper stage 322 side (Steps S109, S206). In addition, the control unit 150 pushes the substrate 211 off of the substrate holder 221 held by the upper stage 322 as shown in FIG. 36 by opening the valve 632 and blowing fluid through the ventilation holes 325, 225 (Step S207).

Figure 36:
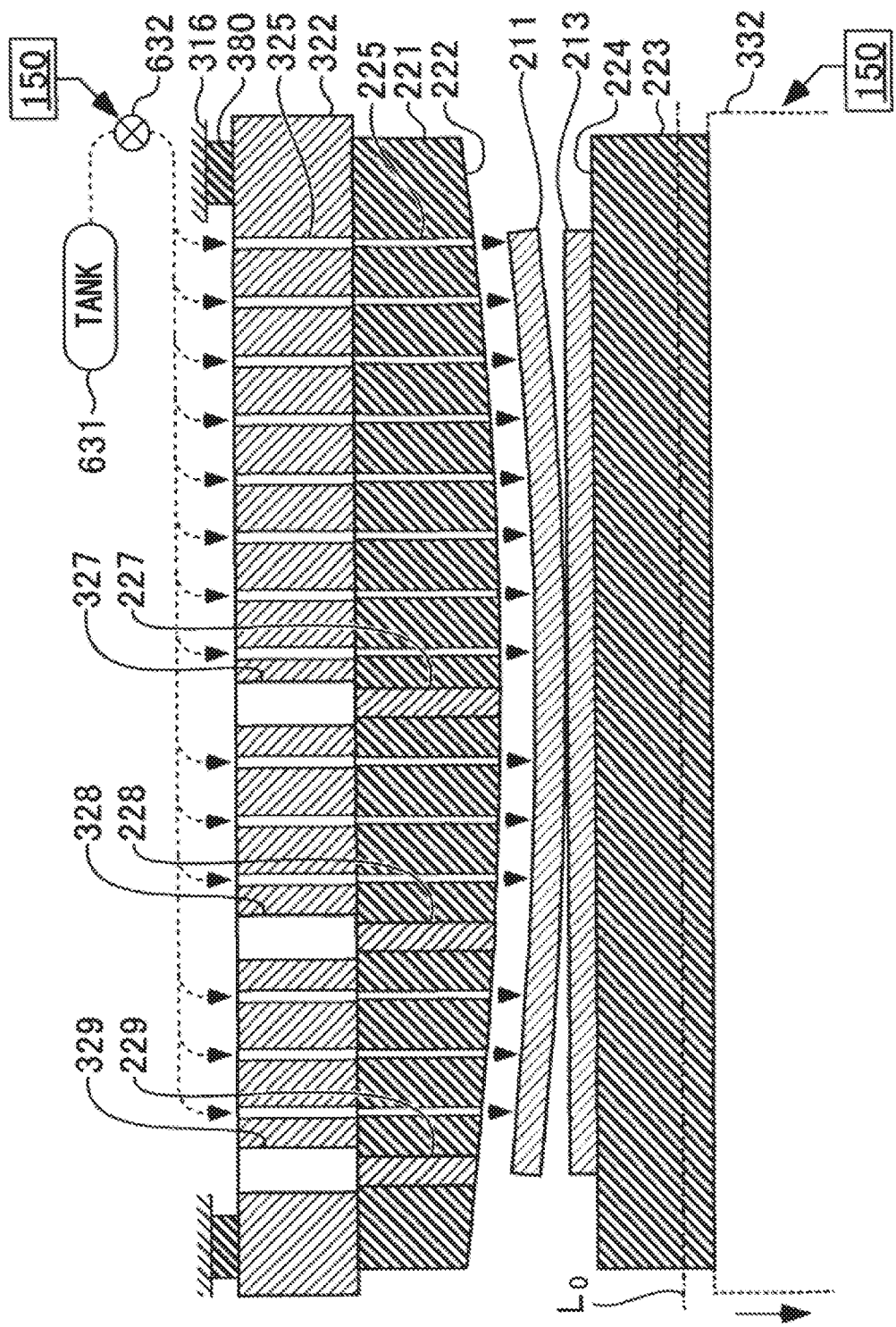
FIG. 36 is a figure showing operation of the bonding unit 300.

FIG. 36 is a schematic sectional view showing the state where the control unit 150 pushed the substrate 211 off of the upper stage 322 by injection of fluid after a bonding starting point is formed between the substrates 211, 213. If fluid injected from the upper stage 322 side is blown at the substrate 211, the pressure of the fluid acts also on the lower stage 332 through the lower substrate 213 abutting against the substrate 211 and the substrate holder 223. Thereby, because the load on the raising/lowering drive unit 338 driving the lower stage 332 increases, the lower stage 332 is displaced downward below the reference position $L_0$.

Here, the substrate 211 initially held by the upper stage 322 is partially bonded with the substrate 211 already held by the lower stage 332. Accordingly, if the lower stage 332 is lowered, the upper substrate 211 is also lowered together with it. Because of this, the interval between the upper substrate holder 221 held by the upper stage 322 and the substrate 211 widens, and the pressure of fluid between the substrate holder 221 and the substrate 211 lowers.

Figure 37:
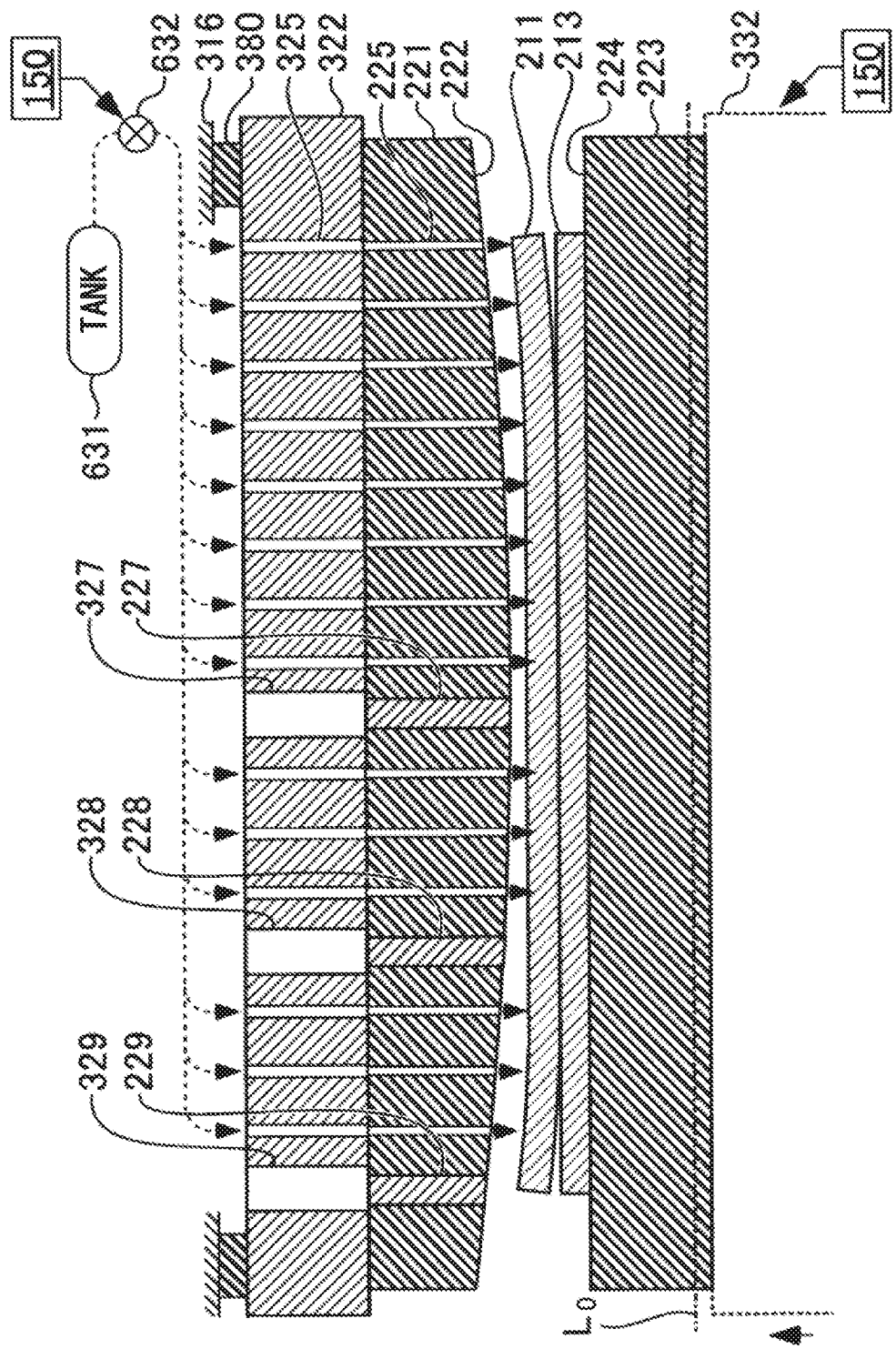
FIG. 37 is a figure showing operation of the bonding unit 300.

Thereby, because the value of the pressure measured by the load cell 380 lowers (Step S208: YES), the control unit 150 operates the raising/lowering drive unit 338 to raise the lower stage 332 so as to bring the value of measurement by the load cell 380 close to a control reference pressure (Step S209). That is, the Z position of the lower stage 332 is controlled to be at a position where force that the substrate 211 receives from fluid and force applied by the raising/lowering drive unit 338 to lift the lower stage 332 are balanced. If the substrate 211 is separated from the upper substrate holder 221 due to injection of fluid, the space between the substrate 211 and the substrate 213 expands, and so the pressure of the fluid between the substrates 211, 213 lowers, and the balance of force is lost. Because of this, in order to increase the pressure of the fluid, the lower stage 332 is raised to a position where the fluid pressure and force of the raising/lowering drive unit 338 are balanced. In this manner, as shown in FIG. 37, the lower stage 332 is raised to approach the reference position $L_0$ again.

After this, the control unit 150 detects the value of the pressure measured by the load cell 380 to continue the control on the position of the lower stage 332 such that the force of the raising/lowering drive unit 338 to raise the lower stage 332 and the pressure of fluid injected from the upper stage 322 are balanced and the value of the load cell 380 becomes constant (Step S208: YES). But while bonding of the substrates 211, 213 is progressing, the state between the upper substrate holder 221 and the upper substrate 211 changes over time, and so the position of the lower stage 332 in the Z direction does not stabilize. The space between the substrate 211 and the upper substrate holder 221 becomes gradually larger and the fluid pressure becomes gradually lower as the substrate 211 becomes more separated from the substrate holder 221 due to enlargement of the contact regions as the bonding wave advances, and so the Z position of the lower stage 332 is gradually raised in the course of enlargement of the contact regions. Upon completion of bonding, the size of the space between the substrate 211 and the substrate holder 221 no longer shows changes, and the fluid pressure also no longer shows changes so that the Z position of the lower stage 332 becomes constant.

Figure 38:
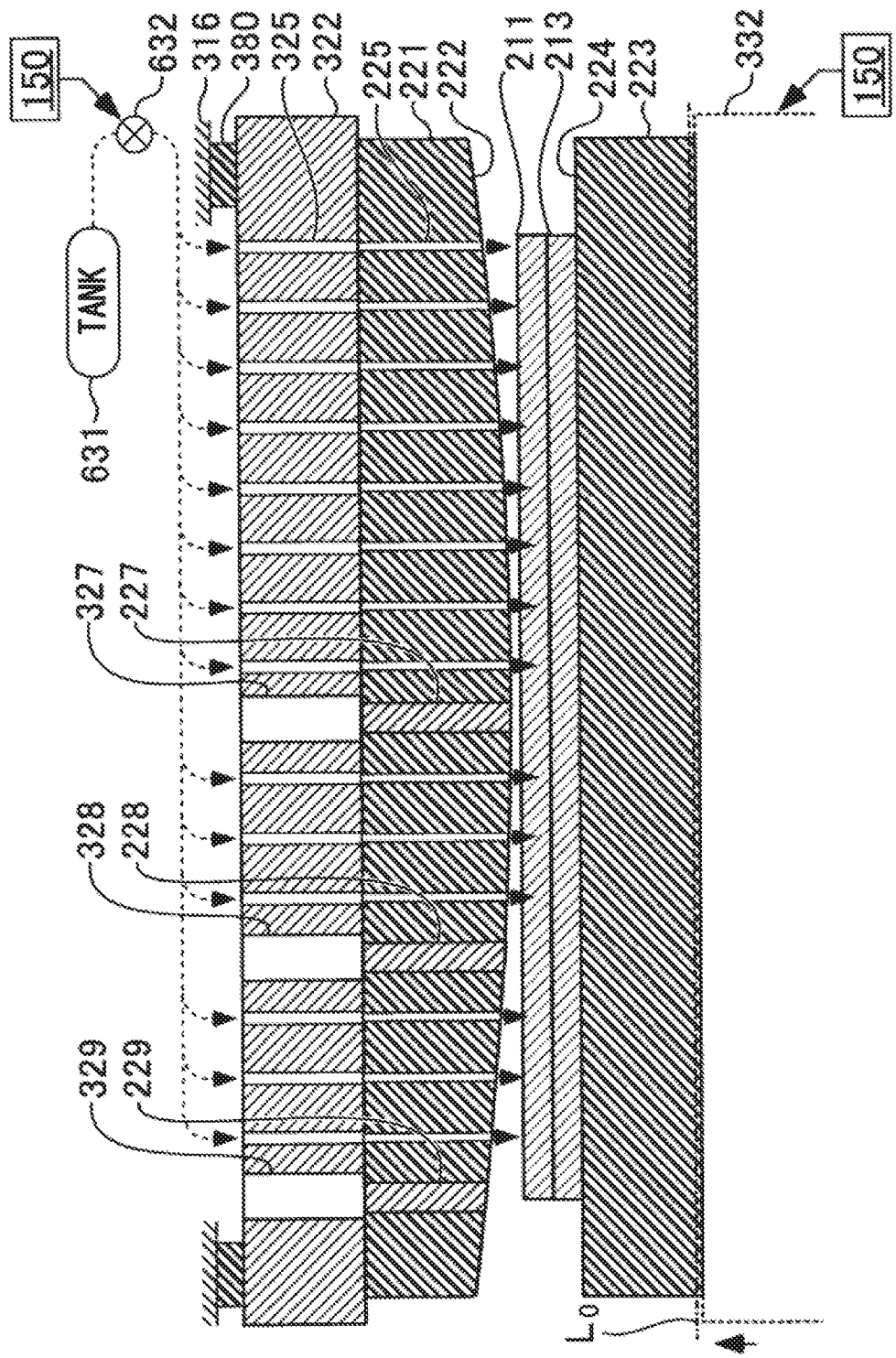
FIG. 38 is a figure showing operation of the bonding unit 300.

FIG. 38 is a schematic sectional view showing the state where bonding of the substrates 211, 213 in the bonding unit 300 is completed through and after the course of processes like the ones mentioned above. As illustrated, if the state between the upper substrate holder 221 and the substrate 211 no longer shows changes upon completion of bonding of the substrates 211, 213, changes in the pressure value measured by the load cell 380 converge and the position of lower stage 332 also no longer shows changes. To cope with this, for example an experimentally determined threshold length of time is preliminarily set, and if the value of pressure measured by the load cell 380 or the value of detection by a position detecting unit that detects the Z position of the lower stage 332 do not show changes for a threshold length of time or longer, the control unit 150 can determine that bonding of the substrates 211, 213 is completed (Step S210).

In the above-mentioned example, the control unit 150 can determine that abnormality is occurring in bonding if the progress of the bonding wave stopped, if the degree of progress is uneven in the circumferential direction of the substrates 211, 213, or in other cases. In this case, the control unit 150 outputs a signal to solve the abnormality according to the cause of the abnormality.

For example, if the progress of the bonding wave is uneven due to presence of dust between the substrates 211, 213, a signal instructing to clean substrate holders or stages is output to a cleaning apparatus.

If a substrate is deformed by the above-mentioned actuator, when the cause of abnormality is the amount of deformation of the substrate by the actuator, a control signal is output from the control unit 150 to a control unit that controls driving by the actuator so as to adjust the amount of driving by the actuator to adjust the deformation amount.

In the examples shown in FIG. 33 to FIG. 38, if the cause of abnormality is the flow rate of fluid or fluid pressure, the control unit 150 adjusts the rate of flow or the pressure of fluid from ventilation holes 325 corresponding to regions where the progress of the bonding wave is faster or slower than in other regions.

If the cause of abnormality is at least one of the ambient temperature and atmospheric pressure of the upper stage 322 and the lower stage 332, a control signal is output, instructing a temperature adjusting apparatus or pressure adjusting apparatus (not illustrated) to change the temperature or atmospheric pressure.

If a region where the progress of the bonding wave is slow is detected in the region of the substrate 211, at least one of the upper stage 322 and the lower stage 332 may be tilted so that the region is brought close to the substrate 213.

If the cause of abnormality is unevenness in activation on a surface(s) of at least one of the two substrates 211, 213, the control unit 150 outputs, to an activation apparatus, a control signal instructing to adjust the degree of activation according to the distribution of the degree of progress of the bonding wave.

If the cause of abnormality is the amounts of deformation of the substrates 211, 213 including the warping amount, the control unit 150 outputs, to a pre-processing apparatus such as a film formation apparatus or an exposure apparatus used at steps of manufacturing the substrates 211, 213, a control signal instructing to adjust the amounts of deformation generated to the substrates.

In addition, if it takes a long time to form a starting point, it can be assumed that the cause of it is that the degrees of activation of substrates are too low, that the pressing force at the time of contact between the substrates 211, 213 is too low, and so on so that the control unit 150 outputs a control signal instructing to adjust the degrees of activation to an activation apparatus, controls the driving amount of the lower stage 332 at the time of contact between the substrates 211, 213, and so on.

The above-mentioned feedback control by the control unit 150 may be implemented in real time or may be performed in bonding of next substrates. In addition, the feedback control may be implemented for each lot of substrates, every time the recipe for bonding processes is changed, or on other bases.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

100: substrate bonding apparatus; 110: housing; 120, 130: substrate cassette; 140: carrying unit; 150: control unit; 210, 211, 213: substrate; 212: scribe line; 214: notch; 216: circuit region; 218: alignment mark; 220, 221, 223: substrate holder; 222, 224: holding surface; 225, 325: ventilation hole; 227, 228, 229: observation hole; 230: bonded substrate; 231: starting point; 232: bonding wave; 300: bonding unit; 310: frame body; 312: base plate; 314: support; 316: top plate; 322: upper stage; 324, 334: microscope; 326, 336: activation apparatus; 327, 328, 329: observation window; 331: X-direction driving unit; 332: lower stage; 333: Y-direction driving unit; 338: raising/lowering drive unit; 341, 342, 343: detector; 344, 345, 346, 347, 348, 349, 610, 620: observing unit; 351, 361, 362, 363: light source; 354: optical fiber; 364: background board; 352, 371, 372, 373: light-receiving unit; 353: displacement gauge; 374: image-capturing unit; 380: load cell; 390: microphone; 391: vibration generating unit; 392: vibration detecting unit; 400: holder stocker; 500: pre-aligner; 621: capacitance detecting unit; 631: tank; 632: valve

What is claimed is:

1. A substrate bonding apparatus that bonds a first semiconductor substrate and a second semiconductor substrate so that a contact region, in which the first semiconductor substrate and the second semiconductor substrate are in contact, is formed in corresponding parts of the first semiconductor substrate and the second semiconductor substrate, and then the contact region enlarges from the corresponding parts, the substrate bonding apparatus comprising:
   a first substrate holder that holds the first semiconductor substrate and a second substrate holder that holds the second semiconductor substrate, at least one of the first substrate holder and the second substrate holder being provided with a plurality of holes, and one of the first semiconductor substrate and the second semiconductor substrate to be released from the corresponding substrate holder to enlarge the contact region;
   a detecting unit that radiates light and detects an optical characteristic of the light that (i) has passed through the at least one of the first substrate holder and the second substrate holder via the plurality of holes and (ii) comes from a surface of the one of the first semiconductor substrate and the second semiconductor substrate to be released, the surface being on an opposite side from a surface, in which the contact region is formed, of the one of the first semiconductor substrate and the second semiconductor substrate to be released, a change in the optical characteristic representing information about the contact region; and
   a determining unit that at least one of (i) determines that bonding the first semiconductor substrate and the second semiconductor substrate has been completed, (ii) determines that the first semiconductor substrate and the second semiconductor substrate have become ready to be carried out, and (iii) detects a state of progress of a bonding wave, which indicates a boundary of the contact region, based on the information detected by the detecting unit.

2. The substrate bonding apparatus according to claim 1, wherein the information is a value of which changes according to progress of enlargement of the contact region, and the determining unit determines that bonding has been completed or that the first semiconductor substrate and the second semiconductor substrate can be carried out in response to the value becoming constant or in response to a rate of change in the value becoming lower than a predetermined value.

3. The substrate bonding apparatus according to claim 1, wherein
   the optical characteristic changes in a course of enlargement of the contact region, and the determining unit determines that bonding has been completed or that the first semiconductor substrate and the second semiconductor substrate can be carried out in response to the change in the optical characteristic meeting a predetermined condition.

4. The substrate bonding apparatus according to claim 3, wherein the change in the optical characteristic includes a change in reflectance of the light reflected by each surface of the first semiconductor substrate and the second semiconductor substrate except for the corresponding parts of the first semiconductor substrate and the second semiconductor substrate in the contact region.

5. The substrate bonding apparatus according to claim 3, wherein the change in the optical characteristic includes a change in luminance in a captured image of at least one of the first semiconductor substrate and the second semiconductor substrate.

6. The substrate bonding apparatus according to claim 3, wherein the change in the optical characteristic includes a change in a luminous flux blocked by at least one of the first semiconductor substrate and the second semiconductor substrate.

7. The substrate bonding apparatus according to claim 3, wherein the determining unit determines that bonding has been completed or that the first semiconductor substrate and the second semiconductor substrate can be carried out in response to the optical characteristic becoming constant or in response to a rate of change therein becoming lower than a predetermined value.

8. The substrate bonding apparatus according to claim 1, wherein the information includes at least one of information about a change in distance between the first semiconductor substrate and the second semiconductor substrate and information about a change in distance between at least one semiconductor substrate among the first semiconductor substrate and the second semiconductor substrate and the first substrate holder or the second substrate holder that holds the at least one semiconductor substrate.

9. The substrate bonding apparatus according to claim 8, wherein the determining unit determines that bonding has been completed or that the first semiconductor substrate and the second semiconductor substrate can be carried out in response to a value of the distance becoming constant or in response to a rate of change therein becoming lower than a predetermined value.

10. The substrate bonding apparatus according to claim 1, wherein
the information is information about the boundary of the contact region,
the contact region enlarges as the boundary moves toward circumferential portions of the first semiconductor substrate and the second semiconductor substrate, and
the determining unit determines that bonding has been completed or that the first semiconductor substrate and the second semiconductor substrate can be carried out in response to a position of the boundary reaching a predetermined position.

11. The substrate bonding apparatus according to claim 10, wherein the predetermined position is a circumferential portion of at least one semiconductor substrate among the first semiconductor substrate and the second semiconductor substrate.

12. The substrate bonding apparatus according to claim 1, wherein
the information includes information about a shape of the boundary of the contact region, and
the determining unit determines that bonding has been completed or that the first semiconductor substrate and the second semiconductor substrate can be carried out in response to the shape becoming a predetermined shape.

13. The substrate bonding apparatus according to claim 1, wherein
the information is a progress speed at which the contact region enlarges, and
the determining unit predicts a time at which bonding of the first semiconductor substrate and the second semiconductor substrate is completed based on the progress speed.

14. The substrate bonding apparatus according to claim 1, wherein
the detecting unit detects bonding force of the contact region formed in the corresponding parts, and
the determining unit starts enlargement of the contact region in response to determining that the bonding force is at least a predetermined bonding force.

15. The substrate bonding apparatus according to claim 1, wherein the determining unit determines presence or absence of abnormality in bonding of the first semiconductor substrate and the second semiconductor substrate based on a result of detection by the detecting unit.

16. The substrate bonding apparatus according to claim 3, wherein
the change in the optical characteristic includes a change in reflectance of the light reflected by each surface of the at least one of the first semiconductor substrate and the second semiconductor substrate that is not in contact with the other semiconductor substrate surface.

17. A substrate bonding apparatus that bonds a first semiconductor substrate and a second semiconductor substrate so that a contact region, in which the first semiconductor substrate and the second semiconductor substrate are in contact, is formed in corresponding parts of the first semiconductor substrate and the second semiconductor substrate, and then the contact region enlarges from the corresponding parts, the substrate bonding apparatus comprising:
a first substrate holder that holds the first semiconductor substrate and a second substrate holder that holds the second semiconductor substrate, at least one of the first substrate holder and the second substrate holder being an electrostatic chuck, and one of the first semiconductor substrate and the second semiconductor substrate to be released from the corresponding substrate holder to enlarge the contact region;
a detecting unit that detects capacitance between the at least one of the first substrate holder and the second substrate holder that is the electrostatic chuck and the one of the first semiconductor substrate and the second semiconductor substrate to be released from the corresponding substrate holder, a change in the capacitance representing information about the contact region; and
a determining unit that at least one of (i) determines that bonding the first semiconductor substrate and the second semiconductor substrate has been completed, (ii) determines that the first semiconductor substrate and the second semiconductor substrate have become ready to be carried out, and (iii) detects a state of progress of a bonding wave, which indicates a boundary of the contact region, based on the information detected by the detecting unit.

18. A substrate bonding apparatus that bonds a first semiconductor substrate and a second semiconductor substrate so that a contact region, in which the first semiconductor substrate and the second semiconductor substrate are in contact, is formed in corresponding parts of the first semiconductor substrate and the second semiconductor substrate, and then the contact region enlarges from the corresponding parts, the substrate bonding apparatus comprising:
- a light source that is disposed on one side in a lateral direction of the first semiconductor substrate and the second semiconductor substrate and radiates light toward the first semiconductor substrate and the second semiconductor substrate;
- one of (i) an image-capturing unit that is disposed on the one side in the lateral direction of the first semiconductor substrate and the second semiconductor substrate and captures an image of the first semiconductor substrate and the second semiconductor substrate irradiated by the light and (ii) a light-receiving unit that is disposed on another side in the lateral direction of the first semiconductor substrate and the second semiconductor substrate and receives the light; and
- a determining unit that performs image processing on the captured image or detects a change in an amount of the received light to obtain information about the contact region, and that at least one of (i) determines that bonding the first semiconductor substrate and the second semiconductor substrate has been completed, (ii) determines that the first semiconductor substrate and the second semiconductor substrate have become ready to be carried out, and (iii) detects a state of progress of a bonding wave, which indicates a boundary of the contact region, based on the information about the contact region.

19. The substrate bonding apparatus according to claim 18, further comprising:
- a background board that is disposed on an opposite side in the lateral direction of the first semiconductor substrate and the second semiconductor substrate with respect to the one side, wherein
- the image-capturing unit captures the image including a part of the background board as a background of the image.

20. A substrate bonding apparatus that bonds a first semiconductor substrate and a second semiconductor substrate so that a contact region, in which the first semiconductor substrate and the second semiconductor substrate are in contact, is formed in corresponding parts of the first semiconductor substrate and the second semiconductor substrate, and then the contact region enlarges from the corresponding parts, the substrate bonding apparatus comprising:
- a detecting unit that measures mechanical force received from at least one of the first semiconductor substrate and the second semiconductor substrate, a change in the mechanical force representing information about the contact region while the contact region formed between the first substrate and the second substrate is spreading; and
- a determining unit that determines at least one of that (i) bonding the first semiconductor substrate and the second semiconductor substrate has been completed, and (ii) the first semiconductor substrate and the second semiconductor substrate have become ready to be carried out, when at least one of conditions that (a) the mechanical force reaches a preliminary determined value, (b) the mechanical force remains equal to or higher than a predetermined value for a threshold length of time, and (c) a rate of a change in the mechanical force becomes lower than a predetermined threshold value is satisfied.

21. A substrate bonding apparatus that bonds a first semiconductor substrate and a second semiconductor substrate so that a contact region, in which the first semiconductor substrate and the second semiconductor substrate are in contact, is formed in corresponding parts of the first semiconductor substrate and the second semiconductor substrate, and then the contact region enlarges from the corresponding parts, the substrate bonding apparatus comprising:
- a first substrate holder that holds the first semiconductor substrate and a second substrate holder that holds the second semiconductor substrate, at least one of the first substrate holder and the second substrate holder being an electrostatic chuck, and one of the first semiconductor substrate and the second semiconductor substrate to be released from the corresponding substrate holder to enlarge the contact region;
- a detecting unit that applies a periodically changing electric signal to the electrostatic chuck and detects capacitance between the at least one of the first substrate holder and the second substrate holder that is the electrostatic chuck and at least one of the first semiconductor substrate and the second semiconductor substrate, a change in the capacitance representing information about the contact region; and
- a determining unit that at least one of (i) determines that bonding the first semiconductor substrate and the second semiconductor substrate has been completed, (ii) determines that the first semiconductor substrate and the second semiconductor substrate have become ready to be carried out, and (iii) detects a state of progress of a bonding wave, which indicates a boundary of the contact region, based on the information detected by the detecting unit.

22. A substrate bonding apparatus that bonds a first semiconductor substrate and a second semiconductor substrate so that a contact region, in which the first semiconductor substrate and the second semiconductor substrate are in contact, is formed in corresponding parts of the first semiconductor substrate and the second semiconductor substrate, and then the contact region enlarges from the corresponding parts, the substrate bonding apparatus comprising:
- a detecting unit that detects a state of progress of bonding the first semiconductor substrate and the second semiconductor substrate based on a change in pressure of fluid between one of the first semiconductor substrate or the second semiconductor substrate and a holder holding the one of the first semiconductor substrate or the second semiconductor substrate; and
- a determining unit that at least one of (i) determines that bonding the first semiconductor substrate and the second semiconductor substrate has been completed, (ii) determines that the first semiconductor substrate and the second semiconductor substrate have become ready to be carried out, and (iii) detects a state of progress of a bonding wave, which indicates a boundary of the contact region, based on a detection result by the detecting unit.

23. A substrate bonding apparatus that bonds a first semiconductor substrate and a second semiconductor substrate so that a contact region, in which the first semiconductor substrate and the second semiconductor substrate are in contact, is formed in corresponding parts of the first semiconductor substrate and the second semiconductor substrate, and then the contact region enlarges from the corresponding parts, the substrate bonding apparatus comprising:
- a detecting unit that detects a distance between an upper surface of the first semiconductor substrate and a holding surface of a substrate holder that holds the first semiconductor substrate during enlargement of the contact region, the first semiconductor substrate being located above the second semiconductor substrate.

24. The substrate bonding apparatus of claim 23, further comprising:
a determining unit that at least one of (i) determines that bonding the first semiconductor substrate and the second semiconductor substrate has been completed, (ii) determines that the first semiconductor substrate and the second semiconductor substrate have become ready to be carried out, and (iii) detects a state of progress of a bonding wave, which indicates a boundary of the contact region, based on a detection result by the detecting unit.

25. The substrate bonding apparatus of claim 24, wherein the determining unit determines that bonding the first semiconductor substrate and the second semiconductor substrate has been completed when the detecting unit detects at least one of (i) the distance becoming constant and (ii) a change amount in the distance becoming smaller than a predetermined value.

\* \* \* \* \*